US008299799B2

(12) United States Patent
Finlay, Sr. et al.

(10) Patent No.: US 8,299,799 B2
(45) **Date of Patent: *Oct. 30, 2012**

(54) ELECTRICAL DEVICE WITH MISWIRE PROTECTION AND AUTOMATED TESTING

(75) Inventors: David A. Finlay, Sr., Marietta, NY (US); Bruce F. Macbeth, Syracuse, NY (US); Kent R. Morgan, Groton, NY (US); Patrick J. Murphy, Marcellus, NY (US); Thomas N. Packard, Syracuse, NY (US); Jeffrey C. Richards, Baldwinsville, NY (US); Gerald R. Savicki, Jr., Canastota, NY (US); Richard Weeks, Little York, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/953,538

(22) Filed: Nov. 24, 2010

(65) Prior Publication Data

US 2011/0115511 A1 May 19, 2011

Related U.S. Application Data

(63) Continuation-in-part of application No. 12/553,573, filed on Sep. 3, 2009, now Pat. No. 7,936,238, which is a continuation of application No. 11/615,277, filed on Dec. 22, 2006, now Pat. No. 7,598,828, which is a continuation-in-part of application No. 10/942,633, filed on Sep. 16, 2004, now Pat. No. 7,173,799, which is a continuation-in-part of application No. 10/900,769, filed on Jul. 28, 2004, now Pat. No. 7,154,718, said application No. 12/953,538 is a continuation-in-part of application No. 12/247,848, filed on Oct. 8, 2008, now Pat. No. 7,843,197, which is a continuation of application No. 11/025,509, filed on Dec. 29, 2004, now abandoned, which is a (Continued)

(60) Provisional application No. 60/541,506, filed on Feb. 3, 2004, provisional application No. 60/183,273, filed on Feb. 17, 2000.

(51) Int. Cl.
*G01R 31/02* (2006.01)
*H02H 3/00* (2006.01)
*H01H 75/00* (2006.01)

(52) U.S. Cl. ................................ 324/424; 361/42; 335/6

(58) Field of Classification Search .................. 324/424
See application file for complete search history.

(56) References Cited

U.S. PATENT DOCUMENTS 3,930,187 A 12/1975 Misencik (Continued)

*Primary Examiner* — Jeff Natalini

(74) *Attorney, Agent, or Firm* — Daniel P. Malley; Bond Schoeneck & King

(57) ABSTRACT

The present invention is directed to an electrical wiring device that includes an actuator assembly that is responsive to the fault detection signal. The actuator assembly includes a breaker coil configured to generate an actuation force in response to being energized. A circuit interrupter includes four sets of movable contacts configured to be driven into a reset state in response to a reset stimulus, the four sets of movable contacts being configured to be driven into a tripped state in response to the actuation force. A self-test circuit is coupled to the plurality of line terminals or the at least one sensor. The self-test circuit is configured to automatically generate a test signal from time to time during a predetermined portion of an AC power line cycle. The self-test circuit is configured such that the test signal is sensed by the at least one sensor when the at least one sensor is operational, the sensor output signal being a function of the test signal. A monitor circuit is configured to monitor the fault detection circuit or the actuator assembly; the mechanical actuation force is substantially inhibited when the fault detection circuit or at least a portion of the actuator assembly properly respond to the test signal. The monitor circuit generates an end-of-life response if the fault detection circuit or the actuator assembly do not respond to the test signal within a predetermined period of time.

39 Claims, 27 Drawing Sheets

Related U.S. Application Data continuation-in-part of application No. 10/868,610, filed on Jun. 15, 2004, now Pat. No. 6,980,005, which is a continuation-in-part of application No. 10/668,654, filed on Sep. 23, 2003, now Pat. No. 6,873,158, which is a continuation of application No. 09/725,525, filed on Nov. 29, 2000, now Pat. No. 6,674,289, said application No. 12/953,538 is a continuation-in-part of application No. 12/618,453, filed on Nov. 13, 2009, which is a continuation of application No. 11/469,596, filed on Sep. 1, 2006, now Pat. No. 7,619,860, which is a continuation of application No. 10/844,304, filed on Jul. 2, 2004, now Pat. No. 7,133,266, which is a continuation of application No. 09/971,525, filed on Oct. 5, 2001, now Pat. No. 6,856,498, which is a continuation of application No. 09/718,003, filed on Nov. 21, 2000, now Pat. No. 6,522,510.

(56) References Cited

U.S. PATENT DOCUMENTS

| | | | | |
|---|---|---|---|---|
| 4,010,432 | A | 3/1977 | Klein et al. | |
| 4,019,120 | A | 4/1977 | Fattic | |
| 4,672,501 | A | 6/1987 | Bilac et al. | |
| 4,685,024 | A | 8/1987 | Martellock et al. | |
| 4,742,422 | A | 5/1988 | Tigges | |
| 4,802,052 | A | 1/1989 | Brant et al. | |
| 4,816,957 | A | 3/1989 | Irwin | |
| 4,831,496 | A | 5/1989 | Brant et al. | |
| 4,872,087 | A | 10/1989 | Brant | |
| 4,998,067 | A | 3/1991 | Puckett et al. | |
| 5,072,328 | A | 12/1991 | Dvorak et al. | |
| 5,202,662 | A | 4/1993 | Bienwald et al. | |
| 5,459,630 | A | 10/1995 | MacKenzie et al. | |
| 5,517,165 | A | 5/1996 | Cook | |
| 5,600,524 | A | 2/1997 | Neiger et al. | |
| 5,638,243 | A | 6/1997 | Torezan et al. | |
| 5,661,623 | A | 8/1997 | McDonald et al. | |
| 5,715,125 | A | 2/1998 | Neiger et al. | |
| 5,834,940 | A | 11/1998 | Brooks et al. | |
| 5,844,759 | A | 12/1998 | Hirsh et al. | |
| 5,917,391 | A | 6/1999 | Mahaney et al. | |
| 5,960,888 | A | 10/1999 | Moore, Sr. | |
| 6,040,967 | A | 3/2000 | DiSalvo | |
| 6,052,265 | A | 4/2000 | Zaretsky et al. | |
| 6,111,733 | A | 8/2000 | Neiger et al. | |
| 6,191,589 | B1 | 2/2001 | Clunn | |
| 6,246,558 | B1 | 6/2001 | DiSalvo et al. | |
| 6,262,871 | B1 | 7/2001 | Nemir et al. | |
| 6,288,882 | B1 | 9/2001 | DiSalvo et al. | |
| 6,313,642 | B1 | 11/2001 | Brooks | |
| 6,348,666 | B2 | 2/2002 | Rival et al. | |
| 6,407,893 | B1 | 6/2002 | Neiger et al. | |
| 6,421,214 | B1 | 7/2002 | Packard et al. | |
| 6,426,634 | B1 | 7/2002 | Clunn et al. | |
| 6,437,700 | B1 | 8/2002 | Herzfeld et al. | |
| 6,437,953 | B2 | 8/2002 | DiSalvo et al. | |
| 6,472,882 | B1 | 10/2002 | Tiemann et al. | |
| 6,477,022 | B1 | 11/2002 | Ennis et al. | |
| 6,487,052 | B1 | 11/2002 | Macpherson et al. | |
| 6,522,510 | B1 | 2/2003 | Finlay et al. | |
| 6,525,541 | B1 | 2/2003 | Leopold | |
| 6,580,344 | B2 | 6/2003 | Li | |
| 6,590,753 | B1 | 7/2003 | Finlay | |
| 6,611,406 | B2 | 8/2003 | Neiger et al. | |
| 6,621,388 | B1 | 9/2003 | Macbeth | |
| 6,643,108 | B2 | 11/2003 | Cline et al. | |
| 6,657,834 | B2 | 12/2003 | DiSalvo | |
| 6,670,870 | B2 | 12/2003 | Macbeth | |
| 6,671,145 | B2 | 12/2003 | Germain et al. | |
| 6,674,289 | B2 | 1/2004 | Macbeth | |
| 6,697,237 | B2 | 2/2004 | Duve | |
| 6,717,782 | B2 | 4/2004 | DiSalvo et al. | |
| 6,724,591 | B2 | 4/2004 | Clarey et al. | |
| 6,771,152 | B2 | 8/2004 | Germain et al. | |
| 6,788,173 | B2 | 9/2004 | Germain et al. | |
| 6,804,904 | B2 | 10/2004 | Garcia | |
| 6,807,035 | B1 | 10/2004 | Baldwin et al. | |
| 6,807,036 | B2 | 10/2004 | Baldwin | |
| 6,828,886 | B2 | 12/2004 | Germain et al. | |
| 6,829,124 | B2 | 12/2004 | Leopold et al. | |
| 6,831,819 | B2 | 12/2004 | Nemir et al. | |
| 6,842,095 | B2 | 1/2005 | Macbeth | |
| 6,867,954 | B2 | 3/2005 | Wu et al. | |
| 6,873,158 | B2 | 3/2005 | Macbeth | |
| 6,930,574 | B2 | 8/2005 | Gao | |
| 6,946,935 | B2 | 9/2005 | Wu et al. | |
| 6,952,150 | B2 | 10/2005 | Radosavljevic et al. | |
| 6,954,125 | B2 | 10/2005 | Wu et al. | |
| 6,958,895 | B1 | 10/2005 | Radosavljevic et al. | |
| 6,980,005 | B2 * | 12/2005 | Finlay et al. | 324/424 |
| 6,984,988 | B2 | 1/2006 | Yamamoto | |
| 6,998,945 | B2 | 2/2006 | Huang et al. | |
| 7,019,952 | B2 | 3/2006 | Huang et al. | |
| 7,031,125 | B2 | 4/2006 | Germain et al. | |
| 7,031,126 | B2 | 4/2006 | Bonilla et al. | |
| 7,154,718 | B1 | 12/2006 | Finlay, Sr. et al. | |
| 7,173,799 | B1 | 2/2007 | Weeks et al. | |
| 7,184,250 | B2 | 2/2007 | Bonilla et al. | |
| 7,215,370 | B2 | 5/2007 | Chiang et al. | |
| 7,253,629 | B1 | 8/2007 | Richards et al. | |
| 7,538,994 | B2 * | 5/2009 | Bonilla et al. | 361/42 |
| 7,751,160 | B1 * | 7/2010 | Radosavljevic et al. | 361/42 |
| 7,889,465 | B2 | 2/2011 | Bonilla et al. | |
| 7,911,746 | B2 * | 3/2011 | Zaretsky et al. | 361/42 |
| 7,936,238 | B1 * | 5/2011 | Weeks et al. | 335/18 |
| 2001/0033468 | A1 | 10/2001 | Macbeth | |
| 2002/0135957 | A1 | 9/2002 | Chan et al. | |
| 2002/0181175 | A1 | 12/2002 | Baldwin | |
| 2003/0016477 | A1 | 1/2003 | Li | |
| 2003/0080837 | A1 | 5/2003 | Macbeth | |
| 2003/0085783 | A1 | 5/2003 | Macbeth | |
| 2003/0086220 | A1 | 5/2003 | Nelson | |
| 2003/0151478 | A1 | 8/2003 | Radosavljevic et al. | |
| 2003/0202303 | A1 * | 10/2003 | Parker | 361/93.1 |
| 2004/0004795 | A1 | 1/2004 | Chan et al. | |
| 2004/0080879 | A1 | 4/2004 | Radosavljevic et al. | |
| 2004/0264077 | A1 | 12/2004 | Radosavljevic et al. | |
| 2005/0001607 | A1 | 1/2005 | Berland et al. | |
| 2005/0018062 | A1 | 1/2005 | Chiang et al. | |
| 2005/0117264 | A1 | 6/2005 | Aromin | |
| 2005/0140476 | A1 | 6/2005 | Gao | |
| 2005/0212522 | A1 | 9/2005 | Finlay et al. | |
| 2011/0148423 | A1 * | 6/2011 | Richards et al. | 324/424 |

* cited by examiner

ELECTRICAL DEVICE WITH MISWIRE PROTECTION AND AUTOMATED TESTING

CROSS-REFERENCE TO RELATED APPLICATIONS

This application is a continuation-in-part of U.S. patent application Ser. No. 12/553,573, filed on Sep. 3, 2009 now U.S. Pat. No. 7,936,238, which is a continuation of U.S. patent application Ser. No. 11/615,277 filed on Dec. 22, 2006, now U.S. Pat. No. 7,598,828, which is a continuation-in-part of U.S. patent application Ser. No. 10/942,633 filed on Sep. 16, 2004, U.S. Pat. No. 7,173,799, which is a continuation-in-part of U.S. patent application Ser. No. 10/900,769 filed on Jul. 28, 2004, U.S. Pat. No. 7,154,718, the contents of which are relied upon and incorporated herein by reference in their entirety, and the benefit of priority under 35 U.S.C. §120 is hereby claimed, U.S. patent application Ser. No. 10/900,769 claims priority under 35 U.S.C. §119(e) to U.S. Provisional Patent Application 60/541,506 filed on Feb. 3, 2004. This application is also a continuation-in-part of U.S. patent application Ser. No. 12/247,848, filed on Oct. 8, 2008 now U.S. Pat. No. 7,843,197, which is a continuation of U.S. patent application Ser. No. 11/025,509 filed on Dec. 29, 2004, now abandoned, which is a continuation-in-part of U.S. patent application Ser. No. 10/868,610 filed on Jun. 15, 2004, U.S. Pat. No. 6,980,005, which is a continuation-in-part of U.S. patent application Ser. No. 10/668,654 filed on Sep. 23, 2003, now U.S. Pat. No. 6,873,158, issued on Mar. 29, 2005, which is a continuation of U.S. patent application Ser. No. 09/725,525, filed on Nov. 29, 2000, now U.S. Pat. No. 6,674,289, the contents of which are relied upon and incorporated herein by reference in their entirety, and the benefit of priority under 35 U.S.C. §120 is hereby claimed. U.S. Pat. No. 6,674,289 claims priority under 35 U.S.C. §119(e) based on U.S. Provisional Patent Application Ser. No. 60/183,273, filed Feb. 17, 2000, the contents of which are relied upon and incorporated herein by reference in their entirety. This application is also a continuation-in-part of U.S. patent application Ser. No. 12/618 453, filed on Nov. 13, 2009, which is a continuation of U.S. patent application Ser. No. 11/469,596 filed on Sep. 1, 2006, now U.S. Pat. No. 7,619,860, which is a continuation of U.S. patent application Ser. No. 10/884,304 filed on Jul. 2, 2004, now U.S. Pat. No. 7,133,266, which is a continuation of U.S. patent application Ser. No. 09/971,525, now U.S. Pat. No. 6,856,498 filed on Oct. 5, 2001, which is a continuation of U.S. patent application Ser. No. 09/718,003, now U.S. Pat. No. 6,522,510 filed Nov. 21, 2000, the contents of which are relied upon and incorporated herein by reference in their entirety, and the benefit of priority under 35 U.S.C. §120 is hereby claimed.

BACKGROUND OF THE INVENTION

1. Field of the Invention

The present invention relates generally to protection devices, and particularly to protection devices having power to the receptacles cut-off features.

2. Technical Background

Most residential, commercial, or industrial buildings include one or more breaker panels that are configured to receive AC power from a utility source. The breaker panel distributes AC power to one or more branch electric circuits installed in the building. The electric circuits transmit AC power to one or more electrically powered devices, commonly referred to in the art as load circuits. Each electric circuit typically employs one or more electric circuit protection devices. Examples of such devices include ground fault circuit interrupters (GFCIs), arc fault circuit interrupters (AFCIs), or both GFCIs and AFCIs. Further, AFCI and GFCI protection may be included in one protective device.

The circuit protection devices are configured to interrupt the flow of electrical power to a load circuit under certain fault conditions. When a fault condition is detected, the protection device eliminates the fault condition by interrupting the flow of electrical power to the load circuit by causing interrupting contacts to break the connection between the line terminals and load terminals. As indicated by the name of each respective device, an AFCI protects the electric circuit in the event of an arc fault, whereas a GFCI guards against ground faults. An arc fault is a discharge of electricity between two or more conductors. An arc fault may be caused by damaged insulation on the hot line conductor or neutral line conductor, or on both the hot line conductor and the neutral line conductor. The damaged insulation may cause a low power arc between the two conductors and a fire may result. An arc fault typically manifests itself as a high frequency current signal. Accordingly, an AFCI may be configured to detect various high frequency signals and de-energize the electrical circuit in response thereto.

With regard to GFCIs, a ground fault occurs when a current carrying (hot) conductor creates an unintended current path to ground. A differential current is created between the hot/neutral conductors because some of the current flowing in the circuit is diverted into the unintended current path. The unintended current path represents an electrical shock hazard. Ground faults, as well as arc faults, may also result in fire. GFCIs intended to prevent fire have been called ground-fault equipment protectors (GFEPs.)

Ground faults occur for several reasons. First, the hot conductor may contact ground if the electrical wiring insulation within a load circuit becomes damaged. This scenario represents a shock hazard. For example, if a user comes into contact with a hot conductor while simultaneously contact ground, the user will experience a shock. A ground fault may also occur when the equipment comes in contact with water. A ground fault may also result from damaged insulation within the electrical power distribution system.

As noted above, a ground fault creates a differential current between the hot conductor and the neutral conductor. Under normal operating conditions, the current flowing in the hot conductor should equal the current in the neutral conductor. Accordingly, GFCIs are typically configured to compare the current in the hot conductor to the return current in the neutral conductor by sensing the differential current between the two conductors. When the differential current exceeds a predetermined threshold, usually about 6 mA, the GFCI typically responds by interrupting the circuit. Circuit interruption is typically effected by opening a set of contacts disposed between the source of power and the load. The GFCI may also respond by actuating an alarm of some kind.

Another type of ground fault may occur when the load neutral terminal, or a conductor connected to the load neutral terminal, becomes grounded. This condition does not represent an immediate shock hazard. As noted above, a GFCI will trip under normal conditions when the differential current is greater than or equal to approximately 6 mA. However, when the load neutral conductor is grounded the GFCI becomes de-sensitized because some of the return path current is diverted to ground. When this happens, it may take up to 30 mA of differential current before the GFCI trips. This scenario represents a double-fault condition. In other words, when the user comes into contact with a hot conductor (the first fault) at the same time as contacting a neutral conductor that has been grounded on the load side (the second fault), the user may experience serious injury or death.

The aforementioned protective devices may be conveniently packaged in receptacles that are configured to be installed in outlet boxes. The protective device may be configured for various electrical power distribution systems, including multi-phase distribution systems. A receptacle typically includes input terminals that are configured to be connected to an electric branch circuit. Accordingly, the receptacle includes at least one hot line terminal and may include a neutral line terminal for connection to the hot power line and a neutral power line, respectively. The hot power line and the neutral power line, of course, are coupled to the breaker panel. The receptacle also includes output terminals configured to be connected to a load circuit. In particular, the receptacle has feed-through terminals that include a hot load terminal and a neutral load terminal. The receptacle also includes user accessible plug receptacles connected to the feed through terminals. Accordingly, load devices equipped with a cord and plug may access AC power by way of the user accessible plug receptacles.

However, there are drawbacks associated with hard-wiring the user accessible plug receptacles to the feed-through terminals. As noted above, when a fault condition is detected in the electrical distribution system, a circuit interrupter breaks the electrical coupling between the line and load terminals to remove AC power from the load terminals. If the protective device is wired correctly, AC power to the user accessible plug receptacles is also removed. However, power to the user accessible plug receptacles may not be removed if the protective device is miswired.

In particular, a miswire condition exists when the hot power line and the neutral power line are connected to the hot output terminal and the neutral output terminal, respectively. For 120 VAC distribution systems, the hot power line and the neutral power line are configured to be connected the hot line terminal and the neutral line terminal, respectively. If the electrical distribution system includes load wires, miswire is completed by connecting the load wires to the line terminals. A miswire condition may represent a hazard to a user when a cord connected load is plugged into the user accessible receptacle included in the device. Even if the circuit is interrupted in response to a true or simulated fault condition, AC power is present at the terminals of the receptacle because the feed-through (load) terminals and the receptacle terminals are hard-wired. Thus, the user is not protected if there is a fault condition in the cord-connected load.

Besides miswiring, failure of the device to interrupt a true fault condition or simulated fault condition may be due to the device having an internal fault condition, also know as an end of life condition. The device includes electro-mechanical components that are subject to reaching end of life, including electronic components that can open circuit or short circuit, and mechanical components such as the contacts of the circuit interrupter that can become immobile due to welding, and the like.

In one approach that has been considered, the protective device is configured to trip in response to a miswire condition. Thus, if the power source of the electrical distribution system is connected to the load terminals (i.e., a line-load miswire condition), the circuit interrupting contacts will break electrical connection. The installer is made aware of the miswired condition when he discovers that power is not available to the downstream receptacles coupled to the miswired receptacle. After the miswiring condition is remedied, the interrupting contacts in the device may be reset. One drawback to this approach becomes evident when the protective device is not coupled to any downstream receptacles. In this scenario, the installer may not become aware of the miswire condition.

Accordingly, there is a need to deny power to the user accessible receptacles when the device is tripped. This safety feature is especially needed when the protective device is miswired.

SUMMARY OF THE INVENTION

The present invention is configured to deny power to the user accessible plug receptacles when the device is tripped. Accordingly, the present invention provides a safety feature that eliminates a hazard condition that may be evident during a miswire condition of the protective device.

One aspect of the present invention is directed to an electrical wiring device that includes a plurality of line terminals and a plurality of load terminals. At least one sensor is coupled to the plurality of line terminals or the plurality of load terminals. The at least one sensor provides a sensor output signal corresponding to electrical perturbations propagating on the plurality of line terminals or the plurality of load terminals. A fault detection circuit is coupled to the at least one sensor, the fault detection circuit being configured to generate a fault detection signal if the sensor output signal substantially corresponds to at least one predetermined fault criterion. An actuator assembly is responsive to the fault detection signal. The actuator assembly includes a breaker coil configured to generate an actuation force in response to being energized. A circuit interrupter is coupled to the actuator assembly. The circuit interrupter includes four sets of movable contacts configured to be driven into a reset state in response to a reset stimulus, the four sets of movable contacts being configured to be driven into a tripped state in response to the actuation force. A self-test circuit is coupled to the plurality of line terminals or the at least one sensor. The self-test circuit is configured to automatically generate a test signal from time to time during a predetermined portion of an AC power line cycle. The self-test circuit is configured such that the test signal is sensed by the at least one sensor when the at least one sensor is operational, the sensor output signal being a function of the test signal. A monitor circuit is configured to monitor the fault detection circuit or the actuator assembly; the mechanical actuation force is substantially inhibited when the fault detection circuit or at least a portion of the actuator assembly properly respond to the test signal. The monitor circuit generates an end-of-life response if the fault detection circuit or the actuator assembly do not respond to the test signal within a predetermined period of time.

In another aspect, the present invention is directed to an electrical wiring device that includes a housing assembly having a plurality of line terminals, a plurality of load terminals, and a plurality of receptacle load terminals. A circuit assembly includes at least one signal detection circuit. The at least one signal detection circuit is configured to detect at least one signal having predetermined signal characteristics propagating on at least one of the plurality of line terminals or at least one of the plurality of load terminals. The circuit assembly is configured to generate a detection stimulus in response to the at least one signal detection circuit detecting the at least one signal. An interrupting contact assembly is coupled to the circuit assembly, the plurality of line terminals, the plurality of load terminals and the plurality of receptacle load terminals. The interrupting contact assembly includes four sets of interrupting contacts that are at least partially disposed on four cantilevered members. The four cantilevered members include a first set of two cantilevered members and a second set of two cantilevered members. The first set of two cantilevered members are configured to rotate around a first axis in a first direction and the second set of two cantilevered members are configured to rotate around a second axis in a second direction opposite to the first direction. The four sets of interrupting contacts are configured to provide electrical continuity between the plurality of line terminals, the plurality of load terminals, and the plurality of receptacle load terminals in a reset state. The four sets of interrupting contacts are decoupled in a tripped state in response to the detection stimulus to interrupt the electrical continuity between the plurality of line terminals, the plurality of load terminals and the plurality of receptacle load terminals. An automated test assembly is coupled to the plurality of line terminals and the circuit assembly. The automated test assembly is configured to generate an automated test signal during a predetermined half-cycle of AC power and monitor a circuit assembly response to the automated test signal. The detection stimulus is substantially inhibited if the circuit assembly properly responds to the automated test signal. The automated test assembly generates an end-of-life response if the circuit assembly fails to respond to the automated test signal within a predetermined period of time.

In another aspect, the present invention is directed to an electrical wiring device that is configured to be installed in an electrical distribution system having an AC power source. The AC power source provides an AC power line signal characterized by a first half cycle having a first AC polarity and a second half cycle having a second AC polarity. The includes a plurality of line terminals and a plurality of load terminals and at least one circuit coupled to the plurality of line terminals and configured to conduct a predetermined current flow if a proper wiring condition has been effected. A proper wiring condition is effected when the plurality of line terminals are connected to the AC power source. At least one sensor is coupled to the plurality of line terminals or the plurality of load terminals. The at least one sensor provides a sensor output signal corresponding to electrical perturbations propagating on the plurality of line terminals or the plurality of load terminals. A fault detection circuit is coupled to the at least one sensor. The fault detection circuit is configured to generate a fault detection signal if the sensor output signal substantially corresponds to at least one predetermined fault criterion. An actuator assembly is responsive to the fault detection circuit. The actuator assembly includes a switch element and a solenoid. The switch element is turned ON in response to the fault detection signal to thereby conduct an energization signal through the solenoid. The solenoid exerts an actuation stimulus in response to the energization signal. A circuit interrupter is coupled to the actuator assembly. The circuit interrupter includes a latching mechanism. The circuit interrupter is in a reset state when the latching mechanism is latched; the circuit interrupter is in a tripped state when the latching mechanism is unlatched. The latching mechanism is unlatched by the actuation stimulus. The circuit interrupter is inhibited from entering the reset state absent the predetermined current flow. An end of life detection circuit is configured to provide a test signal to the at least one sensor during the second half cycle. The end of life detection circuit is further configured to monitor the fault detection circuit or the actuator assembly. The fault detection circuit or the actuator assembly generates a test response to the test signal when operational and not generating the test response otherwise. The actuation stimulus is substantially inhibited when the fault detection circuit or the actuator assembly generate the test response.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
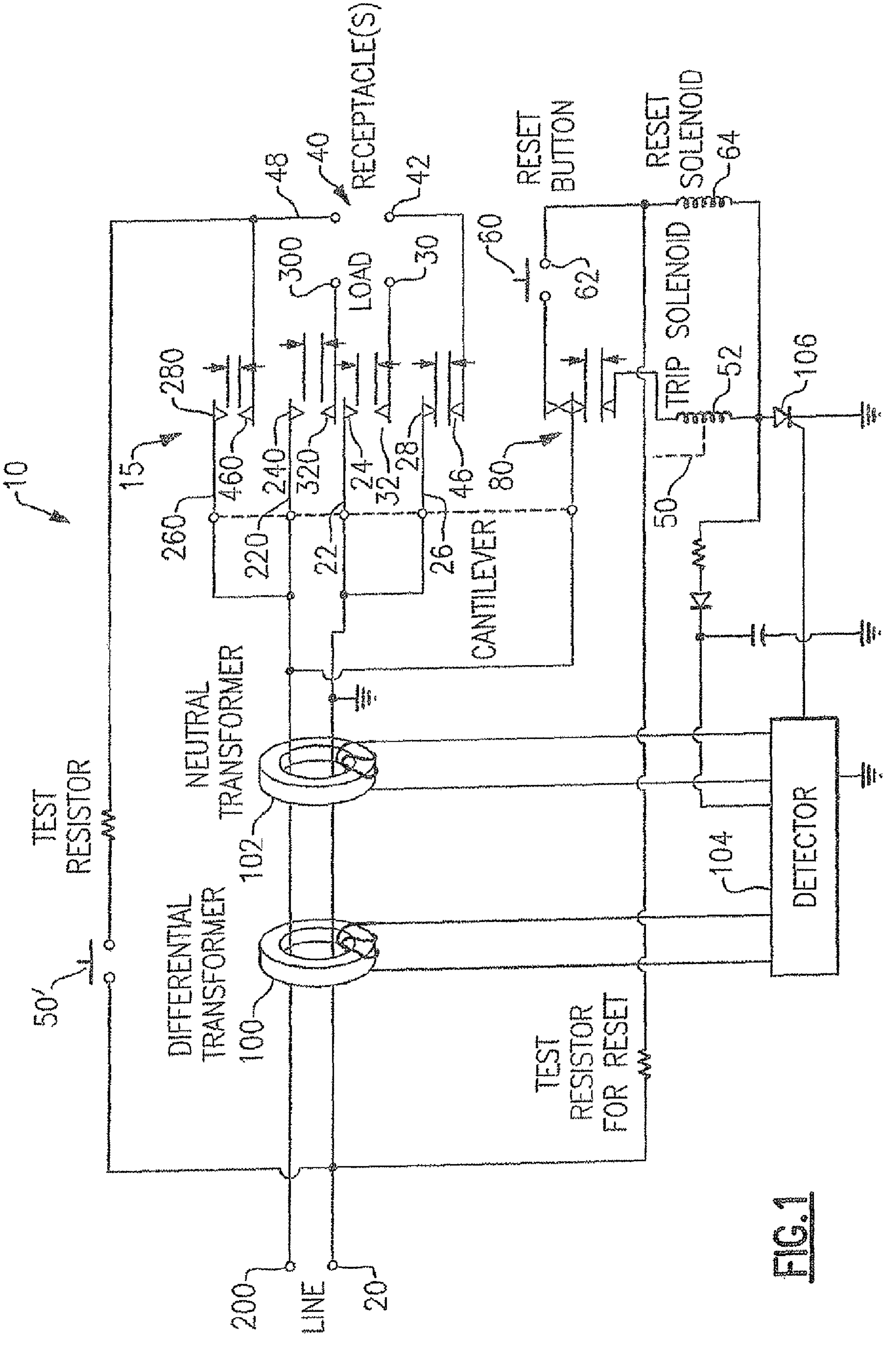
FIG. 1 is a block diagram of an electrical wiring device in accordance with a first embodiment of the present invention.

Reference will now be made in detail to the present embodiments of the invention, examples of which are illustrated in the accompanying drawings. Wherever possible, the same reference numbers will be used throughout the drawings to refer to the same or like parts. An exemplary embodiment of the wiring device of the present invention is shown in FIG. 1, and is designated generally throughout by reference numeral 10.

As embodied herein, and depicted in FIG. 1, a block diagram of an electrical wiring device 10 in accordance with a first embodiment of the present invention is disclosed. While FIG. 1 includes a GFCI, the present invention is equally applicably to AFCIs and/or other protective devices. The wiring device 10 includes a tripping mechanism that includes ground fault sensor 100 and grounded neutral sensor 102 coupled to detector 104. Detector 104 is coupled to silicon controlled rectifier (SCR) 106. SCR 106 is turned on in response to a detection signal from detector 104. SCR 106, in turn, signals trip solenoid 52 to actuate a pivotal latch mechanism 80 to open the contacts in contact assembly 15.

With regard to contact assembly 15, neutral line terminal 20 is connected to cantilever member 22 and cantilever member 26. Cantilevers 22 and 26 are coupled to latch mechanism 80. Cantilever member 22 includes a moveable contact 24. In the reset position, moveable contact 24 is configured to mate with stationary contact 32. Stationary contact 32 is coupled to neutral load feed-through terminal 30. Cantilever member 26 includes moveable contact 28. In the reset position, moveable contact 28 is configured to mate with stationary contact 46. Stationary contact 46 is coupled to the neutral contact 42 in receptacle 40. Hot line terminal 200 is connected to cantilever member 220 and cantilever member 260. Cantilevers 220 and 260 are also coupled to latch mechanism 80. Cantilever member 220 includes a moveable contact 240. In the reset position, moveable contact 240 is configured to mate with stationary contact 320, which is coupled to hot load feed-through terminal 300. Cantilever member 260 includes a moveable contact 280. In the reset position, moveable contact 280 is configured to mate with stationary contact 460, which is coupled to the hot contact 48 in receptacle 40.

Accordingly, when SCR 106 signals trip solenoid 52, latch mechanism 80 pulls the cantilevers 22, 26, 220, and 260 such that moveable contacts 24, 28, 240, and 280 are separated from stationary contacts 32, 46, 320, and 460, respectively. When reset button 60 is depressed, reset solenoid 64 is actuated. Solenoid 64 causes latch mechanism 80 to close the aforementioned pairs of contacts to thereby restore AC power.

The reset mechanism includes reset button 60, contacts 62, and reset solenoid 64. When reset button 60 is depressed, contacts 62 are closed to thereby initiate a test procedure. If the test procedure is successful, reset solenoid 64 is actuated, and latch mechanism 80 is toggled to reset device 10. When device 10 has an internal fault condition, the test procedure is unsuccessful, and the circuitry does not transmit a reset signal. The reset solenoid 64 is not actuated, and the device is not reset. As described above, latch mechanism 80 is toggled between the tripped state and the reset state by trip solenoid 52 and reset solenoid 64, respectively.

Latch mechanism 80 may be toggled to the tripped position by the fault detection circuitry, as described above, or by a user accessible test button 50. Alternatively, latch mechanism 80 may be tripped by the fault detection circuitry, as described above, and by an electrical test button 50'. The electrical test button 50' produces a simulated condition configured to test a portion of, or all of, the detection circuitry. A test acceptance signal toggles latch mechanism 80 to the tripped position. The simulated condition may be a test signal or an induced fault signal. Hereinafter, both of these signals will be referred to as simulated fault conditions.

Figure 2:
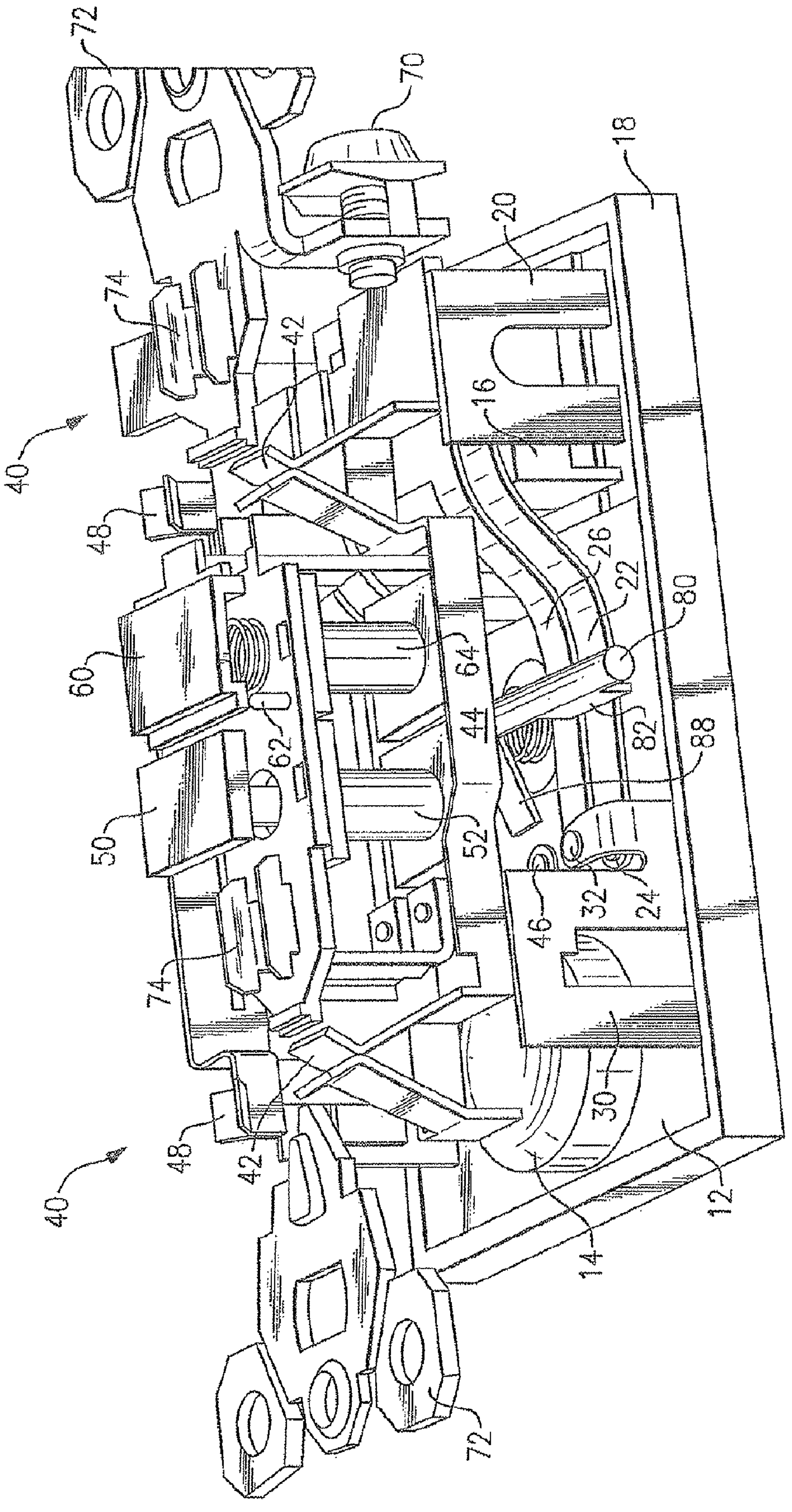
FIG. 2 is a perspective view of the electrical device depicted in FIG. 1.

Referring to FIG. 2, a perspective view of the electrical wiring device shown in FIG. 1 is disclosed. Electrical device 10 includes a circuit board 12 which is mounted on member 18. Movistor 14 and sensor coil assembly 16 houses ground fault sensor 100 and grounded neutral sensor 102 are mounted on circuit board 12. Circuit board 12 includes a protective circuit that is discussed in more detail below. Device 10 is configured to be coupled to AC electrical power by way of line neutral terminal 20 and line hot terminal 200 (not shown in FIG. 2). Power is provided to a load via load neutral terminal 30 and load hot terminal 300 (not shown in FIG. 1). Device 10 also provides power to user plug contacts by way of at least one receptacle 40. Receptacles 40 include neutral contact 42, hot contact 48, and ground contact 74. Ground contact 74 is electrically connected to ground terminal 70 and ground strap 72. Similarly, device 10 and receptacle 40 can be configured for other electrical distribution systems having a single phase or multiple phase power source that include at least one hot terminal and that may include a neutral terminal and/or ground terminal.

Line neutral cantilevers 22, 26 are connected at one end to line neutral terminal 20. At the other end, line cantilever 22 includes a terminal contact 24. In similar fashion, line cantilever 26 includes a terminal contact 28 adjacent to contact 24. Cantilevers 22 and 26 are flexibly connected to latch mechanism 80 by way of wiper arm 82. Load neutral terminal 30 is coupled to load neutral contact 32. Load neutral contact 32 and line neutral contact 24 form a pair of separable contacts. Receptacle neutral contact 42 is connected to member 44. Member 44 includes neutral contact 46. Neutral contact 46 and line neutral contact 28 also form a pair of separable contacts.

Latch mechanism 80 is actuated by test button 50 and reset button 60. Test button 50 is a mechanical actuator that is coupled to latch mechanism 80. When test button 50 is depressed, each separable contact pair is separated to remove power to the feed through terminals and the receptacle terminals. Reset button 60 is an electric switch mechanism that is actuated when button 60 closes contacts 62. Contacts 62 actuate solenoid 64. If the test is successful, each separable contact pair is closed. The operation of dual-solenoids 52, 64 will be discussed below in more detail.

Figure 3:
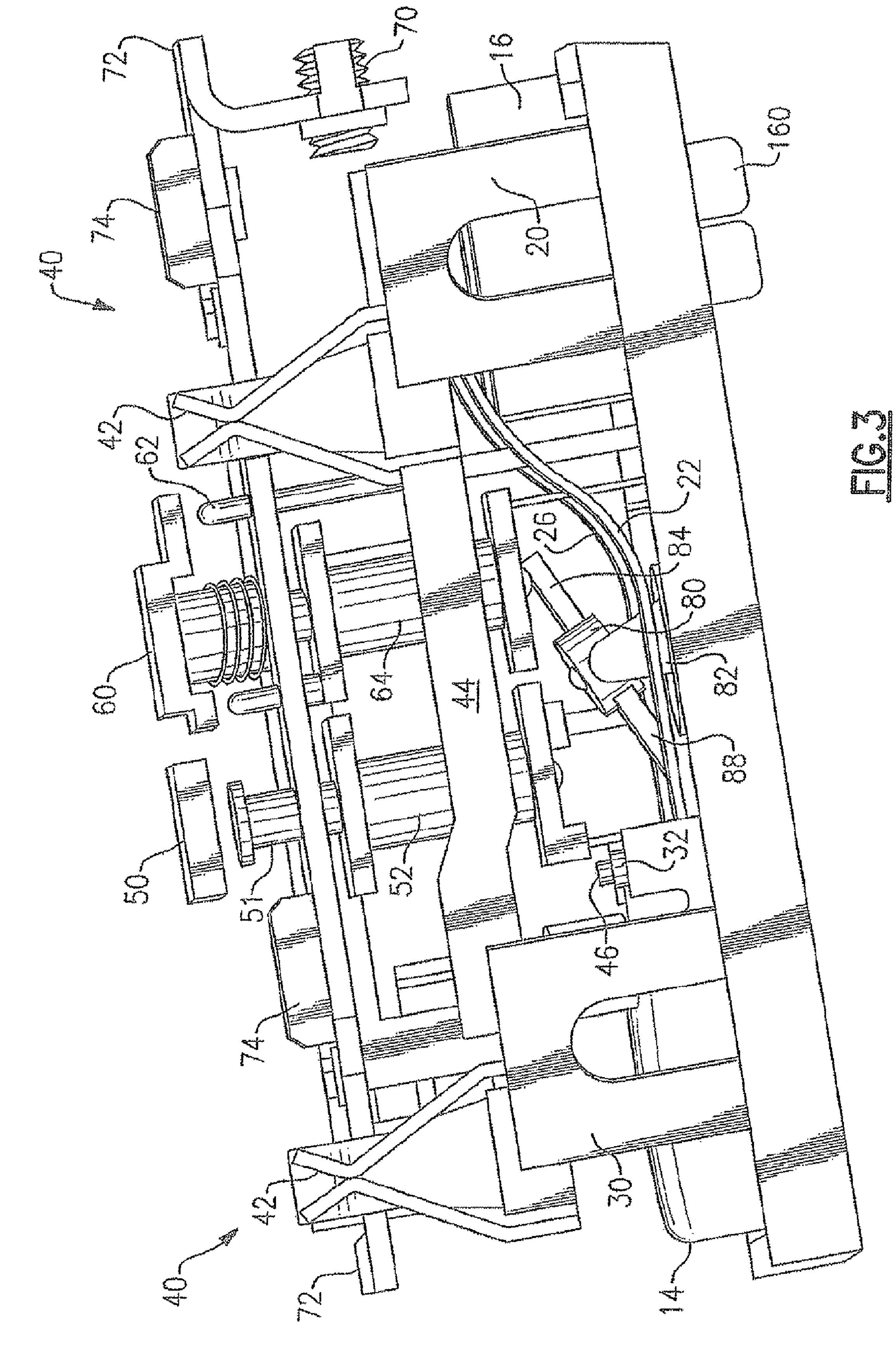
FIG. 3 is a side elevation view of the electrical wiring device depicted in FIG. 1.

Referring to FIG. 3, a side elevation view of the electrical wiring device 10 depicted in FIG. 1 is shown. FIG. 3 depicts a tripped state wherein power is denied to receptacles 40. Note that latch arm 88 is in a downward position such that line neutral contact 24 and line neutral contact 28 are not in contact with load neutral contact 32 and receptacle neutral contact 46, respectively. The reset mechanism operates as follows. When reset button 60 activates reset solenoid 64, latch arm 84 is forced downward; latch arm 88 is directed upward forcing flexible cantilevers 22 and 26 upward as well. This movement forces line neutral contact 24 against load neutral contact 32, and line neutral contact 28 against neutral contact 46.

Figure 4:
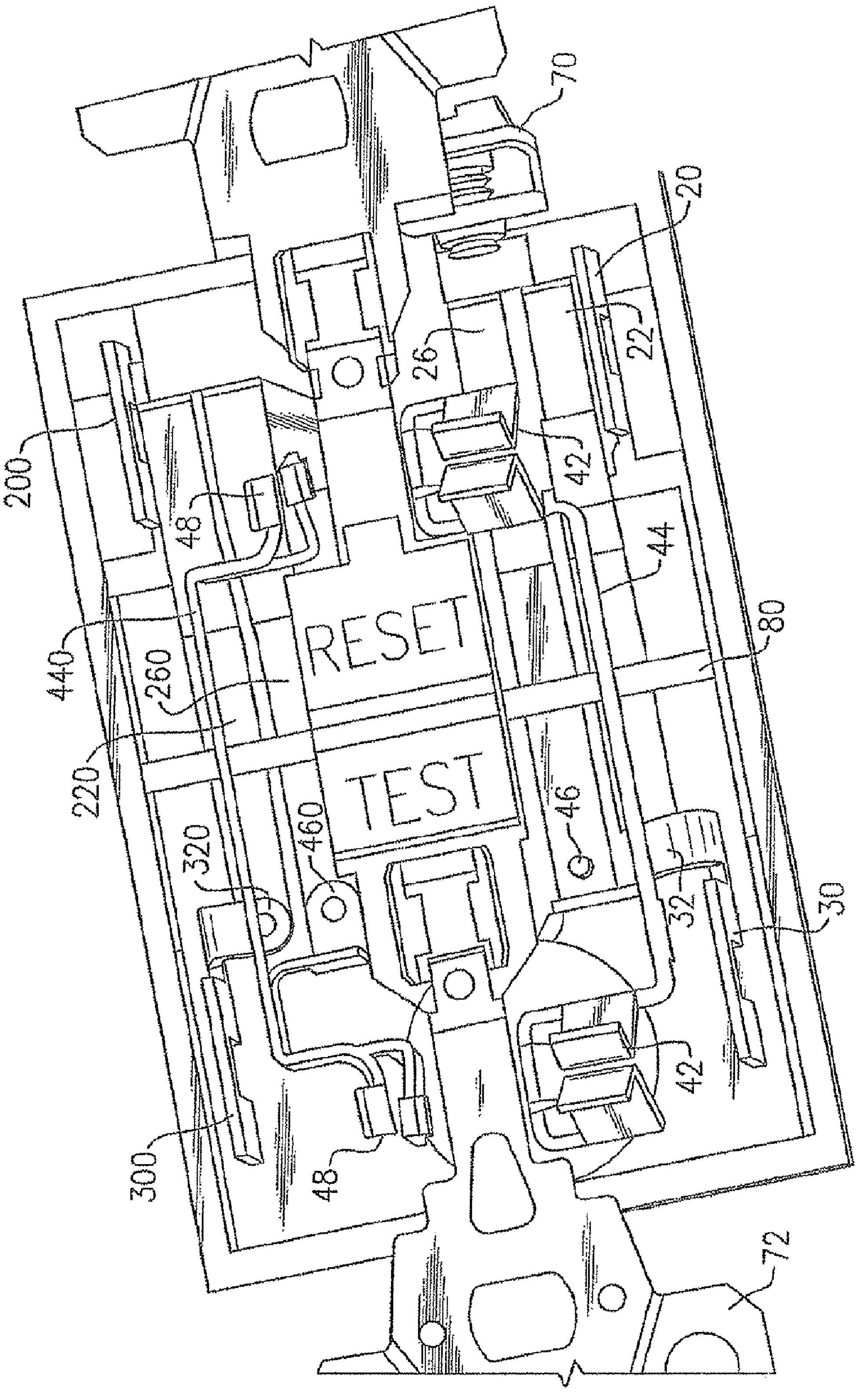
FIG. 4 is a top view of the electrical wiring device depicted in FIG. 1.

Referring to FIG. 4, a top view of the electrical wiring device depicted in FIG. 1 is disclosed. The "hot" side of device 10 is the mirror image of the "neutral" side of device 10. The line hot wire from the electrical distribution system is connected to line hot terminal 200, and the load hot wire is connected to load hot terminal 300. Hot receptacle contacts are connected to member 440. Cantilevers 220 and 260 include moveable hot contacts 240, 280, respectively. Hot contacts 240 and 280 are paired with fixed contacts 320 and 460, respectively. Accordingly, when device 10 is in the tripped state, as described above, contact pair 240/320 and contact pair 280/460 are opened. When latch 80 is toggled by reset button 60, reset solenoid 64 is activated. As a result, flexible cantilevers 220 and 260 are directed upward pressing line hot contact 240 against load hot contact 320, and line hot contact 280 against receptacle hot contact 460.

Referring to FIGS. 2-4, test solenoid 52 includes an armature 51. When solenoid 52 receives a signal from SCR 106, a magnetic force is induced in armature 51 to drive latch arm 88 downward, causing the contacts to separate. When test button 50 is depressed by the user, a mechanical force is applied to move arm 88 downward. Test button 50 and armature 51 may be configured such that the mechanical force applied to button 50 drives latch arm 88 downward. As a result, power is removed from both the feed-through terminals (30, 300) and from the receptacles 40. When reset button 60 is depressed, contacts 62 are closed and a test routine is initiated. The protective circuit disposed on circuit board 12 generates a test signal. The circuit is configured to sense and detect the test signal. If the test signal is successfully detected, the reset solenoid 64 is activated. In response, latch 80 is toggled in the other direction. Cantilevers 22, 26, 220, and 260 are spring-loaded and biased in an upward direction to close the contacts and provide power to the receptacle(s) 40 and feed-through terminals (30,300.) As noted above, if the test is not successful, solenoid 64 is not actuated and the contacts remain open.

In this embodiment, the device is typically tripped before being installed by the user. If the device is miswired by the installer, source power is not available to the reset solenoid due to the tripped condition. The device cannot be reset. As a result, AC power is denied to the receptacles until device 10 is wired correctly.

Figure 5:
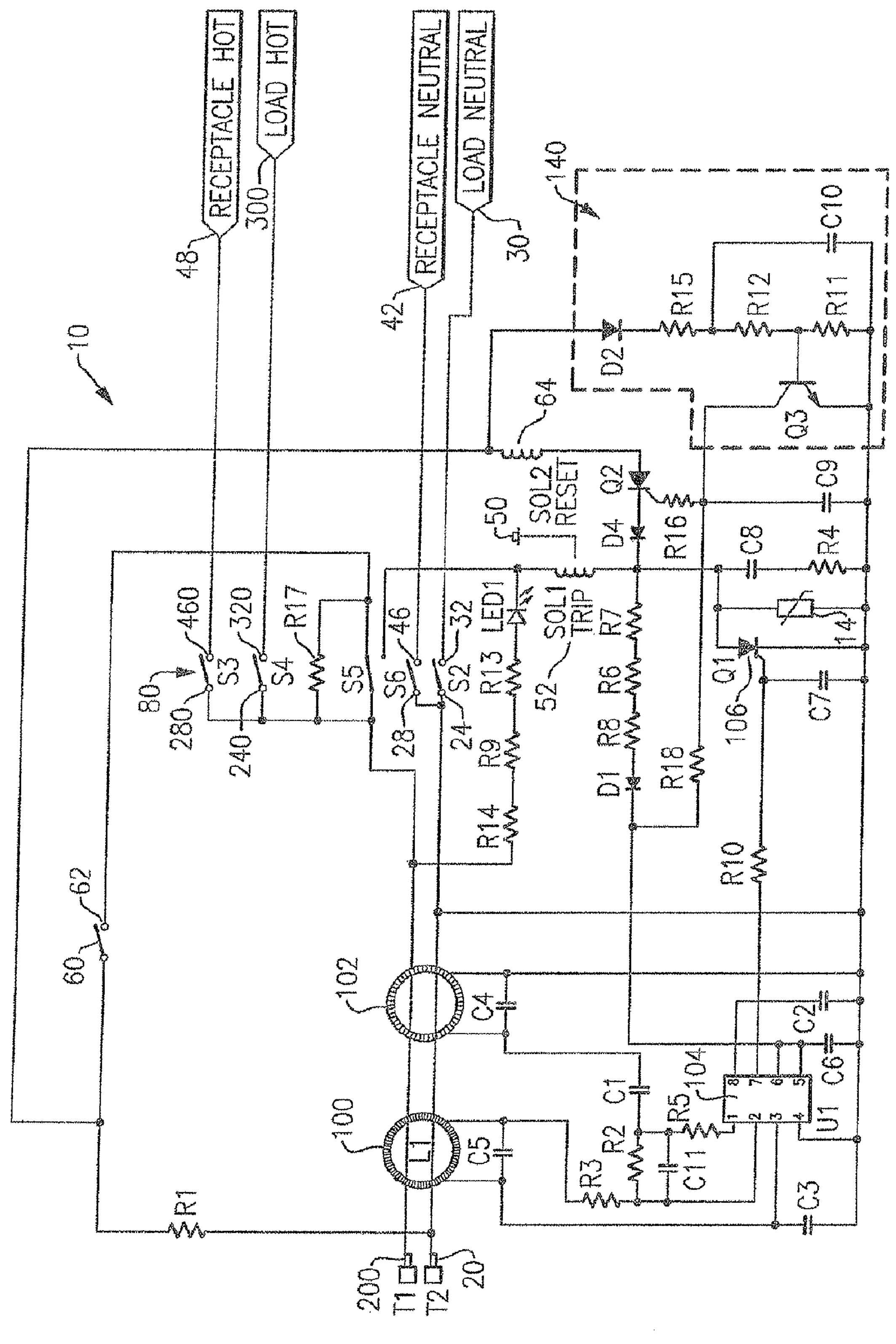
FIG. 5 is a schematic of the electrical device depicted in FIG. 1.

Referring to FIG. 5, a schematic of the electrical device 10 shown in FIGS. 1-4 is disclosed. When reset button 60 is depressed, contacts 62 are closed and a test signal is generated. If the circuit is operational, sensor 100 and detector 104 will sense and detect a differential current. A signal is provided to silicon controlled rectifier 106 and reset solenoid 64 is activated. As shown in FIGS. 1-4, reset solenoid 64 toggles latch 80 causing wiper arm 82 to separate from cantilevers 22, 26, 220, and 260. Cantilevers 22, 26, 220, and 260 are spring-loaded and biased in an upward direction. Accordingly, the cantilevers close the contacts and provide power to the receptacles 40 and load terminals (30,300.)

Subsequently, if the protection circuit senses and detects a fault condition, trip solenoid 52 is activated causing latch 80 to toggle in the other direction. Wiper arm 82 overcomes the spring loaded bias of the cantilevered arm and drives the cantilevers downward to thereby open the contacts and trip the device. As a result, power is removed from receptacles 40 and load terminals 30 and 300.

Figure 6:
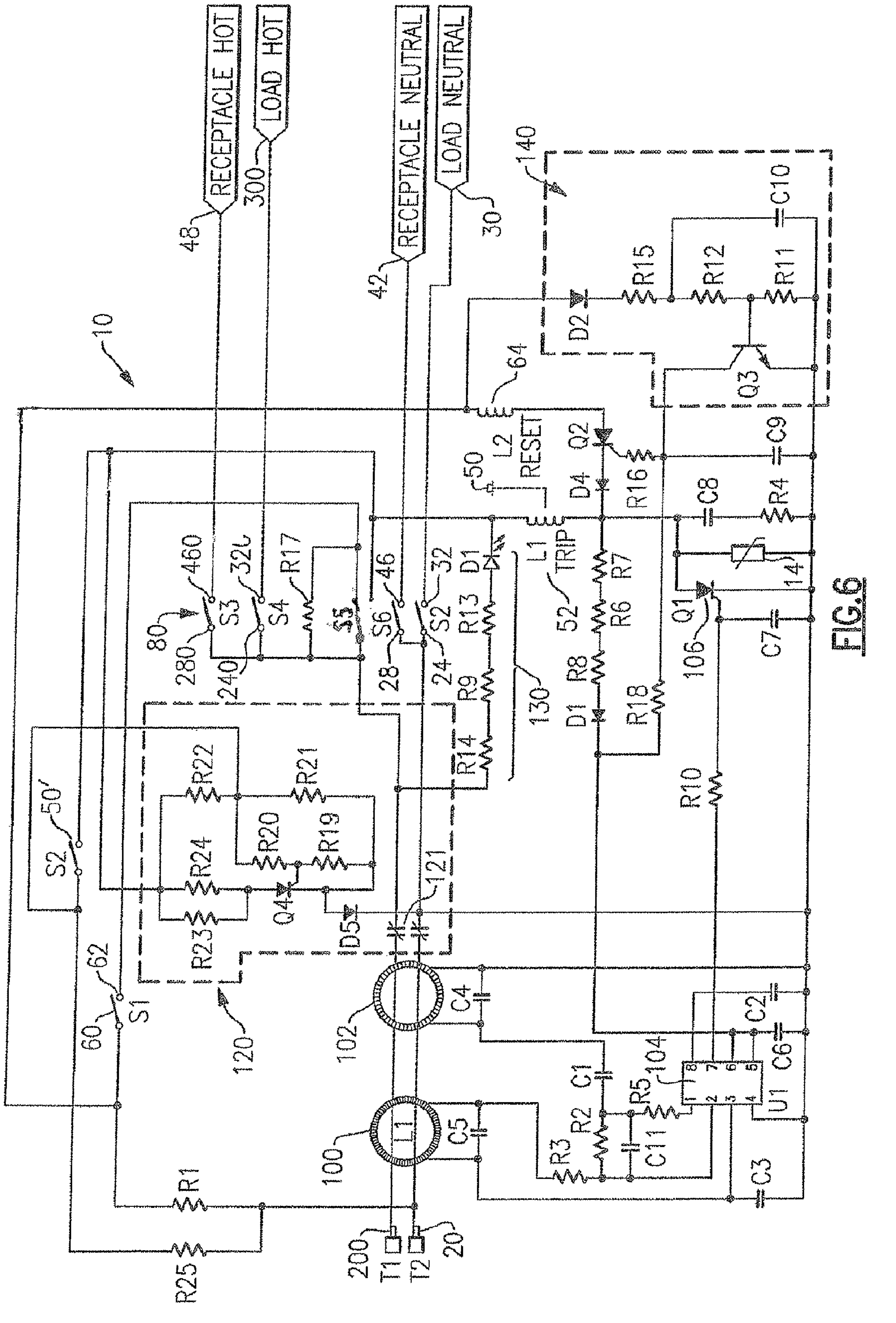
FIG. 6 is a schematic of the electrical device in accordance with an alternate embodiment of the present invention.

Referring to FIG. 6, a schematic of the electrical device in accordance with an alternate embodiment of the present invention is shown. The embodiment shown in FIG. 6 is similar to the embodiment of FIG. 5. However, the mechanical test button 50 and the trip actuator 52 shown in FIG. 5 are replaced by an electronic test button 50' in the embodiment shown in FIG. 6. The electronic test button causes a simulated test fault to be generated.

Trip solenoid 52 is activated when sensor 100 and detector 104 detect a fault condition. The contacts pairs 24 and 32, 28 and 46, 480 and 460, and 240 and 320 electrically decouple in response thereto, disconnecting the line, load, and receptacle contacts. TEST button switch 50' is accessible to the user and introduces a simulated ground fault, providing a convenient method for the user to periodically test the GFCI operation.

Device 10 may include a trip indicator. When device 10 is tripped, trip indicator 130 is activated. Trip indicator 130 includes components R9, R13, R14, and D1 (LED) which are connected in parallel with switch S7. When device 10 is tripped, LED D1 is illuminated. However, when the contacts are reset, there is no potential difference to cause illumination of LED and D1. Those of ordinary skill in the art will recognize that indicator 130 may include an audible annunciator as well as an illumination device.

After device 10 is tripped, the user typically depresses reset switch 60 to reset the device. Switch S5 is disposed in a position to supply power to the reset solenoid 64 via switch 60, 62. Once reset button 60 is depressed, a simulated fault is introduced through R1. The GFCI power supply (located at the anode of D1) supplies current to charge capacitor C9. When the detector 104 responds to the simulated fault, SCR Q1 is turned on. When SCR Q1 is turned on, the charge stored in C9 will discharge through the R16 and SCR Q2. As a result of the discharge current, SCR Q2 is turned on, current flows through reset solenoid 64, and the device 10 is reset.

Device 10 includes a timing circuit that is configured to limit the time that the reset solenoid is ON, irrespective of the duration that the reset button is depressed by the user. Momentary activation of the reset solenoid avoids thermal damage to the reset solenoid due to over-activation. This feature also avoids the possibility of the reset solenoid interfering with circuit interruption when the trip solenoid is activated.

Timing circuit 140 includes: diode D2; resistors R15, R12, and R11; capacitor C10; and transistor Q3. When the reset button 60 is depressed, C10 begins charging through D2 and R15 while the simulated fault signal through R1 is being introduced. C10 is charged to a voltage that turns transistor Q3 ON after a predetermined interval, typically one and a half line cycles (25 milliseconds). Transistor Q3 discharges capacitor C9, causing Q2 to turn off. Thus, reset solenoid 64 is activated when reset button 60 is pressed and causes SCRs Q1 and Q2 to turn on, and deactivates when transistor Q3 turns on and causes SCR Q2 to turn off. Reset solenoid 64 can be reactivated for another momentary interval if the reset button 60 is released by the user for a pre-determined duration that allows C4 to discharge to a voltage where Q3 turns off. Alternatively, a timer can establish momentary reset solenoid actuation by controlling the duration of the simulated test signal or the closure interval of contact 62. Alternatively, the timer can employ mechanical and/or electrical timing methods.

Referring to FIG. 6, if device 10 has an internal fault condition that prevents SCR Q1 from turning on, device 10 has reached an end-of-life condition. The end-of-life circuit 120 is configured to detect an internal fault condition. When the internal fault is detected, reset solenoid 64 cannot be activated, and device 10 cannot be reset to provide power to the user receptacle terminals or the load terminals. As a result of the detection, the end-of-life circuit removes power from the user receptacles and the load terminals. Removal of power by the end-of-life circuit does not rely on the reset mechanism, the reset solenoid, or the circuit interrupter.

End-of-life (EOL) circuit 120 includes resistors R19-R25, SCR Q4, and diode D5. Resistor R23 is configured to heat to a temperature greater than a pre-established threshold when device 10 has an internal fault. When the temperature of resistor R23 is greater than the threshold, the line terminals decouple from the load terminals, independent of the four-pole interrupter contacts previously described. Alternatively, a resistor can be dedicated to each terminal. The resistors are heated independently to decouple the load terminals from the line terminals.

EOL circuit 120 operates as follows. With device 10 reset, the user pushes the TEST button 50', and a simulated fault is introduced through R25. Accordingly, 120V AC power is applied to EOL circuit 120. If the GFCI is operating properly, sensor 100, detector 104, and other GFCI circuitry will respond to the simulated fault and trip switches S3-S7 (contact pairs 24,32; 28,46; 240,320; 280,460) within a predetermined time (typically 25 milliseconds for GFCIs.) The circuit is designed such that the simulated fault current flowing through R25 is terminated while TEST button 50' is continuously being pushed. As such, power is removed from EOL circuit 120 before resistors R23 and/or R24 reach the temperature threshold.

Resistors R20-R22 and SCR Q1 form a latch circuit. When device 10 is not operating properly. The uninterrupted current through R21 will cause the resistance value of R21 to increase significantly. When resistor R21 changes value, the voltage divider formed by R21 and R22 is likewise changed. The voltage across R20 and R19 becomes sufficient to turn on Q4 and current begins to flow through resistors R23 and R 24. In a short period of time, R23 and R24 begin to overheat and the solder securing R23 and R24 to printed circuit board 12 fails. After the solder melts, resistors R23 and R24 are displaced, actuating a mechanical disconnect mechanism 121. Alternatively, the response time of R23, R24 can be designed such that the solder is melted within the time test button 50 is depressed, in which case, the latch circuit can be omitted. R23 and R24 are directly coupled to the test circuit in this embodiment.

Figure 7:
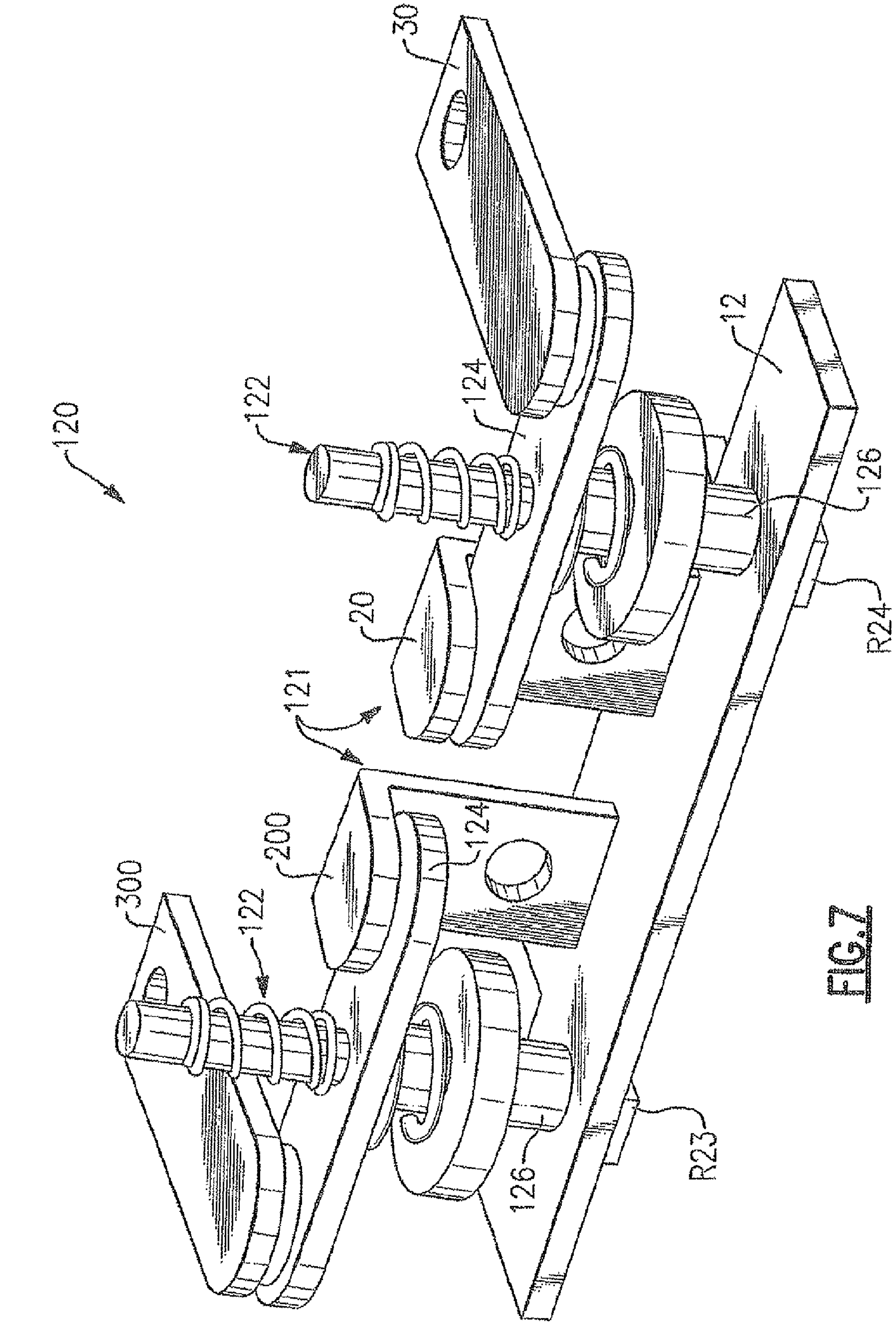
FIG. 7 is a perspective view of the end-of-life mechanism shown in FIG. 6.

FIG. 7 is a perspective view of the EOL mechanism 120 shown in FIG. 6. Resistors R23 and R24 are soldered to the underside of printed circuit board (PCB) 12. Openings are disposed in PCB 12 in alignment with resistors R23 and R24.

Resistors R23 and R24 prevent spring loaded plungers 122 from extending through the openings 126 in board 12. Each plunger 122 is configured to support an electrically connecting bus-bar member 124. Each bus-bar 124 couples a line terminal (20, 200) to a load terminal (30, 300). As described above, when the solder supporting R23 and R24 melts, spring loaded plungers 122 are driven through the holes, breaking the connections between the line and load terminals. Once this occurs, there is no mechanism for resetting the device. Accordingly, the device must be replaced.

Figure 8:
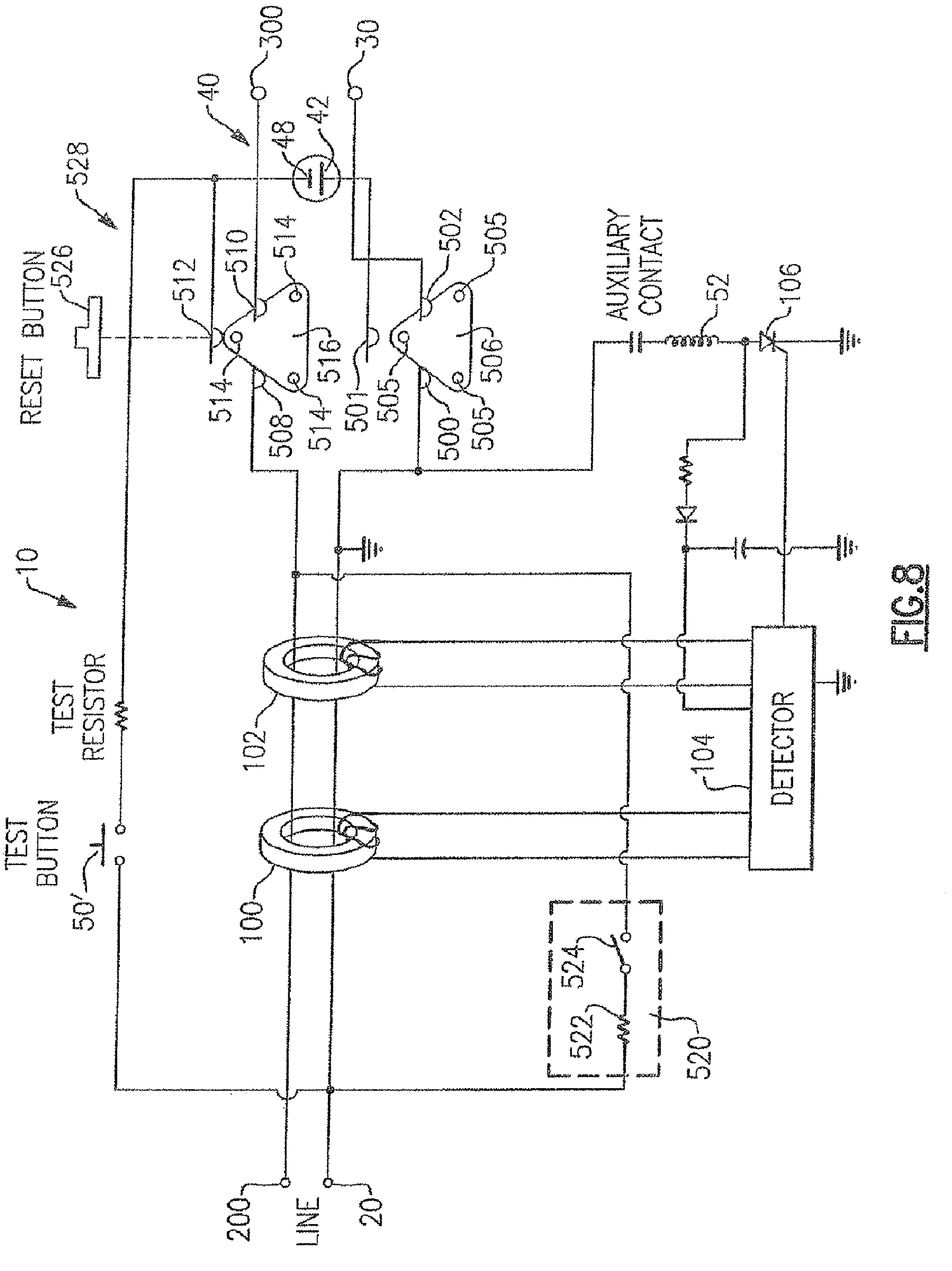
FIG. 8 is a block diagram of an electrical wiring device in accordance with a second embodiment of the present invention.

As embodied herein and depicted in FIG. 8, a block diagram of an electrical wiring device 10 in accordance with a second embodiment of the present invention is disclosed. Wiring device 10 is depicted as a GFCI. However, those skilled in the art will recognize that device 10 may be configured as an AFCI or another protective device. In this embodiment, a tri-contact design is employed. This design is also a four-pole design that is configured to deny power to the receptacles when the device is miswired and in a tripped state. Line neutral 20 is coupled to fixed neutral contact 500. Receptacle neutral contact 42 is coupled to fixed neutral contact 501. Neutral feed through terminal 30 is coupled to fixed load neutral contact 502. Each of the fixed contacts 500, 501 and 502 is paired with a moveable contact 505 disposed on tri-contact mechanism 506. On the "hot side," each of the fixed contacts 508, 510 and 512 is paired with a moveable contact 514 disposed on tri-contact mechanism 516. The wiring device tripping mechanism includes ground fault sensor 100 and grounded neutral sensor 102 coupled to detector 104. Detector 104 is coupled to silicon controlled rectifier (SCR) 106. SCR 106 is turned on in response to a detection signal from detector 104. SCR 106, in turn, signals trip solenoid 52 to move tri-contact mechanism 506 and tri-contact mechanism 516 away from the fixed contacts to thereby trip device 10.

The present invention, including the schematic shown in FIG. 8, incorporates features disclosed in U.S. Pat. No. 6,522,510 which is incorporated herein by reference in its entirety. Miswire circuit 520, shown in dashed lines, is included. Circuit 520 includes a miswire resistor 522 in series with a switch 524. Switch 524 is open during manufacturing assembly to facilitate electrical testing of device 10. After device 10 has been tested, switch 524 is closed. When device 10 is properly wired, i.e., the source of power of the electrical distribution system is connected to line terminals 20 and 200, a constant current flows through resistor 522. Resistor 522 is configured to open circuit when the electrical current has flowed for a predetermined time. The predetermined time is about 1 to 5 seconds. After resistor 522 has open-circuited, reset button 526 may be depressed, enabling trip mechanism 528 to enter the reset state. Optionally, a fuse or an air gap device (not shown) may be connected in series with resistor 522. In this embodiment, resistor 522 remains closed and the fuse, or air gap device, is responsible for open-circuiting within the predetermined time.

If device 10 is miswired, the constant flow of current through resistor 522 is not present for a sufficient amount of time, and resistor 522 fails to open-circuit. However, the current that does flow through resistor 522 is sensed by differential transformer 100 as a differential current and detected by detector 104. Detector 104 signals SCR 106 to turn ON to thereby actuate solenoid 52. In turn, solenoid 52 is energized, tripping the mechanism 528. Accordingly, the current flowing through resistor 522 is interrupted before it fails. The duration of the interrupted current flow through resistor 522 is approximately the response time of device 10, e.g., less than 0.1 seconds. The duration of the current flow is too brief to cause opening of resistor 522. If reset button 526 is depressed to reset trip mechanism 528, current starts to flow again through resistor 522, however, the current is detected and mechanism 528 is immediately tripped again before resistor 522 is opened. In this manner, trip mechanism 528 does not remain in the reset state when the source of power of the power distribution system is miswired to the load terminals. Thus power is removed automatically from the receptacle terminals when the power source has been miswired to the load terminals.

Note that the circuit interrupting mechanism 120 employed in U.S. Pat. No. 6,522,510 and shown in FIGS. 1-3, is implemented using four sets of interrupting contacts disposed on a buss bar arrangement. In the '510 patent, a two-pole circuit interrupter is implemented. In the present invention, four sets of interrupting contacts may be arranged to implement a four pole circuit interruption, i.e., wherein the feed through load terminals are separated from the receptacle load terminals (as well as the line terminals) when the device is in the tripped state. Moreover, FIGS. 8-12 of the instant application show various bus bar arrangements implemented for four-pole circuit interruption, i.e., wherein the feed through load terminals are separated from the receptacle load terminals (as well as the line terminals) when the device is in the tripped state.

Figure 9:
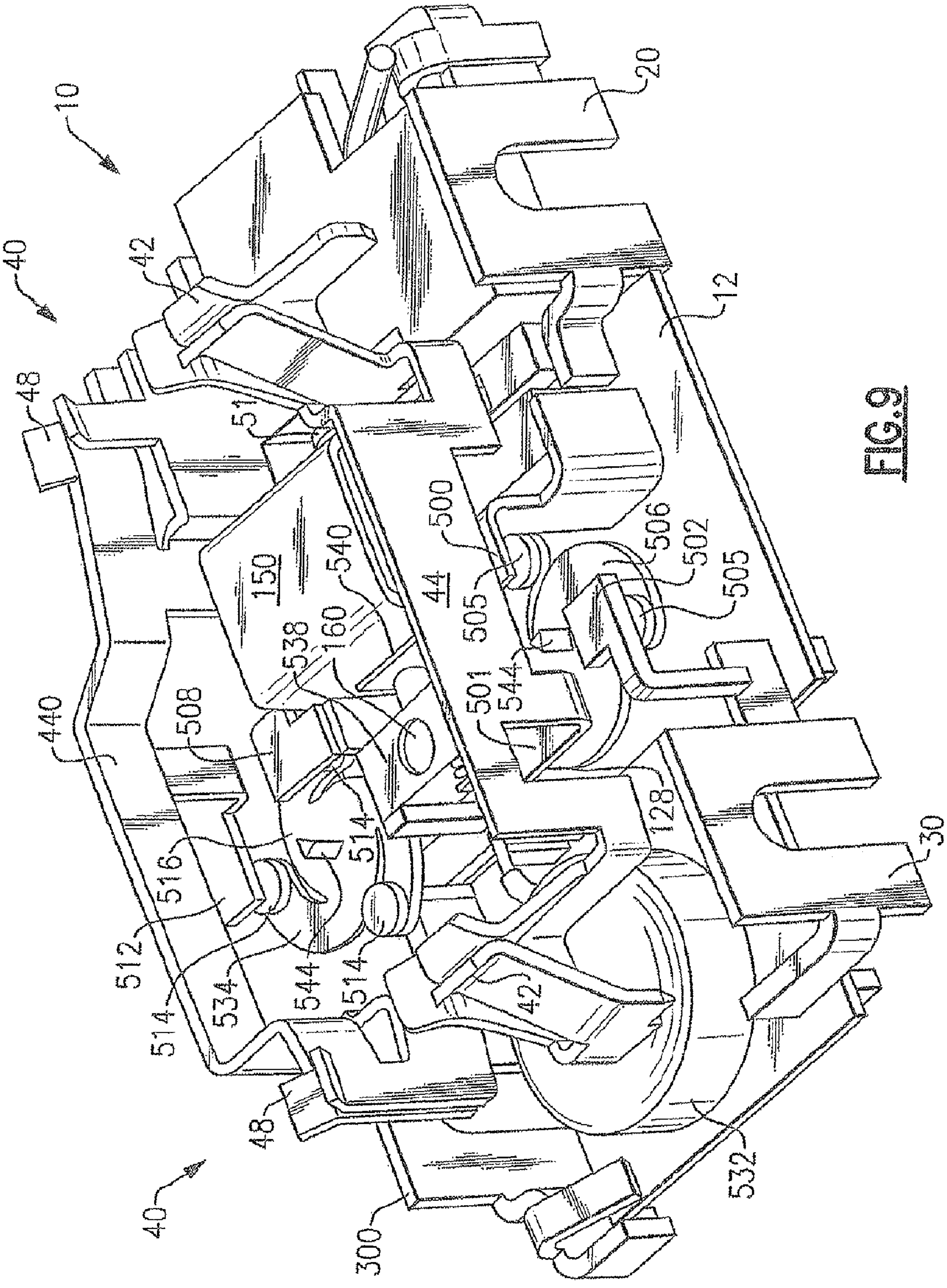
FIG. 9 is a perspective view of the electrical wiring device shown in FIG. 8.

Referring to FIG. 9, a perspective view of the electrical wiring device shown in FIG. 8 is disclosed. Protective device 10 includes a circuit board 12 which is mounted on member 118. Movistor 532, similar to movistor 14, is mounted on circuit board 12. Circuit board 12 may include either one of the protective circuits shown in FIG. 5 or FIG. 6. Device 10 is configured to be coupled to AC electrical power by way of line neutral terminal 20 and line hot terminal 200 (not shown in FIG. 9). Power is provided to a load via load neutral terminal 30 and load hot terminal 300. Device 10 also provides power to user plug contacts by way of receptacles 40. Receptacles 40 include receptacle neutral contacts 42, hot contacts 48, and ground contacts 74 (not shown.) Wiring device 10 includes four-pole functionality by virtue of tri-contact mechanisms 506, 516.

Both neutral contact mechanism 506 and hot contact mechanism 516 are configured to be moved upward and downward with respect to the fixed contacts 500, 501, 502, 508, 510 and 512 Neutral contacts 505, are disposed on curvilinear arms 534. As shown, one contact 505 corresponds to line contact 500, another to load contact 502, and yet another to fixed neutral contact 501. Referring to hot contact mechanism 516, contacts 514 are disposed on arms 536. Load hot contact 510 is not shown in FIG. 9 for clarity of illustration. However, tri-contact 516 includes three contacts 514, one contact corresponding to hot line contact 508, another to hot load contact 510, and yet another contact to hot fixed contact 512.

Figure 10:
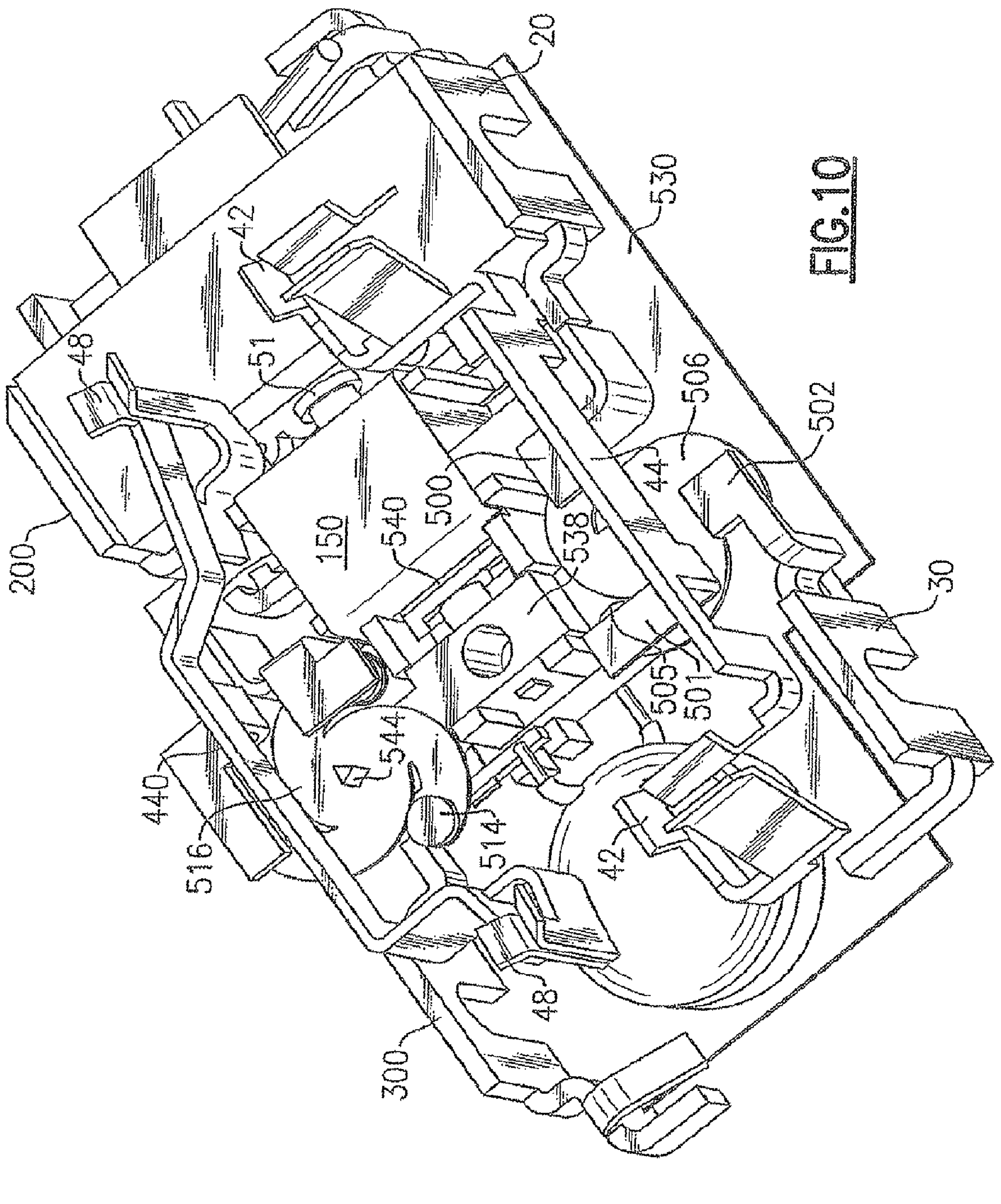
FIG. 10 is a plan view of the device shown in FIG. 8.

Referring to FIG. 10, contact mechanisms 506 and 516 are coupled to latch block 538. Latch block 538 is coupled to latch mechanism 540. Latch mechanism 540 is actuated by solenoid 52 (not shown) disposed in housing 150. Solenoid 52 is also coupled to armature 51. When the solenoid 52 is energized, armature 51 moves toward latch block 538, and latch mechanism 540 is directed with respect to latch block 538 to move latch block 538 in a downward direction, breaking the electrical connections between moveable contacts 505 (514) against fixed contacts 500, 501, 502 (508, 510, 512). Latch block 538 includes a cylindrical hole that is configured to accommodate a reset pin (not shown). Reference is made to U.S. Pat. No. 6,621,388, U.S. application Ser. No. 10/729,392, and U.S. application Ser. No. 10/729,396 which are incorporated herein by reference as though fully set forth in its entirety, for a more detailed explanation of the reset mechanism.

Figure 11:
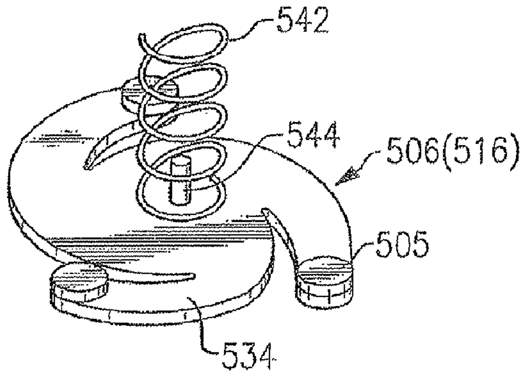
FIG. 11 is a detail view of the device shown in FIG. 8.
Figure 12:
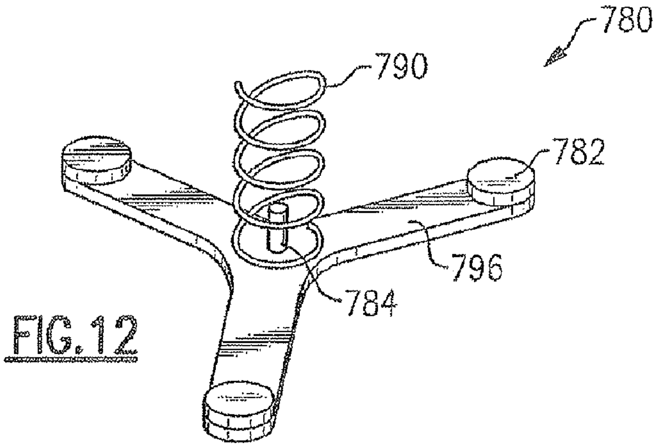
FIG. 12 is an alternate detail view of the device shown in FIG. 8.

Referring to FIG. 11, a detail view of the contact mechanism 506 shown in FIG. 9 and FIG. 10 is disclosed. As noted above, contact mechanism 506 includes contacts 505 disposed on curvilinear arms 534. Break spring 542 is disposed between contact mechanism 506 and cover (not shown). Axial member 544 may be provided to orient contact mechanism 506 with respect to latch block 538, or break spring 542 with respect to contact mechanism 506. When solenoid 52 is energized, break spring 542 forces contact mechanism 506 downward to break the contacts. It will be apparent to those of ordinary skill in the pertinent art that modifications and variations can be made to the shape of flexible contact mechanisms 506, 516 of the present invention. For example, the shape of the contact mechanism 506, 516 may be circular, triangular, Y-shaped, or any suitable shape that promotes secure contact during normal operating conditions. For example, FIG. 12 shows a Y-shaped contact mechanism 780. In this embodiment, mechanism includes contacts 782 disposed on arms 796. As in FIG. 6, break spring 790 is disposed between contact mechanism 780 and cover (not shown). When solenoid 52 is energized, break spring 790 forces contact mechanism downward to break the contacts.

Figure 13:
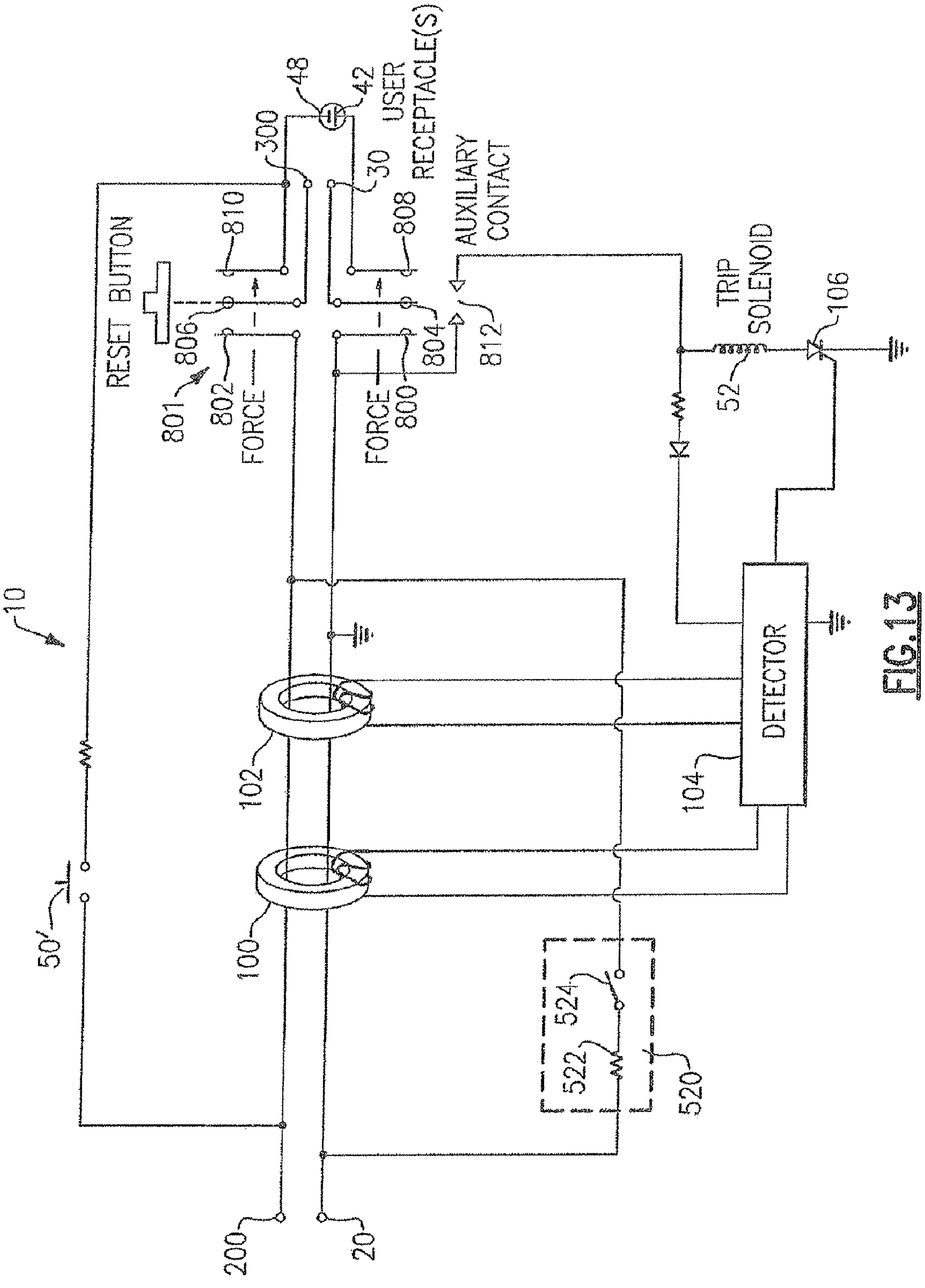
FIG. 13 is a block diagram of an electrical wiring device in accordance with a third embodiment of the present invention.

As embodied herein, and depicted in FIG. 13, a block diagram of an electrical wiring device in accordance with another embodiment of the present invention is disclosed. While device 10 is depicted as a GFCI, those skilled in the art will recognize that device 10 may include an AFCI or other such protective device. This design is referred to as a sandwiched cantilever design. This embodiment also may include either one of the protective circuits shown in FIG. 5 or FIG. 6. This embodiment is also a four-pole design that is configured to deny power to the receptacles when the device is miswired and in a tripped state. Line neutral terminal 20 is coupled moveable neutral contact 800. Receptacle neutral contact 42 is coupled to fixed neutral contact 808. Neutral load terminal 30 is coupled to moveable load neutral contact 804. Moveable load contact 804 is disposed between contact 800 and contact 808. When device 10 is reset, contacts 800, 804, and 808 are sandwiched together. The "hot side" includes analogous contacts 802, 806, and 810. The tripping mechanism includes ground fault sensor 100 and grounded neutral sensor 102 coupled to detector 104. Detector 104 is coupled to silicon controlled rectifier (SCR) 106. SCR 106 is turned on in response to a detection signal from detector 104. SCR 106, in turn, signals trip solenoid 52 to release the sandwiched cantilevers.

The stacked, or sandwiched, cantilever design described herein (FIGS. 13-22) is advantageous in that it only requires two fixed contacts. Other four-pole designs require four fixed contacts making such designs more costly. Ordinary four pole structures require four break forces to open the four contacts and four make forces to close the four contacts. One break force, as those skilled in the art will recognize, is between 50 g-100 g.

Figure 14:
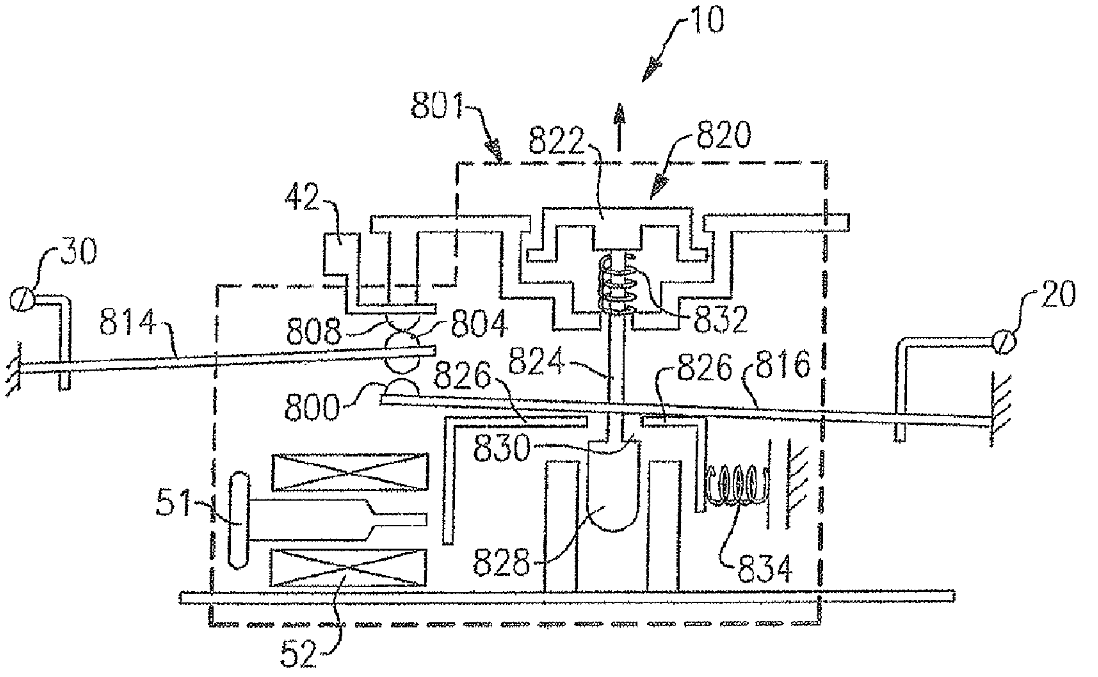
FIG. 14 is a detail view of the electrical wiring device depicted in FIG. 13.

The embodiment of FIG. 14 also requires four break forces to open the four contacts but only two make forces (on the outer cantilevers) to close the four contacts. As those of ordinary skill in the art will appreciate, a make force is typically within the range between 100 g-150 g. Therefore the sandwiched cantilever is more efficient, i.e., the contact mechanism requires less force to close the contacts during a reset operation. Accordingly, the force applied to the mechanism is reduced, resulting in less wear and tear on the trip mechanism.Of course, this extends the operational life of the mechanism.Further, the reduced force means that the trip solenoid does not have to work as hard to trip the trip mechanism. This also suggests that the solenoid may be smaller. In short, the stacked or sandwiched cantilever, depending on the terminology employed, results in a smaller device size, and cost savings.

Referring to FIG. 14, a cross-sectional view of the electrical wiring device 10 depicted in FIG. 13 is disclosed. FIG. 14 shows the device in a reset state, with the contacts closed. As described above, device 10 is coupled to the AC power source by way of neutral line terminal 20 and hot line terminal 200. As shown neutral line terminal 20 is connected to cantilever 816 by way of conductive wire 21. On the hot side, hot line terminal 200 is connected to the hot line cantilever by a conductive wire (not shown). Device 10 may be coupled to a downstream branch circuit by way of neutral load (feed-through) terminal 30 and hot load (feed-through) terminal 300. Branch circuits often include daisy-chained receptacles or switches. Device 10 includes one or more plug receptacles configured to receive plug blades electrically connected to a portable load by an electrical cord. The plug receptacles include neutral receptacle terminal 42 and hot receptacle terminal 48. For clarity of illustration, FIG. 14 only shows the neutral side of device 10.

Accordingly, neutral line terminal 20 is connected to neutral line cantilever beam 816. Cantilever beam 816 includes moveable neutral line contact 800 disposed at the end of the cantilever beam 816. Neutral load terminal 30 is connected to neutral load cantilever 814. Load cantilever beam 814 includes a double sided contact 804 disposed at the end of cantilever beam 814. Neutral receptacle terminal 42 is electrically connected to fixed terminal 808. Thus, in the reset (closed) state, neutral receptacle terminal 42 is electrically connected to a stationary (or fixed) contact 808. When device 10 is in the reset state, fixed contact 808 makes electrical connection to a neutral line contact 800 by way of a double-sided neutral load contact 804. Accordingly, electrical continuity is established through line terminal 20, cantilever 816, contacts 800, 804, 808, cantilever beam 814 and finally, load terminal 30.

The relationship between the contact arrangement described above, the trip mechanism 801, and the reset mechanism 820 is as follows. The trip mechanism includes solenoid 52, which as described above, is connected to SCR 106. In response to the signal from SCR 106, solenoid 52 generates a magnetic field that causes armature 51 to move laterally. The reset mechanism includes reset button 822 connected to reset pin 824. A spring 832 is disposed around reset pin 824. Reset pin 824 includes a plunger 828 which is inserted into a hole in latch 826 while in the closed state. In a tripped state, the reset pin 822, reset pin 824, as well as plunger 828, extends outwardly from the cover. The latch 826 cannot be lifted upward by plunger 828 because the plunger 828 does not extend into the latch hole and latching escapement 830 cannot engage latch 826.

When device 10 is reset, reset button 822 is depressed, directing the reset stem 824 and plunger 828 into a hole in latch 826. When the plunger 828 is fully extended through the hole, latch 826 moves laterally to catch escapement 830 by virtue of the biasing force provided by spring 834. The force associated with the energy stored in compressed spring 832 is greater than the tripping forces associated with the trip mechanism. Accordingly, spring 832 lifts latch 826 and cantilever 816 in an upward direction. When cantilever 816 moves upward, contact 800 engages contact 804, causing cantilever 814 to move upwardly until contact 804 engages fixed contact 808. In a reset state, button 822 is depressed and flush with the cover of device 10. As a result, spring 832 is compressed between button 822 and a portion of the cover.

In one embodiment of the present invention, the reset button assembly, i.e., reset button 822, reset pin 824, and plunger 828 are formed from a non-metallic material. In an alternate embodiment, the reset button 822, reset pin 824, and plunger 828 may be formed as an integral unit. In related art devices, the reset pin is formed of a metallic material that is cast or machined, in the desired shape and form factor, depending on the reset/latch interface. The non-metallic reset assembly of the instant embodiment may be comprised of a resinous plastic material, a nylon material, polycarbonate material, or a composite material comprising plastic and a filler material. The filler material may be selected from a group that includes glass, mineral reinforced nylon filler, perfluoropolyether (PFPE), polytetrafluoroethylene (PTFE), silicone, molybdenum disulfide, graphite, aramid fiber, carbon fiber, or metallic filler. While the reference numbers used in this paragraph follow the convention of FIG. 14, those of ordinary skill in the art will appreciate that the non-metallic reset assembly described herein is equally applicable to each and every embodiment of the present invention described in the patent disclosure.

Figure 15:
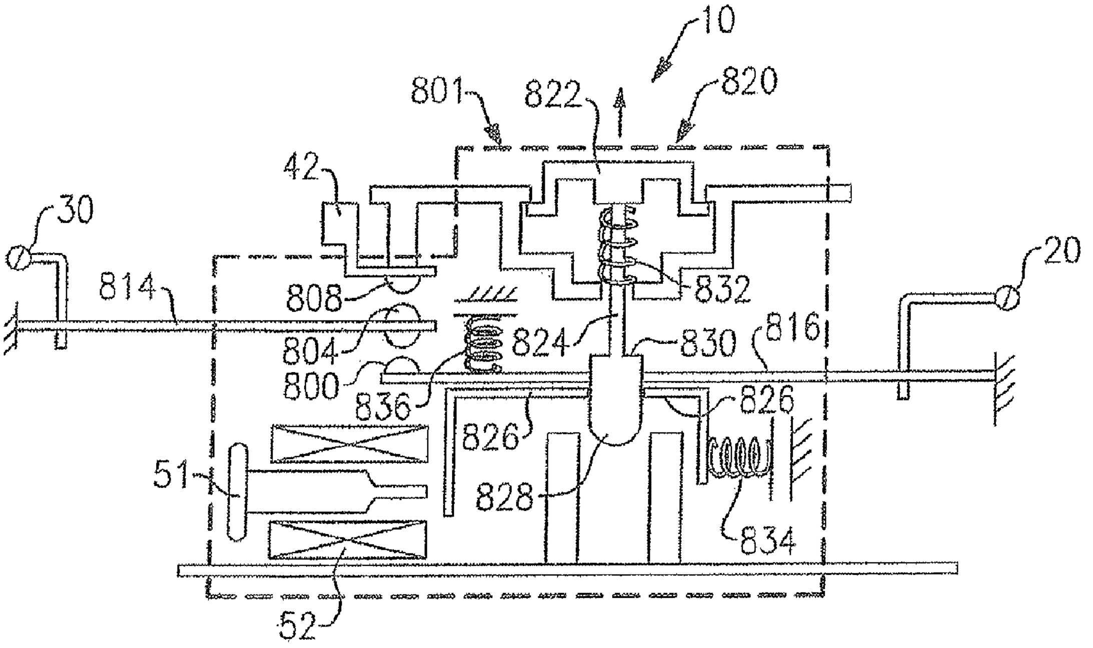
FIG. 15 is a detail view of the electrical wiring device depicted in FIG. 13.

FIG. 15 is a detail view of the electrical wiring device 10 in a tripped state. As noted above in the discussion of FIG. 13, when a fault or simulated fault is sensed and detected, the control line of SCR 106 is signaled. In response, SCR 106 triggers solenoid 52. When solenoid 52 is activated, the resultant magnetic field directs armature 51 against latch member 826 and overcomes the biasing force of spring 834. When latch member 826 moves laterally, the interference between latch 826 and escapement 830 is removed, releasing reset pin 824 from latch 826. Reset button 822 and reset pin 824 move upward, while cantilever 816 and cantilever 814 move in the opposite direction by virtue of their inherent self-bias. As a result, contacts 808, 804, and 800 separate and the device 10 is tripped.

In an alternate embodiment, a break spring 836 is coupled to cantilever 816. Break spring 836 urges cantilever 816 downward when it is no longer restrained by spring 832. In yet another alternate embodiment, break spring 836 assists the self-bias of cantilever 816 during the transition to the tripped state. Similarly, cantilever 814 may also be provided with a break spring. Accordingly, the cantilever structures employed in the sandwiched cantilever design of the present invention may be formed with a spring bias or may be formed without such bias.

Those of ordinary skill in the art will recognize that when a spring bias is induced in a cantilever part, the form is somewhat critical, since a deviation from the form may result in a part that does not conform to nominal spring bias of the part. Ordinary four pole structures may typically have four cantilevers whose forms are all critical. When break springs are used in the sandwiched cantilever design, the forms of cantilevers are not critical precisely because they are not preloaded. This results in improved circuit interrupter reliability and lower cost manufacturing processes.

Further, it will be apparent to those of ordinary skill in the art that while the fixed contact 808 as described herein is coupled to the face terminal, it may be coupled to either the feed-thru (load) terminal 30, or the line terminal 20.

Figure 16:
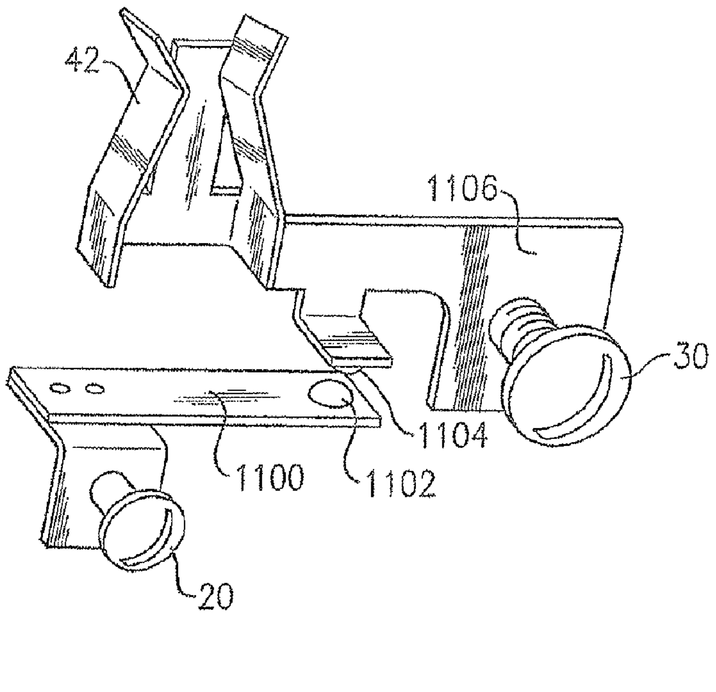
FIG. 16 is a detail view of a trip mechanism in accordance with an alternate embodiment of the present invention.

As embodied herein and depicted in FIG. 16, a detail view of a trip mechanism in accordance with an alternate embodiment of the present invention is disclosed. The trip mechanism shown in FIG. 14 and FIG. 15 has an interrupting contact structure that includes two cantilever beams. In the alternative construction, one of the dual beam structures is replaced by a single beam structure. A receptacle outlet has a plurality of receptacle terminals that are configured to mate with the attachment plug of a user attachable load. Those of ordinary skill in the art recognize that only one contact pair is needed to disconnect the load terminal from the receptacle terminal. In other words, the structure shown in FIG. 14 and FIG. 15 need only be placed in one of the conductive paths (i.e., either the hot path or the neutral path) to break the circuit and deny power to the receptacle outlet during a miswire condition. Thus, with the circuit broken in one of the conductive paths, user attachable load would not obtain the AC power needed to operate, and the user would be motivated to remedy the miswire condition before a fault condition is likely to arise. After the miswiring condition has been corrected and device 10 is in normal service, a fault condition may arise in any of the conductors connected to a load terminal. Structures such as shown in FIG. 16 can be included in other conductors for disconnecting the line terminals from load terminals, in order to protect the user after device 10 has been properly wired and is in normal usage.

Referring again to FIG. 16, the single beam structure is incorporated into, or is an extension of, the neutral line terminal 20. In particular, line terminal 20 is connected to cantilever beam 1100. Cantilever beam 1100 includes contact 1102 disposed thereon. Contact 1102 is configured to engage with fixed contact 1104. Fixed contact 1104 is disposed on unitary member 1106. Unitary member 1106 includes receptacle terminal 42 at one end and load terminal 30 at the other end. Accordingly, load terminal 30 and receptacle terminal 42 are permanently coupled electrically. Those of ordinary skill in the art will recognize that any suitable structure may be employed herein. For example, the simplified structure depicted in FIG. 16 may be replaced by any number of simplified structures known to those skilled in the art, such as a bus bar structure.

Terminals 20, 30 and 42 are coupled electrically in the reset state by cantilever 1100, which has a movable contact 1102 that engages fixed contact 1104. On the other hand, when device 10 is tripped, the electrical connection between contacts 1102 and 1104 is broken by moving the cantilever 1100. As such, load terminal 30 and receptacle terminal 42 are electrically disconnected from the line terminal 20. Alternatively, the single beam structure may be included for coupling and decoupling hot terminals 300 and 48 from hot line terminal 200.

For multi-phase systems in which there is more than one hot conductor from the AC power source, any mix and match combination of dual cantilever structures such as shown in FIGS. 14 and 15 and simplified interrupting structures, as exemplified in FIG. 16, can be included in trip mechanism 801. In a single phase system there is certainty about which of the AC power source conductors is the hot conductor. Accordingly, in one embodiment of the present invention, the dual cantilever structure shown in FIGS. 14 and 15 is implemented in the hot conductive path. However, the dual cantilever interrupting structure may be replaced in the neutral conductive path by the structure shown in FIG. 16. Furthermore, in another embodiment, the neutral line, neutral receptacle and neutral downstream terminals may be permanently joined together. Similarly, other embodiments may be implemented that mix and match combinations of structures that electrically disconnect downstream and receptacle load terminals, with simplified structures that do not electrically disconnect downstream and receptacle load terminals.

Figure 17:
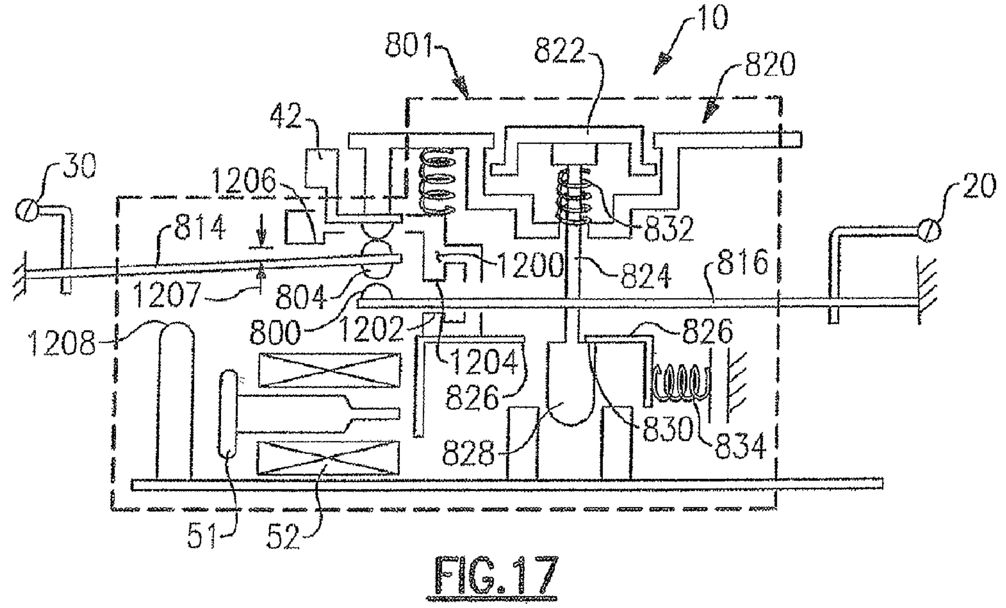
FIG. 17 is a detail view of a weld-breaking mechanism in accordance with yet another embodiment of the present invention.

As embodied herein and depicted in FIG. 17, a detail view of a weld-breaking mechanism in accordance with yet another embodiment of the present invention is disclosed. Although the interrupting contacts are intended to trip freely when a magnetic force develops in solenoid 52 to operate the trip mechanism 801, the contacts may be "welded" together and remain closed due to exposure to excessive current, corrosion, or the like, such that the contact opening forces, exerted by the cantilevers and break springs, fail to open the contacts. The present invention includes a weld breaker mechanism configured to open welded contacts. As noted above, the weld-breaking mechanism assists the break spring(s) and/or the self-bias force(s) to overcome a welded condition that binds one or more pair of contacts together. A welded condition may be a result of corrosion, dust or foreign accumulations, cold bonding, metallurgical bonding, or electrically-induced bonding.

FIG. 17 shows trip mechanism 801 in the reset state. Trip mechanism 801 includes all of the components included in the embodiment shown in FIG. 14. However, FIG. 17 also includes a latch block 1200 that is disposed between latch 826 and cantilever 816. The trip mechanism operates as before with the following enhancements. When device 10 is reset, make-spring 832 exerts an upward force on latch 826. In turn, latch 826 directs surface 1200 of latch block 1200 upward. Surface 1200 also applies a force to deflect cantilever 816 upward. Cantilever 816 causes contact 800 to engage contact 804. As cantilever 816 continues to deflect upward, cantilever 814 is also deflected until contact 804 touches fixed contact 808 to thereby complete the reset operation. Accordingly, electrical continuity is established between neutral terminals 20, 30 and 42, and electrical continuity is also established between hot terminals 200, 300 and 48.

Figure 18:
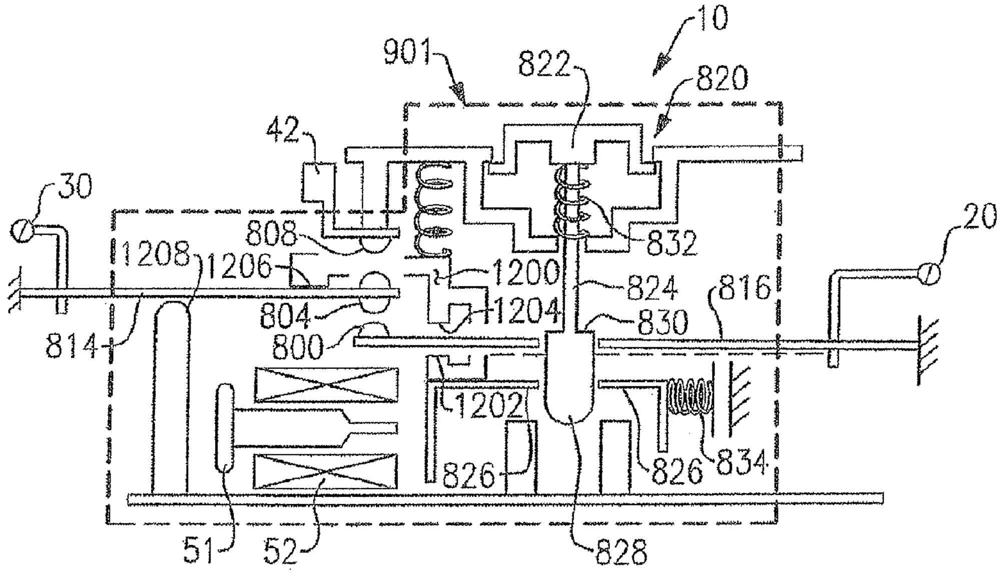
FIG. 18 is an alternate detail view of a weld-breaking mechanism shown in FIG. 17.

Referring to FIG. 18, a detail view of the weld breaking mechanism in the tripped state is shown. As noted previously, when device 10 is tripped, SCR 106 triggers solenoid 52. In response, solenoid 52 generates a magnetic field causing armature 51 to move laterally toward latch mechanism 826. Armature 51 causes latch 826 to move against the biasing force of spring 834. As before, the interference between latch 826 and escapement 830 is removed, freeing reset button 822, reset pin 824 and escapement 830 to move upward. The force exerted by make-spring 832 is no longer communicated through surface 1202 to cantilever 816. The self-bias in cantilever 814 and cantilever 816 tends to drive the cantilevers downward to open the contacts. However, contact pair 808/804 and/or 804/800 may remain in the closed position because of the occurrence of one of the weld conditions previously described.

Latch block 1200 includes weld-breaker arm 1206. Weld breaker arm 1206 is configured to break any weld that may exist between contact pair 808/804. Latch block 1200 also includes weld breaker arm 1204. Weld breaker arm 1204 is configured to break any weld that may exist between contact pair 804/800. During the tripping operation, latch block 1200 is configured to accelerate in a downward motion. With regard to contact pair 808/804, the motion of latch block 1200 causes surface 1206 to strike cantilever 814. The striking motion tends to break any weld that may have formed between contact 808 and contact 804. A similar action takes place in separating contact pair 804/800. When device 10 is tripped, latch block 1200 accelerates downwardly, causing weld breaker arm 1204 to strike cantilever 816. The striking motion is designed to break any weld that may have formed between contact 804 and contact 800.

The weld breaking mechanism also includes a stop member 1208. Stop 1208 restricts the downward movement of cantilever 814 during the tripping operation. Stop 1208 is configured to assist weld breaker arm 1204 in breaking any weld that may exist between contact pair 804/800. When weld breaker arm 1204 is moving in a downward motion, cantilever 814 is also deflecting in a downward direction. However, stop 1208 limits the downward deflection of a portion of cantilever 814. Essentially, stop 1208 applies a force in an upward direction while arm 1206 is applying a force in a downward direction. The combination of these forces tends to break any weld that may have formed between contact pair 804/800.

The present invention may be implemented with either weld breaker arm 1204, 1206, or both. Further, if both weld breakers 1204 and 1206 are provided, the striking action may be sequenced such that one weld breaker arm strikes its respective cantilever before the other arm strikes its respective cantilever. At any rate, once any welds that may exist have been broken and all contact pairs of trip mechanism 801 are open, trip mechanism 801 is in the tripped state.

Although the weld-breaking feature has been described with respect to a dual cantilever structure, a weld breaker can be configured for a single cantilever structure such as depicted in FIG. 16. Those of ordinary skill in the art will recognize that the weld breaker apparatus described herein may be implemented within any type of interrupting contact mechanism.

Figure 19:
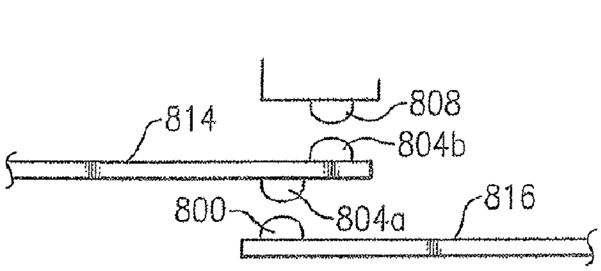
FIG. 19 is a detail view of a staggered contact arrangement in accordance with an alternate embodiment of the present invention.

FIG. 19 is a detail view of a staggered contact arrangement in accordance with an alternate embodiment of the present invention. In this embodiment, load cantilever includes staggered contact assembly 804*a*, 804*b*. Upper contact 804*b* is aligned with fixed contact 808. Fixed contact 808, of course, is in electrical continuity with the neutral face contact. Lower contact 804*a* is aligned with line contact 800. The staggered contact arrangement provides several advantages. Because the contacts are staggered, no special manufacturing techniques need be employed. The may be implemented using rivets, for example. Accordingly, the staggered contact arrangement results in reduced complexity and cost.

Figure 20:
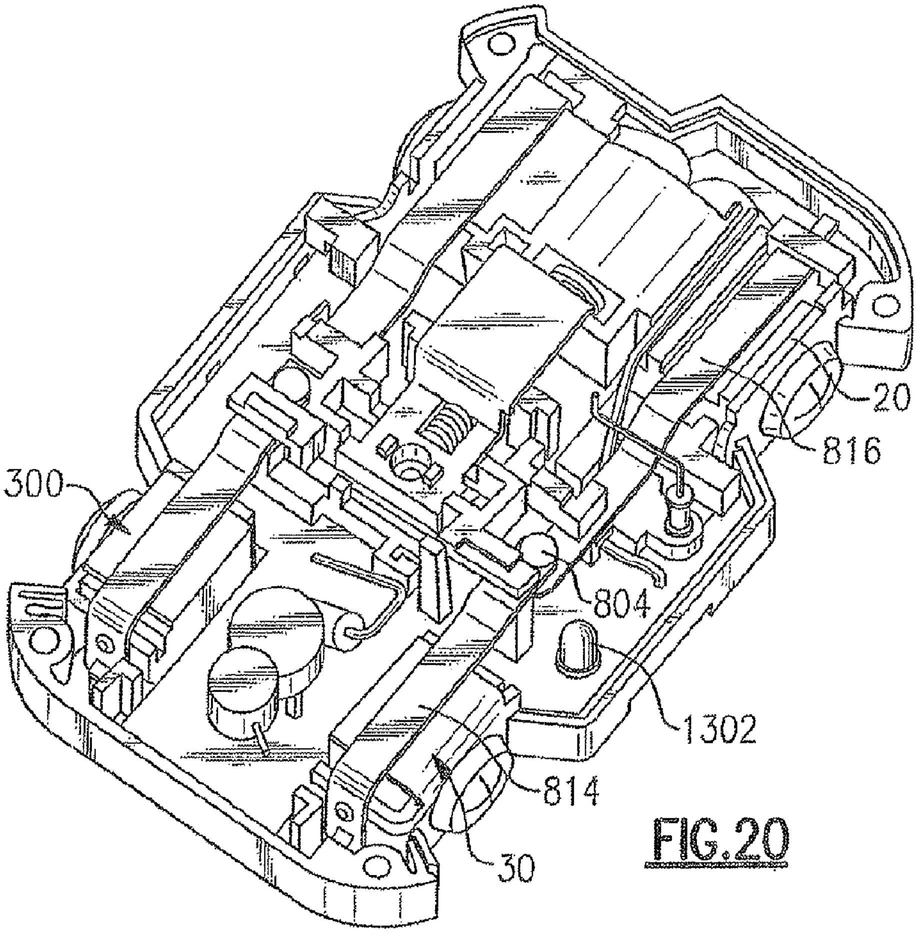
FIG. 20 is perspective view of the mechanical design of the electrical wiring device depicted in FIG. 14.

Referring to FIG. 20, a perspective view of the mechanical design of the electrical wiring device depicted in FIG. 14 is shown. In particular, FIG. 19 illustrates the layout of the cantilever structures relative to the device "footprint." Ordinary four pole structures arrange the cantilevers alongside each other. The arrangement shown in FIG. 19 arranges the cantilevers vertically. The vertical pair (814, 816) arrangement is economical when it comes to the device width. As such, space is created for a light pipe for indicators 1302 and 1304 (not shown). Accordingly, the sandwiched cantilever design accommodates a trip indicator and/or pilot indicator.

Figure 21:
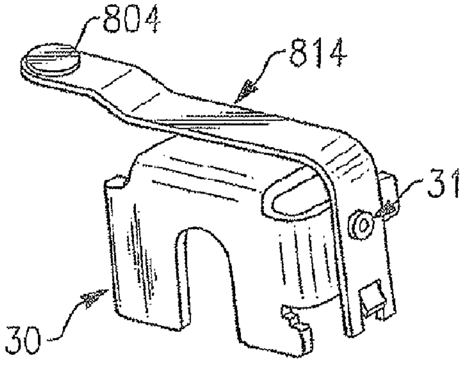
FIG. 21 is a detail view of the load terminal depicted in FIG. 19.

FIG. 21 is a detail view of the load terminal depicted in FIG. 19. Cantilever 814 is shaped to fit the form factor of terminal 30 (300) and coupled thereto by spot weld or rivet assembly 31. In an alternate embodiment, the load terminal may be comprised of a single piece of conductive material and formed into the configuration depicted in FIG. 21. The line terminals are configured in a similar fashion. As a result, the cantilever pair (814, 816) forms an efficient current carrying path.

Figure 22:
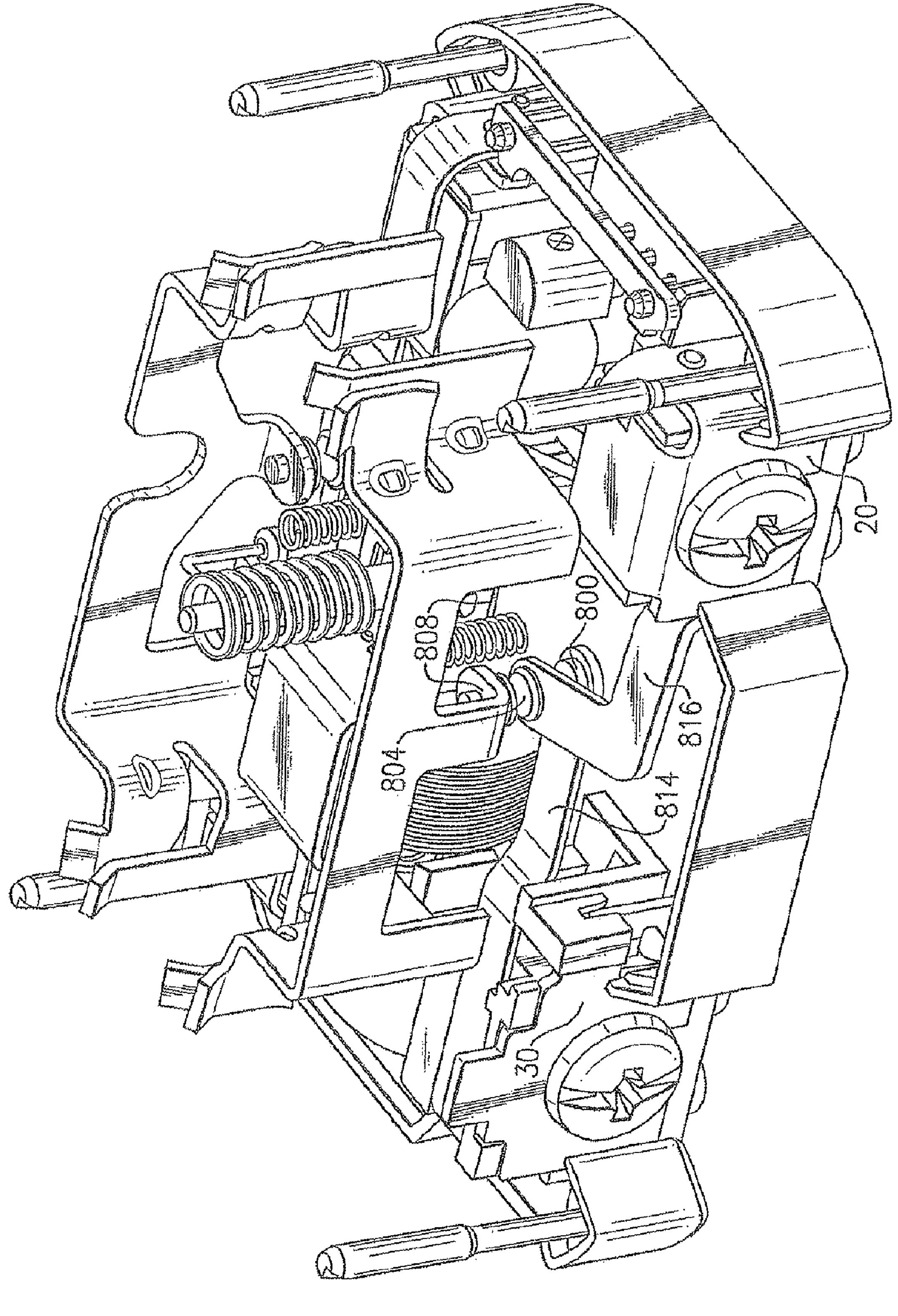
FIG. 22 is a perspective view of an electrical wiring device in accordance with a fourth embodiment of the present invention.

FIG. 22 is a perspective view of an electrical wiring device in accordance with a fourth embodiment of the present invention. In this embodiment the cantilevers may be oriented in any angular relationship one to the other, for example, at right angles as depicted in the Figure. As shown, line cantilever 816 is L-shaped to accommodate components disposed within device 10. Load cantilever 814 is similar to the cantilever structures previously shown. Those skilled in the art will recognize that the arrangement may be reversed, with the load cantilever being L-shaped.

Figure 23:
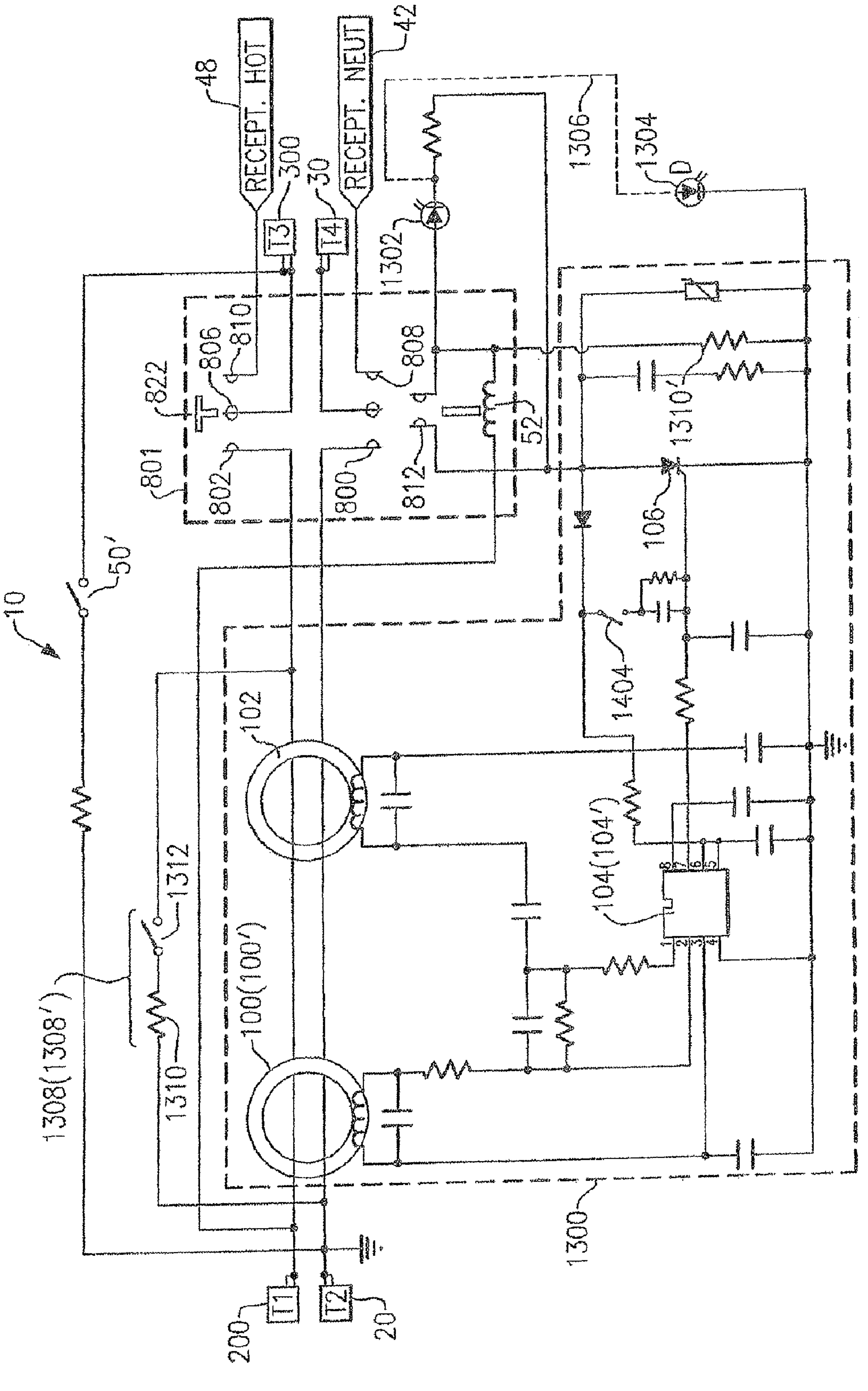
FIG. 23 is a schematic of the electrical wiring devices in accordance with the present invention.

FIG. 23 is a schematic of the electrical wiring device depicted in FIG. 13. However, the schematic of FIG. 19 is applicable to all of the embodiments disclosed herein. The protective device of the present invention is configured to sense and detect fault conditions that may occur in the electrical distribution system, as well as simulated fault conditions, that are either manually or automatically generated. Fault conditions may include arc faults, ground faults, or both.

Referring to FIG. 23, device 10 includes three main portions: a detection circuit 1300, a miswire detection circuit 1308, and tripping mechanism 801. Detection circuit 1300 includes differential transformer 100. Transformer 100 is configured to sense a difference in the current between the hot and neutral conductors connected respectively to terminals 20 and 200. The difference current is generated by a fault current to ground when a person is contacting ground at the same time as an inadvertently exposed hot conductor connected to terminals 300 or 48 (the current through the person flows through the hot conductor but does not return through the neutral conductor.) The sensed signal is detected by detector 104 which can include any of a variety of integrated detection circuits, such as the RV 4141 manufactured by Fairchild Semiconductor Corporation. The detected signal turns on SCR 106 to actuate solenoid 52 to trip the trip mechanism 801 as has been described.

In one embodiment of the present invention, trip mechanism 801 includes an auxiliary switch 812. Auxiliary switch contacts 812 open when trip mechanism 801 is in the tripped position. If SCR 106 has reached end-of-life and is permanently ON, auxiliary switch 812 assures that solenoid 52 is not permanently connected to a source of current. Otherwise, solenoid 52 may become thermally damaged by continuous exposure to the current, and be unable to operate trip mechanism 801 to interrupt a fault condition. If SCR 106 has reached end of life, and reset button 822 is depressed to close the various contacts associated with trip mechanism 801, auxiliary switch 812 closes. In response thereto, solenoid 52 will immediately trip the mechanism again. Thus, auxiliary contacts 812 ensure that trip mechanism 801 will not remain reset when an end-of-life condition has been reached. Accordingly, load terminals 30 and 300, and receptacle terminals 42 and 48 cannot be permanently connected to line terminals 200 and 20 when SCR 106 has reached end of life, sometimes referred to as safe failure of device 10.

The present invention also includes a trip indicator. Indicator 1302 is coupled to auxiliary switch 812. When trip mechanism 801 is in the tripped state, indicator 1302 is illuminated. Indicator 1302 is thus used to indicate to the user that device 10 is tripped. Accordingly, the user realizes that device 10 is the cause of the power interruption in the circuit. Indicator 1302 furthermore demonstrates to the user if auxiliary switch 812 is able to close and open. Those of ordinary skill in the art will recognize that indicator 1302 may be implemented as a lamp, an annunciator, or both. In the ON state, indicator 1302 may transmit continuously or intermittently. Device 10 also may include a "power-on" indicator 1304. Dashed line 1306 between indicator 1304 and DC ground represents the power-on indicator circuit. Indicator 1304 is configured to demonstrate that power is being delivered to the load terminals 30 and 300, and receptacle terminals 42 and 48. Those of ordinary skill in the art will recognize that indicator 1304 may be implemented as a lamp, an annunciator, or both.

Miswire detection circuit 1308 includes a miswire resistor 1310 in series with an optional switch 1312. Switch 1312, if provided, is open during manufacturing assembly to facilitate electrical testing of device 10. After device 10 has been tested, switch 1312 is closed during assembly, before device 10 is in the commercial stream. When device 10 is properly wired, i.e., the source of power of the electrical distribution system is connected to line terminals 20 and 200, a constant current flows through resistor 1310. Resistor 1310 is configured to open circuit when the electrical current has flowed for a predetermined time. In the preferred embodiment the predetermined time is about 1 to 5 seconds. After resistor 1310 has open circuited, reset button 822 can be depressed, enabling trip mechanism 801 to enter the reset state. Optionally, a fuse or an air gap device (not shown) can be connected in series with resistor 1310 whereby resistor 1310 remains closed and the fuse or air gap device is responsible for open circuiting within the predetermined time.

If device 10 is miswired, the current fails to flow through resistor 1310 in the manner described above and resistor 1310 fails to open-circuit. Instead, the current through resistor 1310 is sensed by differential transformer 100 as a differential current. Detector 104 interprets the differential current as a fault condition. Accordingly, detector 104 signals the control input to SCR 106. SCR 106 is turned ON to thereby actuate solenoid 52. Solenoid 52 generates a magnetic field and mechanism 801 is tripped. Thus, the current flowing through resistor 1310 is interrupted before resistor 1310 open-circuits. The duration of the current flow through resistor 1310 is approximately the response time of device 10. In other words, the current flowing through resistor 1310 is interrupted in less than 0.1 seconds. As such, the duration of the current flow is too brief to cause opening of resistor 1310. If reset button 822 is depressed to reset trip mechanism 801, current starts to flow again through resistor 1310. However, the current is again detected and device 10 is immediately tripped. Accordingly, device 10 will repeatedly trip when the source of power of the power distribution system is miswired to the load terminals.

Accordingly, the present invention is configured such that contact pair 808/804 and contact pair 804/800 are open (tripped) when device 10 is miswired. The tripped state prevents the AC power source, having been miswired to the load terminals (30,300), from permanently providing power to the receptacle terminals even though a fault condition in the user attachable load might be present. Although the miswire circuit has been described with respect to a resistor 1310 that opens when the device has been properly wired, any number of fusible links familiar to those skilled in the art may be employed. The fusible link may open (clear) due to a predetermined fusing characteristic. The fusible link may be configured to open when a nearby resistance heats the fuse link to a predetermined temperature.

Those of ordinary skill in the art will recognize that there are other miswire protection methods configured to permanently block the ability to reset device 10 until device 10 has been properly wired. For example, resistor 1310 may provide a physical block that prevents interference between escapement 830 and latch 826. When device 10 is properly wired, resistor 1310 conducts a steady current which causes resistor 1310 to heat sufficiently to melt solder on its solder pads. A spring bias (not shown) may be implemented to urge resistor 1310 to dislodge. Dislodged resistor 1310, no longer providing a physical block, permits reset button 822 to establish the interference between escapement 830 and 826. Accordingly, until the device is wired properly, resistor 1310 will not be dislodged and device 10 cannot be reset.

An AFCI or other protective device may be protected from miswiring by including trip mechanism 801 and a miswiring circuit 1308'. Sensor 100' and detector 104' are configured to sense and detect the particular fault condition(s) being protected. The miswire resistor may be configured to generate a simulated fault signal. As described above, the miswire resistor clears when device 10 is properly wired. As such, the simulated fault condition is likewise cleared, permitting the trip mechanism 801 to reset. Alternatively, the miswire resistor may be configured to generate a trip signal that does not represent a fault condition. The trip signal similarly interrupts when device 10 is properly wired, permitting the trip mechanism 801 to reset. For example, miswire resistor 1310' generates a trip signal to turn SCR 106 ON. Solenoid 52 is activated until device 10 is properly wired, whereupon resistor 1310' is cleared to create an open circuit.

Figure 24:
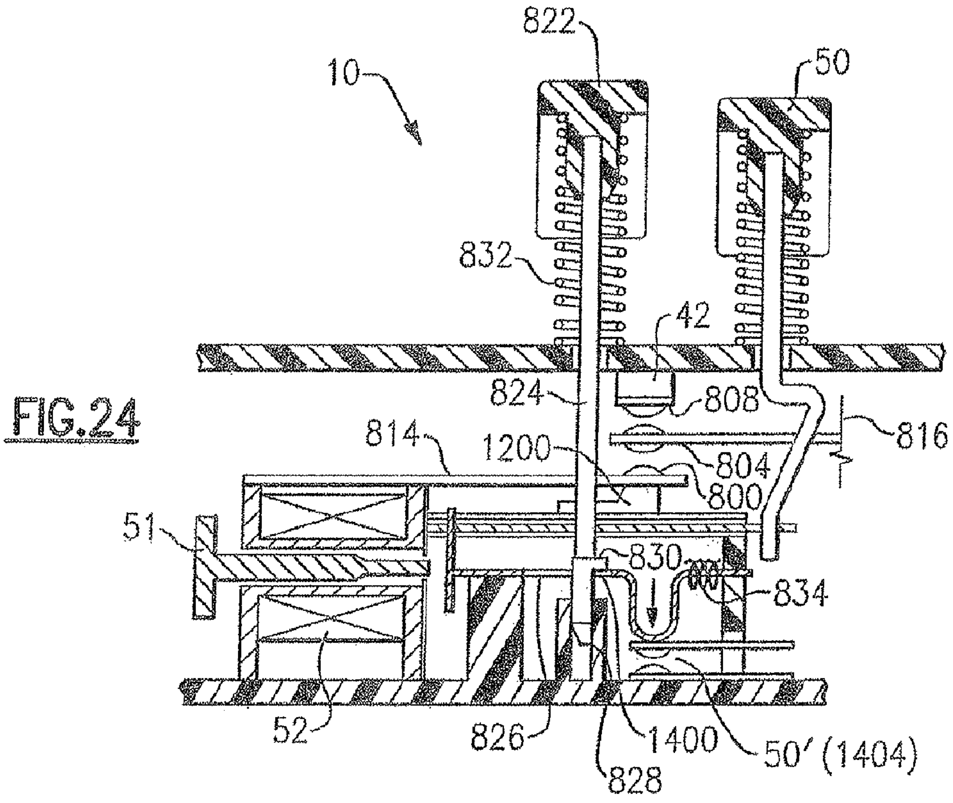
FIG. 24 is a detail view of a reset lock-out mechanism.

As embodied herein and depicted in FIGS. 24-27, a detail view of a reset lock-out mechanism is disclosed. Referring to FIG. 24, device 10 is in the tripped condition, i.e., latch 826 is not coupled to escapement 830. In order to accomplish reset, a downward force is applied to reset button 822. Shoulder 1400 on reset pin 824 bears downward on electrical test switch 50' to enable a test signal. The test signal simulates a fault condition in the electrical distribution system such as a ground fault condition or an arc fault condition.

Figure 25:
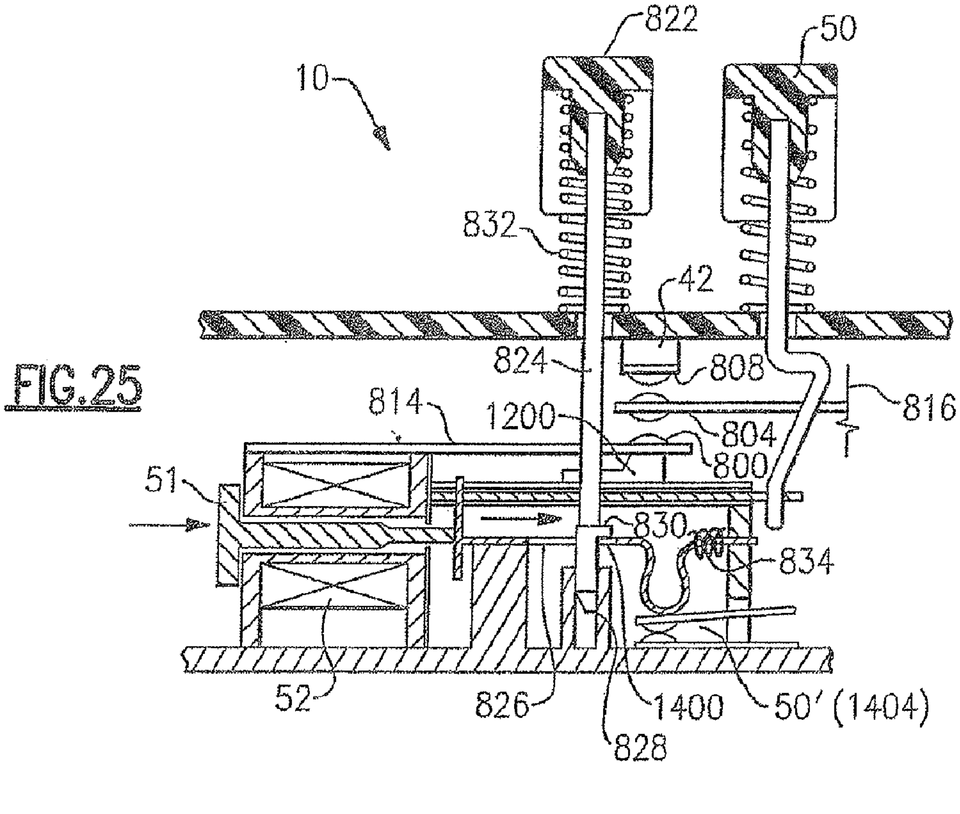
FIG. 25 is yet another detail view of a reset lock-out mechanism.

Referring to FIG. 25, the test signal is sensed and detected by detector 104. The detector provides a signal that causes solenoid 52 to activate armature 51. Armature 51 moves in the direction shown, permitting the hole 828 in latch 826 to become aligned with shoulder 1400. The downward force applied to reset button 822 causes shoulder 1400 to continue to move downward, since it is no longer restrained by shoulder 1400. Since shoulder 1400 is disposed beneath latch 826, it is no longer able to apply a downward force on latch 826 to close electrical switch 50'. Accordingly, switch 50' opens to thereby terminate the activation of solenoid 52. Armature 51 moves in the direction shown in response to the biasing force of spring 834.

Figure 26:
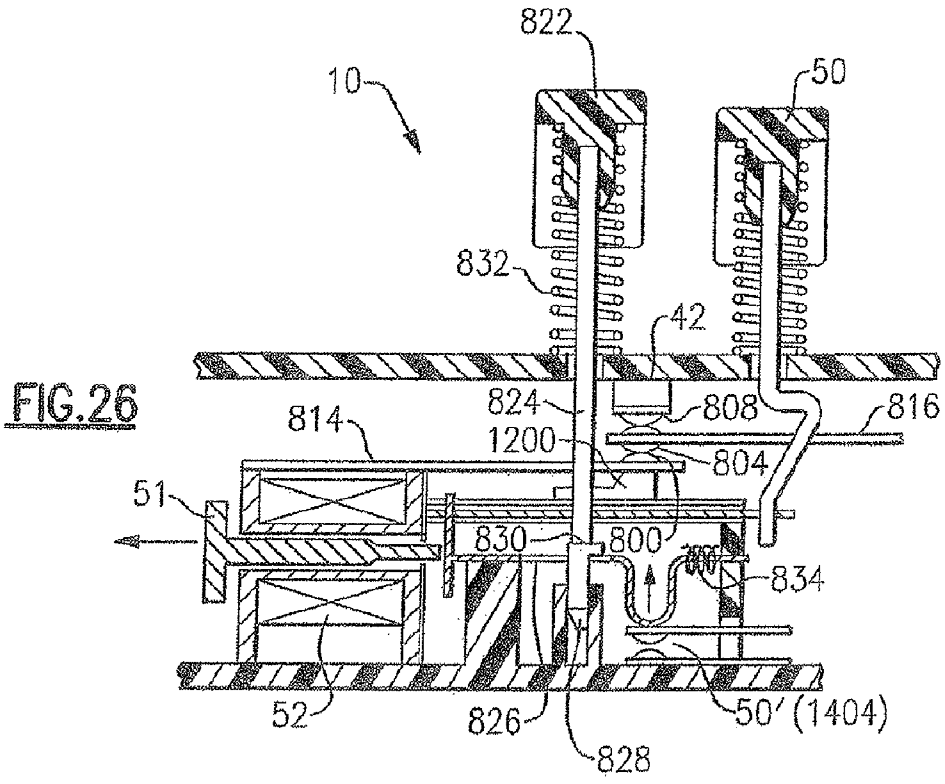
FIG. 26 is yet another detail view of a reset lock-out mechanism.

As depicted in FIG. 26, the trip mechanism is in a reset condition. In other words, any the downward force on reset button 822, as described above, is no longer present. Accordingly, latch 826 is seated on latching escapement 830.

Figure 27:
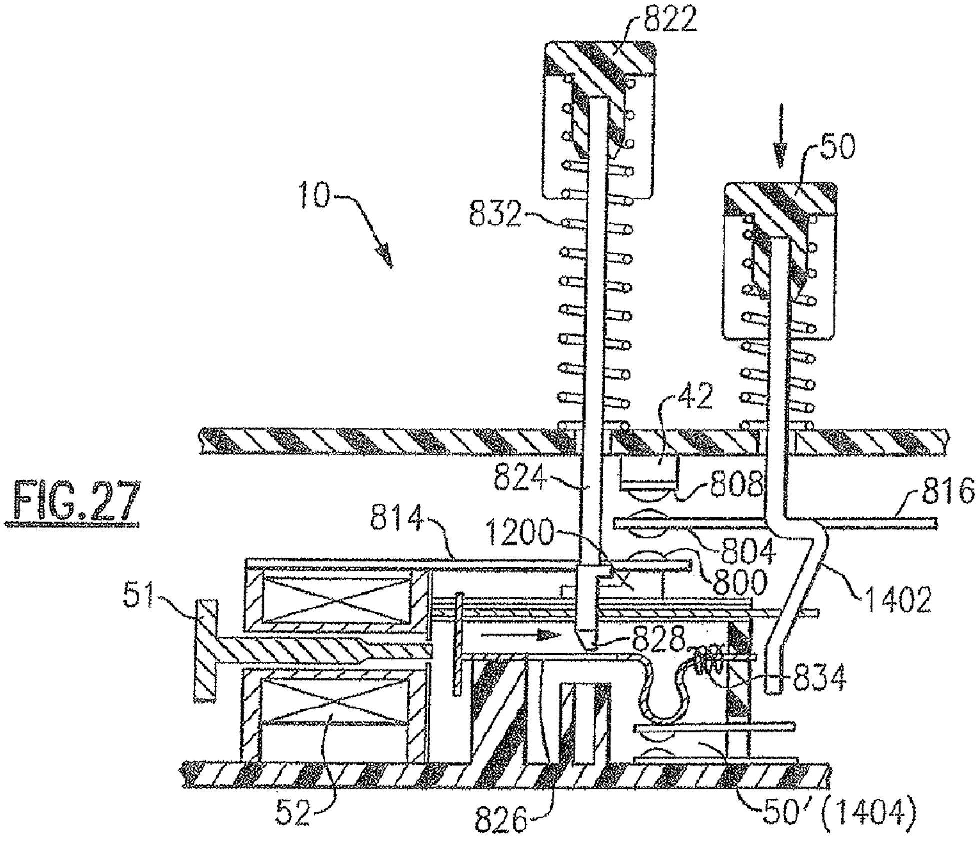
FIG. 27 is yet another detail view of a reset lock-out mechanism.

Referring to FIG. 27, a user accessible test button 50 is coupled to the trip mechanism. When test button 50 in FIG. 27 is depressed, device 10 is tripped by a mechanical linkage. In particular, when force is applied to test button 50, a mechanical linkage 1402 urges latch 826 in the direction shown. Latch 826 opposes the biasing force of spring 834. In response, hole 828 in latch 826 becomes aligned with escapement 830. The trip mechanism is tripped because latch 826 is no longer restrained by escapement 830.

As has been described, the device resets as a consequence of solenoid 52 activating armature 51. However, if the protective device 10 has reached an end-of-life condition, armature 51 is not activated. Therefore, the mechanical barrier is not removed and the mechanical bather (shoulder) prevents the trip mechanism from resetting. The physical barrier prevents the protective device from being resettable if there is an end-of-life condition.

Referring back to FIG. 23, the application of force to reset button 822 can close switch contacts 1404. When contacts 1404 are closed, a portion of the protective device is tested. A simulated fault condition test of the protective device may be provided by replacing mechanically linked test button 50 by an electrical test button 50'.

In an alternative embodiment, the simulated test signal may be derived from the line side of the interrupting contacts. This may be useful if the device is placed in the commercial stream with the interrupting contacts in the tripped position. Thus, when the AC power source is miswired to the feed-through terminals a test signal, that tests the entire device or a portion of the device, is not generated. Since the test signal is not generated, the mechanical barrier is not removed. As such, the mechanical barrier prevents the trip mechanism from being reset. The physical barrier also prevents the protective device from being reset in a miswired condition. If there is an open neutral condition, no test signal is generated. Accordingly, the device cannot be reset in an open-neutral condition either.

In yet another embodiment, a sandwiched cantilever mechanism may be incorporated in a protective device that is configured to lock-out power, or activate an indicator, or both, in response to an end-of-life condition. The indicator may be a visual and/or audible indicator. A visual indicator may be of various colors. The indicator may be steady or intermittent, e.g., a flashing red indicator. Reference is made to U.S. patent application Ser. No. 10/729,392 and U.S. patent application Ser. No. 10/729,396, which are incorporated herein by reference as though fully set forth in their entirety, for a more detailed explanation of a protective device with end-of-life lockout and indicator.

Figure 28:
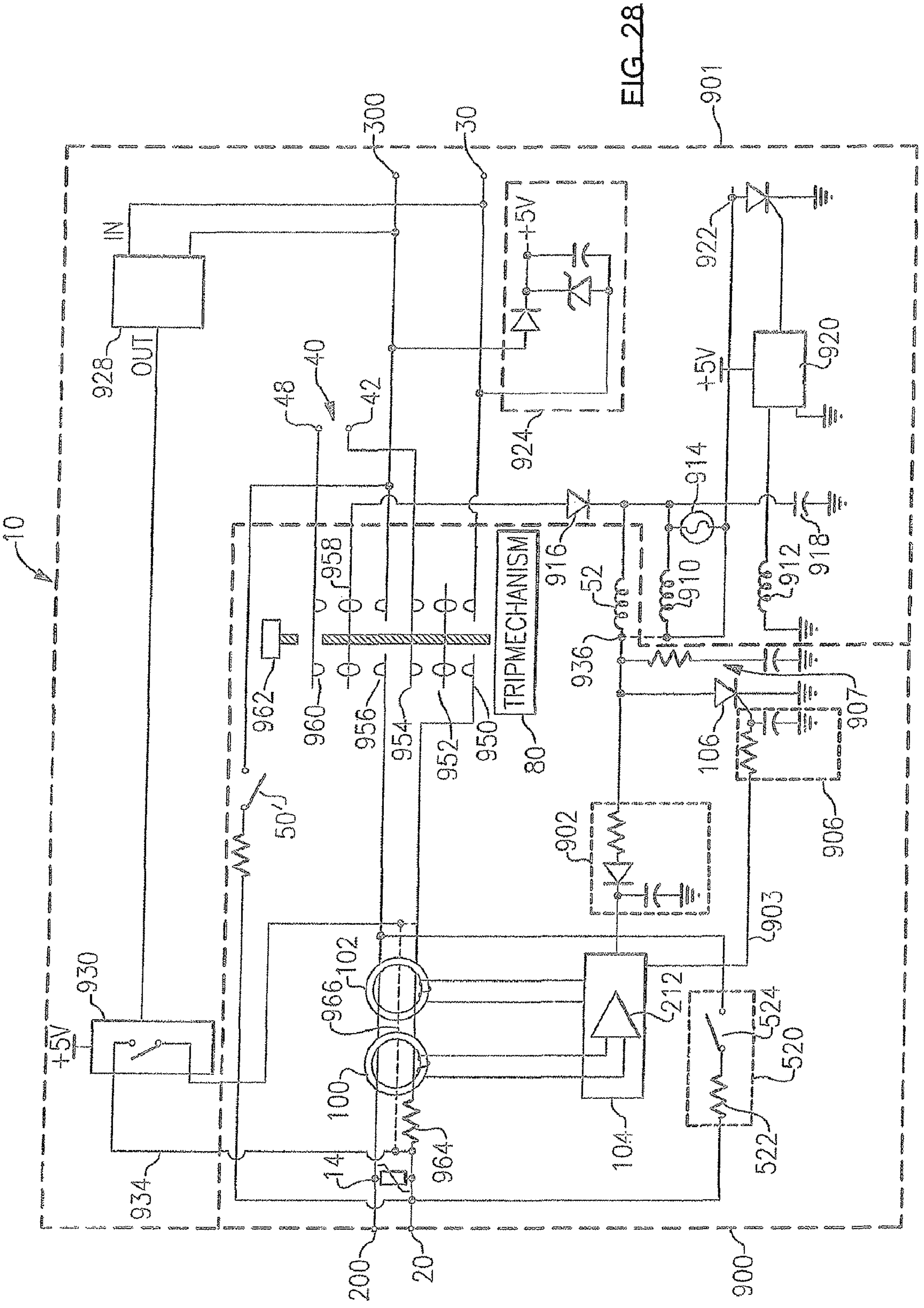
FIG. 28 is a schematic of the electrical wiring devices in accordance with another embodiment of the present invention.

As embodied herein and depicted in FIG. 28, a schematic of the electrical device in accordance with an embodiment of the present invention is disclosed. The circuit depicted in FIG. 28 is configured to introduce a simulated ground fault every period during the negative half cycle of the AC power source such that the trip SCR 24 cannot conduct. If the device fails to detect the simulated ground fault, i.e., there is an internal fault condition, the device denies power to the load terminals and the receptacle(s) on the next positive half cycle. The schematic depicts a GFCI circuit for purposes of illustration, but it applies to other protective devices by providing a simulated fault condition during negative half cycles appropriate to the device. Device 10 protects an electrical circuit connected to load terminals 30 (300), and receptacle(s) 40. Device 10 is connected to the AC power source by way of line-side neutral terminal 20 and line-side hot terminal 300. Device 10 includes two main parts, Ground Fault Interrupt (GFI) circuit 900 and checking circuit 901.

GFI circuit 900 includes a differential sensor 100 that is configured to sense a load-side ground fault when there is a difference in current between the hot and neutral conductors. Differential sensor 100 is connected to detector circuit 104, which processes the output of differential sensor 100. Detector 104 is connected to power supply circuit 902. Power supply 902 provides power to detector 104. Detector 104 is configured to detect a ground fault during both the positive half-cycle and the negative half cycle of the AC power. As such, detector circuit 104 provides an output signal on output line 903. The output line 903 is coupled to SCR 106 by way of filter circuit 904. When detector circuit 104 senses a fault, the voltage signal on output line 903 changes and SCR 106 is turned on. SCR 106 is only able to turn on during the positive half cycles of the AC power source. Further, snubber network 907 prevents SCR 106 from turning on due to spurious transient noise in the electrical circuit. When SCR 106 is turned on, solenoid 52 is activated. Solenoid 52, in turn, causes the trip mechanism 80 (528, 801) to release the four pole interrupter contacts, i.e. contacts 950, 952, 954, and contacts 956, 958, 960. When the interrupter contacts are released, the load-side of device 10 and the receptacle 40 are independently decoupled from the line-side power source of the electrical circuit. The schematic of contacts 950, 952, 954, and contacts 956, 958, 960 depicted in FIG. 28 corresponds to the circuit interrupter arrangement disclosed in FIGS. 13-18 and 20. The electrical circuitry shown in FIG. 28 may be used in conjunction with all of the mechanical embodiments shown herein.

GFI circuit 900 also includes a grounded neutral transmitter 102 that is configured to detect grounded neutral conditions. Those skilled in the art understand that the conductor connected to neutral line terminal 20 is deliberately grounded in the electrical circuit. A grounded neutral condition occurs when a conductor connected to load neutral terminal 200 is accidentally grounded. The grounded neutral condition creates a parallel conductive path with the return path disposed between load terminal 200(42) and line terminal 20. When a grounded neutral condition is not present, grounded neutral transmitter 102 is configured to couple equal signals into the hot and neutral conductors. As noted above, differential sensor 100 senses a current differential. Thus, the equal signals provided by grounded neutral transmitter 102 are ignored. However, when a grounded neutral condition is present, the signal coupled onto the neutral conductor circulates as a current around the parallel conductive path and the return path, forming a conductive loop. Since the circulating current conducts through the neutral conductor but not the hot conductor, a differential current is generated. Differential sensor 100 detects the differential current between the hot and neutral conductors. As such, detector 104 produces a signal on output 903 in response to the grounded neutral condition.

As noted initially, device 10 includes a checking circuit 901. The checking circuit 901 causes GFI 900 to trip due an internal fault also known as an end of life condition. Examples of an end of life condition include, but are not limited to, a non-functional sensor 100, grounded neutral transmitter 102, ground fault detector 104, filtering circuit 906, SCR 106, snubber 907, solenoid 52, or power supply 902. An internal fault condition may include a shorting or opening of an electrical component, or an opening or shorting of electrical traces configured to electrically interconnect the components, or other such fault conditions wherein GFI 900 does not trip when a grounded neutral fault occurs.

Checking circuit 900 includes several functional groups. The components of each group are in parenthesis. These functions include a fault simulation function (928, 930, and 934), a power supply function 924, a test signal function (52, 916, 918, and 912), a failure detection function (920), and failure response function (922, 910, and 914).

Fault simulation is provided by polarity detector 928, switch 930, and test loop 934. Polarity detector 928 is configured to detect the polarity of the AC power source, and provide an output signal that closes switch 930 during the negative half cycle portions of the AC power source, when SCR 106 cannot turn on. Test loop 934 is coupled to grounded neutral transmitter 102 and ground fault detector 100 when switch 930 is closed. Loop 934 has less than 2 Ohms of resistance. Because polarity detector 928 is only closed during the negative half cycle, electrical loop 934 provides a simulated grounded neutral condition only during the negative half cycle. However, the simulated grounded neutral condition causes detector 104 to generate a fault detect output signal on line 903.

The test signal function provides an oscillating ringing signal that is generated when there is no internal fault condition. Capacitor 918 and solenoid 52 form a resonant circuit. Capacitor 918 is charged through a diode 916 connected to the AC power source of the electrical circuit. SCR 106 turns on momentarily to discharge capacitor 918 in series with solenoid 52. Since the discharge event is during the negative half cycle, SCR 106 immediately turns off after capacitor 918 has been discharged. The magnitude of the discharge current and the duration of the discharge event are insufficient for actuating trip mechanism 80 (528, 801), and thus, the interrupting contacts remain closed. When SCR 106 discharges capacitor 918 during the negative AC power cycle, a field is built up around solenoid 52 which, when collapsing, causes a recharge of capacitor 918 in the opposite direction, thereby producing a negative voltage across the capacitor when referenced to circuit common. The transfer of energy between the solenoid 52 and capacitor 918 produces a test acceptance signal as ringing oscillation. Winding 912 is magnetically coupled to solenoid 52 and serves as an isolation transformer. The test acceptance signal is magnetically coupled to winding 912 and is provided to reset delay timer 920.

The failure detection function is provided by delay timer 920 and SCR 922. Delay timer 920 receives power from power supply 924. When no fault condition is present, delay timer 920 is reset by the test acceptance signal during each negative half cycle preventing timer 920 from timing out. If there is an internal fault in GFI 900, as previously described, the output signal on line 903 and associated test acceptance signal from winding 912, which normally recurs on each negative half cycle, are not generated. If the test acceptance signal is not present, the delay timer 920 will time out.

SCR 922 is turned on in response to a time out condition. SCR 922 activates solenoid 910 which in turn operates the trip mechanism 80 (528, 801.) Subsequently, the four-pole interrupter contacts are released and the load-side terminals (30, 300) and receptacle(s) 40 are decoupled from the power source of the electrical circuit. If a user attempts to reset the interrupting contacts by manually depressing the reset button 962, the absence of test acceptance signal causes device 10 to trip out again. The internal fault condition can cause device 10 to trip, and can also be indicated visually or audibly using indicator 914. Alternatively, solenoid 910 may be omitted, such that the internal fault condition is indicated visually or audibly using indicator 914, but does not cause device 10 to trip. Thus the response mechanism may be a circuit interruption by mechanism 80 (528, 801), an indication by indicator 914 or both in combination with each other.

Checking circuit 901 is also susceptible to end of life failure conditions. Checking circuit 901 is configured such that those conditions either result in tripping of GFI 900, including each time reset button 928 is depressed, or at least such that the failure does not interfere with the continuing ability of GFI 900 to sense, detect, and interrupt a true ground fault or grounded neutral condition. For example, if SCR 922 develops a short circuit, solenoid 910 is activated each time GFI 900 is reset and GFI 900 immediately trips out. If one or more of capacitor 918, solenoid 910 or winding 912 malfunctions, an acceptable test signal will not generated, and checking circuit 901 is configured to cause GFI 900 to trip out. If polarity detector 928 or switch 930 are shorted out, the grounded neutral simulation signal is enabled during both polarities of the AC power source. This will cause GFI 900 to trip out. If polarity detector 928 or switch 930 open circuit, there is absence of grounded neutral simulation signal, and delay timer 920 will not be reset and GFI 900 will trip out. Solenoids 52 and 910 are configured to operate trip mechanism 80 (528, 801) even if one or the other has failed due to an end of life condition. Therefore if solenoid 910 shorts out, trip mechanism 80 is still actuatable by solenoid 52 during a true fault condition. If power supply 924 shorts out, power supply 902 still remains operational, such that GFI 900 remains operative.

Although to the likelihood of occurrence is low, some double fault conditions cause GFI 900 to immediately trip out. By way of illustration, if SCR 922 and SCR 106 simultaneously short out, solenoids 52 and 910 are both turned on, resulting in activation of trip mechanism 80 (528, 801).

In another embodiment, solenoid 910 may be omitted and SCR 922 re-connected as illustrated by dotted line 936. During a true fault condition, solenoid 52 is turned on (activated) by SCR 106; when an end of life condition in GFI 900 is detected by checking circuit 901, solenoid 52 is turned on by SCR 922. The possibility of a solenoid 52 failure is substantially minimized by connecting solenoid 52 to the load side of the interrupting contacts.

As has been described, wire loop 934 includes a portion of the neutral conductor. A segment of the hot conductor can be included in electrical loop 934 instead of the neutral conductor to produce a similar simulation signal (not shown).

Other modifications may be made as well. The neutral conductor (or hot) conductor portion has a resistance 964, typically 1 to 10 milliohms, through which current through the load flows, producing a voltage drop. The voltage drop causes a current in electrical loop 934 to circulate which is sensed by differential sensor 100 as a ground fault. Consequently, ground fault detector 104 produces a signal on output 903 due to closure of test switch 930 irrespective of whether or not an internal fault condition has occurred in neutral transmitter 102. In order to assure that grounded neutral transmitter 102 is tested for a fault by checking circuit 901, electrical loop 934 can be configured as before but not to include a segment of the neutral (or hot) conductor, as illustrated by the wire segment, shown as dotted line 966.

Device 10 may also be equipped with a miswiring detection circuit 520, such as has been described. If device 10 has been correctly wired, resistor 522 fuses open. Thus, the miswire detection circuit will not be available to afford miswire protection if device 10 happens to be re-installed. However, the checking circuit 901 can be configured to provide miswiring protection to a re-installation. During the course of re-installation, the user depresses test button 50' to trip GFI 900. If device 10 has been miswired, power supply 924, connected to the load side of interrupting contacts, provides power to delay timer 920. Power supply 902 is configured to the circuit interrupting contacts, such that when GFI 900 is tripped, power supply 902 does not receive power. Since GFI 900 is not powered and thus inoperative, test acceptance signal is not communicated by winding 912. As a result, checking circuit 901 trips device 10. Whenever the reset button is depressed, the trip mechanism is activated such that the interrupter contacts do not remain closed. Thus, the checking circuit 901 interprets the re-installation miswiring in a similar manner to an end-of-life condition. Device 10 can only be reset after having been wired correctly.

Figure 29:
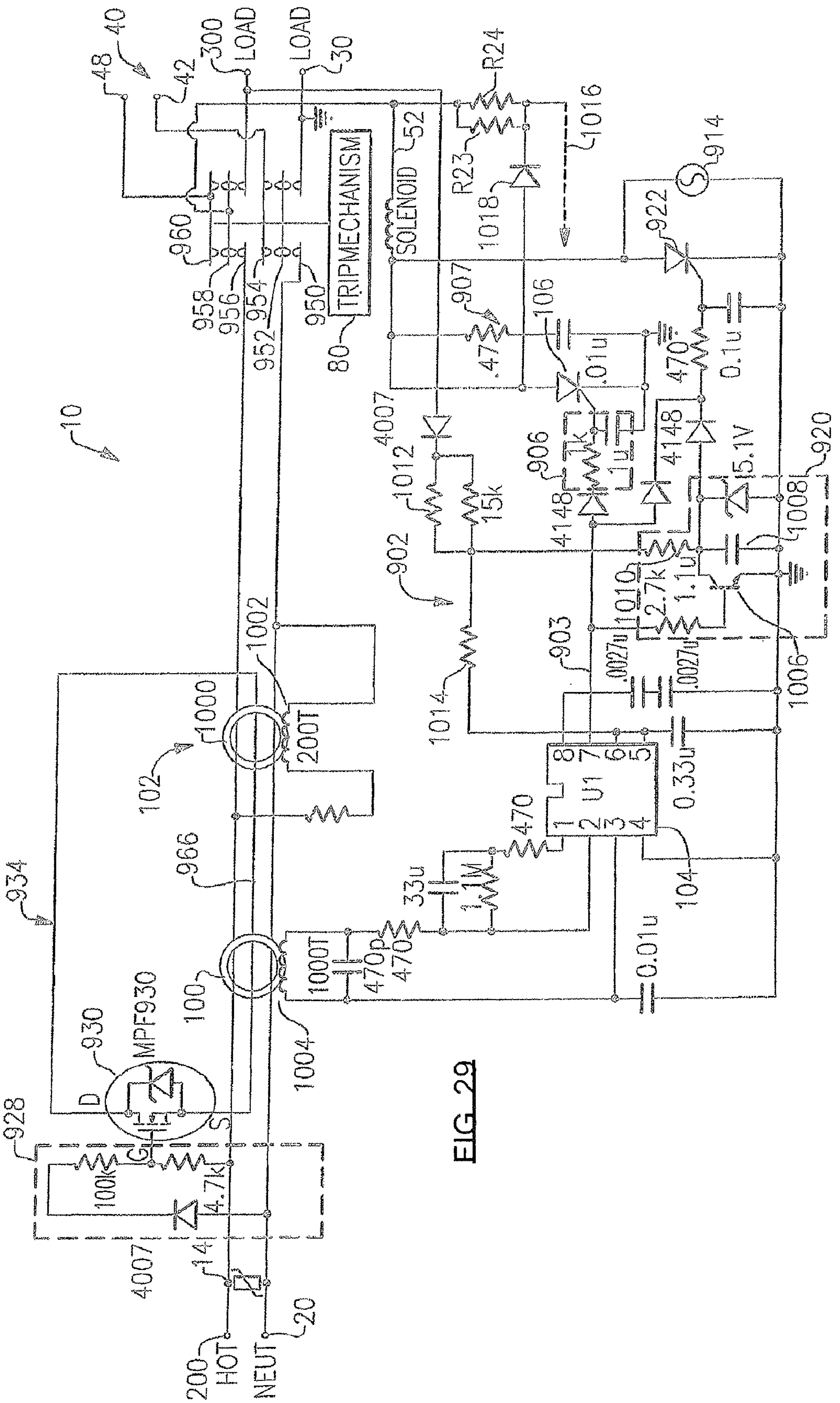
FIG. 29 is a schematic of the electrical wiring devices in accordance with another embodiment of the present invention.

Referring to FIG. 29, an alternate schematic of the electrical portion of the device 10 previously disclosed. Again, the circuit interrupter contacts 950-960 depicted in FIG. 29 correspond to the circuit interrupter arrangement disclosed in FIGS. 13-18 and 20. The electrical circuitry shown in FIG. 29 may be used in conjunction with all of the mechanical embodiments shown herein.

FIG. 29 shows an auto-test circuit with an end-of-life circuit. This design may be employed in conjunction with any of the embodiments discussed above. Grounded neutral transmitter 102 includes a saturating core 1000 and a winding 1002 coupled to hot and neutral line terminals 200 and 20, respectively. During a true grounded neutral fault condition, saturating core 1000 induces current spikes in the electrical loop 934. Reversals in the magnetic field in core 1000 corresponded to the zero crossings in the AC power source. The reversals in the magnetic field generate current spikes. Current spikes occurring during the positive-transitioning zero crosses produce a signal during the positive half cycle portions of the AC power source. The signal is sensed as a differential signal by ground fault sensor 100, and detected by ground fault detector 104. Subsequently, GFI 900 is tripped.

A simulated grounded neutral condition is enabled by polarity detector 928 and switch 930. Polarity detector 928 closes switch 930 during the negative half cycle. Thus, the current spikes occur during the negative half cycle portions but not during the positive half cycle portions of the AC power source. As described above, the output of detector 104 (line 903) during the negative half cycle portions of the AC power source are unable to turn on SCR 106. However, the output signal is used by checking circuit 901 to determine whether or not an end of life condition has occurred.

Switch 934 may be implemented using a MOSFET device, designated as MPF930 and manufactured by ON Semiconductor. In another embodiment, switch 934 may be monolithically integrated in the ground fault detector 104.

In response to a true ground fault or grounded neutral condition, ground fault detector 900 produces an output signal 903 during the positive half cycle portions of AC power source. The signal turns on SCR 106 and redundant SCR 922 to activate solenoid 52. Solenoid 52 causes trip mechanism 80 (528, 801) to operate.

When a simulated grounded neutral condition is introduced in the manner described above, a test acceptance signal is provided to delay timer 920 during the negative half cycle portions of the AC power source. Delay timer 920 includes a transistor 1006 that discharges capacitor 1008 when the test acceptance signal is received. Capacitor 1008 is recharged by power supply 902 by way of resistor 1010 during the remaining portion of the AC line cycle. Again, if there is an internal failure in device 10, the test acceptance signal is not generated and transistor 1006 is not turned on. As a result, capacitor 1008 continues to charge until it reaches a predetermined voltage. At the predetermined voltage SCR 922 is activated during a positive half cycle portion of the AC power source signal. In response, solenoid 52 causes the trip mechanism 80 (528,801) to operate. Alternatively, SCR 922 can be connected to a second solenoid 910 (see FIG. 28.)

Both GFI 900 and checking circuit 901 derive power from power supply 902. Redundant components can be added such that if one component has reached end of life, another component maintains the operability of GFI 900, thereby enhancing reliability, or at least assuring the continuing operation of the checking circuit 901. For example, the series pass element 1012 in power supply 902 may include parallel resistors. Resistor 1014 may be included to prevent the supply voltage from collapsing in the event the ground fault detector 104 shorts out. Clearly, if the supply voltage collapses, delay timer 920 may be prevented from signaling an end of life condition. Those of ordinary skill in the art will recognize that there are a number of redundant components that can be included in device 10; the present invention should not be construed as being limited to the foregoing example.

Alternatively, SCR 922 may be connected to end-of-life resistors R23, R24, as have been described, as shown by dotted line 1016, instead of being connected to solenoid 52 or 910. When SCR 922 conducts, the value of resistors R23, R24 is selected to generate an amount of heat in excess of the melting point of solder on its solder pads, or the melting point of a proximate adhesive. The total value of resistors R23, R24 is typically 1,000 ohms Resistors R23, R24 function as part of a thermally releasable mechanical barrier.

Since end of life resistors R23, R24 afford a permanent decoupling of the load side of device 10 from the AC power source, it is important that the end of life resistors R23, R24 only dislodge when there is a true end of life condition and not due to other circumstances, such as transient electrical noise. For example, SCR 922 may experience self turn-on in response to a transient noise event. Coupling diode 1018 may be included to decouple resistors R23, R24 in the event of a false end of life condition. The coupling diode 1018 causes SCR 922 to activate solenoid 52 when it is ON.

Figure 30:
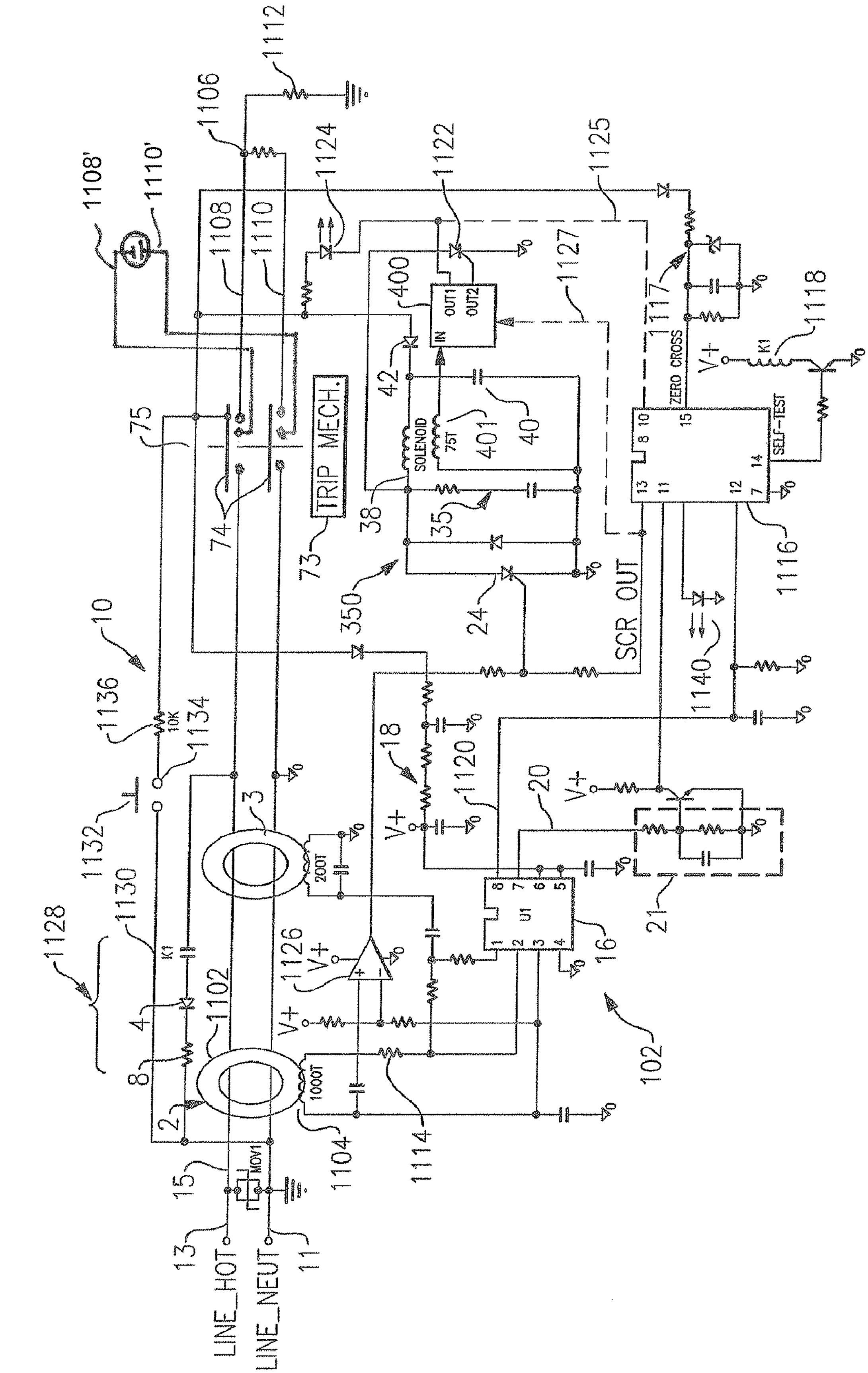
FIG. 30 is a schematic of the electrical wiring devices in accordance with another embodiment of the present invention.

As embodied herein, and depicted in FIG. 30, a schematic of a circuit protection device 10 in accordance with yet another embodiment of the present invention is disclosed. GFCI 10 includes ground fault interrupter circuitry and automated self-test circuitry. An across-the-line metal oxide varistor 15 (movistor 15) may be provided to prevent damage to device 10 from high voltage surges propagating on the line conductors 11, 13. Movistor 15 is typically 12 mm in size.

The ground fault circuitry includes a differential transformer 2 which is configured to sense load-side ground faults. Transformer 3 is configured as a grounded neutral transmitter and is employed to sense grounded-neutral fault conditions. Both differential transformer 2 and grounded-neutral transformer 3 are coupled to detector circuit 16. Power supply 18 provides power for GFI detector circuit 16 for full cycle operation. Detector circuit 16 processes the transformer outputs and provides an output signal on output pin 20 in accordance with the transformer outputs. The detector output signal on pin 7 is filtered by transistor circuit 21. A control gate circuit 1116 is coupled to both the detector 16 and the transistor circuit 21; and therefore, it is configured to receive either detector output signal 1120 or filtered detector output signal 20. Detector output signal 1120 and filtered detector output signal 20 are directed into control gate 1116 by way of pin 12 or pin 11, respectively. Control gate 1116 includes an internal logic gate that uses the detector output signal 1120 and filtered detector output signal 20 as inputs; the output of the gated circuit (SCR OUT) is provided at pin 13 of control gate 1116. Thus, SCR 24 is provided a delayed control input signal (SCR Out).

Device 10 also includes a by-pass circuit 1126 that is coupled to differential transformer 2 and V+. The output of by-pass circuit 1126 is also provided to the control input of SCR 24. Accordingly, SCR 24 may be turned ON by either a detector 16 output or by a by-pass circuit 1126 output. When SCR 24 is turned ON during the positive half-cycle of the AC current cycle, it will energize solenoid 38 which, in turn, drives trip mechanism 73 to break the four pole circuit interrupter 75. When either of these signals is transmitted to SCR 24 during the negative half-cycle of the AC current signal, SCR 24 is unable to energize solenoid 38. However, the negative half-cycle application of either (or both) of these signals to SCR 24 results in a test acceptance signal being provided to the input of checking circuit 400.

Referring back to the by-pass circuit 1126, it represents an important safety feature. When the differential current exceeds a predetermined current, by-pass circuit 1126 provides an output that by-passes the control gate 1116 such that SCR 24 is actuated (to trip device 10). Once the differential current exceeds the predetermined amount (e.g., 100 mA), it is not prudent to wait for the gated SCR OUT signal since the delay may prove a hazard. This feature is described in more detail below.

GFCI 10 also includes a GFI output circuit 350 formed by coupling capacitor 40 with solenoid 38. GFI output circuit 350 links detector 16 with end-of-life monitor circuit 400 and control gate 1116. Capacitor 40 and solenoid 38 form a resonating tank circuit. The tank circuit is placed in parallel with SCR 24 and a snubber circuit 35. Capacitor 40 charges on the positive half cycle of the AC power, but is prevented from discharging on the negative half cycle of the AC power by a blocking diode 42. However, if the solenoid is shorted out, the negative voltage across capacitor 40 does not appear. The negative voltage is produced by a collapsing magnetic field; the magnetic field is generated by the solenoid. Moreover, if any of the components including differential transformer 2, GFI detector circuit 16, circuit 21, power supply 18, SCR 24, solenoid 38, capacitor 40, and blocking diode 42 of circuit 102 fail, capacitor 40 will not discharge through solenoid 38, and the negative voltage across capacitor 40 from the collapsing field of solenoid 38 will not appear. If the negative voltage does not occur, end-of-life monitoring circuit 400 will time out and pin OUT 1 will signal an end of life condition.

When the negative voltage does appear across capacitor 40, the input (IN) of end-of-life monitoring circuit 400 is driven LOW, resetting a first timer within end-of-life monitoring circuit 400 into a monostable timeout mode. As long as the components listed above, i.e., the differential transformer 2, GFI detector circuit 16, circuit 21, power supply 18, SCR 24, solenoid 38, capacitor 40, and blocking diode 42 of circuit 102 are operating properly, the capacitor 40 will be periodically discharged to reset the first timer. As a result, the output of circuit 400 (OUT 1) will not signal an end-of-life condition. However, if any of these components fail, capacitor 40 will not be discharged through solenoid 38, and the negative voltage across capacitor 40 from the collapsing field of solenoid 38 will not appear. As noted previously, the first timer will time out such that OUT 1 signals an end-of-life condition.

Note that lines 1125 and 1127 are shown as being dashed lines. The significance of the dashed lines is that line 1125 and line 1127 may not be connected to control gate 1116. In these embodiments, LED 1124 is illuminated to signal an end-of-life condition and a second timer included in circuit 400 is initiated. When the second timer times out, OUT 2 turns SCR 1122 ON, current conducts through diode 42, and solenoid 38 is energized to trip circuit interrupter 73. Those of ordinary skill in the art will recognize that the end-of-life indicator 1124 may be implemented using a visual indication (i.e., an LED), an audible indication, or both. One benefit from this arrangement is that the user is alerted by an indication that the device has reached end-of-life. The user is then afforded a reasonable amount of time to replace the device before power to the load terminals (1108, 1108', 1110, and 1110') is denied by the operation of the circuit interrupter 75. In one embodiment, the pre-determined time delay is twenty-four (24) hours. Any suitable time interval may be chosen. For example, the delay may be set at forty-eight (48) hours.

In alternate embodiments, the end-of-life circuit includes redundancy features such as line 1125 being disposed between OUT 1 and pin 10 of control gate 1116. Line 1127 may also be disposed between control gate pin 13 and a second input of end-of-life circuit 400. A redundant LED 1140 is connected to control gate 116. The redundancy is configured to detect and respond to an end-of-life condition in circuit 400. The end-of-life condition in circuit 400 changes the signal on line 1127. LED 1140 is illuminated to signal the end-of-life condition and a third timer, included in control gate 116, is initiated. The benefits associated with the third timer are similar to those associated with the second timer. When the third timer times out, output 13 of control gate 1116 turns SCR 24 ON, current conducts through diode 42 and solenoid 38 is energized to trip circuit interrupter 73. Those of ordinary skill in the art will recognize that the end-of-life indicator 1140 may be implemented using a visual indication (i.e., an LED), an audible indication, or both.

It will be apparent to those of ordinary skill in the pertinent art that modifications and variations can be made to end-of-life circuit 400 depending on the configuration of output circuit 350 and/or control gate 1116. For example, circuit 400 may be implemented using a single monolithic integrated circuit or may be implemented using discrete timers and other discrete circuit elements. For example, OUT 1 may be the anode of an additional SCR device. Those of ordinary skill in the art will appreciate that other circuit variations are possible within the scope of the invention.

As noted, control gate 1116 is configured to receive detector output signal 1120 and filtered detector output signal 20 to provide a gated and delayed detection signal to SCR 24 (SCR out). Control gate 1116 also provides both end-of-life functionality and self-test functionality. The self-test functionality is described as follows.

Control gate 1116 is configured to recycle between a test state and a non-test state. The durations of each of the two states are established by a timing circuit. Those of ordinary skill in the art will recognize that the timing circuit may be of any suitable type. For example, the timing circuit may be an external clocking arrangement driven by a local oscillator (not shown), a timer disposed in controller 1116, or by a zero cross circuit 1117 coupled to the AC power. When control gate 1116 is in the test state, it is configured to actuate self-test relay 1118 during a negative half-cycle. Upon actuation, self-test relay 1118 is configured to actuate the self-test circuit to initiate the self-test procedure.

Automated self-test circuit 1128 is coupled between line hot 13 and line neutral 11. Circuit 1128 includes contacts 1130 which are disposed in series with diode 4 and resistor 8. The self-test signal is generated by ground fault simulation circuit 1128 when relay 1118 turns ON to close contacts 1130. Those of ordinary skill in the art will recognize that test circuit 1128 may be implemented using various alternate fault simulation circuits. For example, if control gate 1116 and self-test relay 1118 are programmed to close contacts 1130 only during the negative half cycle of AC power, diode 4 may be omitted. Alternatively, if contacts 1130 are configured to close for a full line cycle, diode 4 should be included to limit the simulated ground fault current to the negative half cycle. The current flowing through resistor 8 produces a difference current between the hot conductor 13 and neutral conductor 11, which is sensed by transformer 2, in the manner previously described. Of course, the SCR 24 cannot conduct line current during the negative half-cycle of the AC wave. However, if SCR 24 is not signaled by detector 16, the end-of-life time-out sequence described above is initiated.

It will be apparent to those of ordinary skill in the pertinent art that modifications and variations can be made to control gate 1116 of the present invention depending on device selection and design issues. For example, control gate 1116 may be implemented using a microprocessor, an application specific integrated circuit (ASIC), or a combination of other electronic devices familiar to those skilled in the art. In the example shown in FIG. 30, control gate 1116 is implemented as a discrete microprocessor component. In another embodiment, control gate 1116 is combined in an ASIC with other device components and sub-systems. For example, an ASIC may include detector 16, self-test circuit 400, and other such components.

As those of ordinary skill in the pertinent art will recognize, self-test relay 1118 may be of any suitable type depending on electrical device characteristics. For example, relay 1118 may be implemented using an electro-mechanical relay. Relay 1118 may also be implemented using solid state switches such as a thyristor, SCR, triac, transistor, MOSFET, or other semiconductor devices.

Referring back to control gate 1116, during the aforementioned recurring non-test state intervals, the detector output signals 20 and 1120, are directed to control gate 1116, in the manner previously described. When control gate 1116 is in the non-test state, control gate 1116 de-activates the negative half cycle self-test signal by turning off self-test relay 1118, permitting detection of the true fault signal while avoiding the self-test signal interference. In this state, GFI 10 may detect a true fault signal in either half cycle, but is responsive to the fault only in the positive half cycles because of the SCR 24 circuit arrangement previously described. The duration of the non-test state intervals may be selected within a time range between one (1) second and one (1) month. One month is typically considered as being the maximum safe interval between tests. Alternatively, the duration of the non-test state interval may be set to about one minute. The test/non-test cycle is recurring; each non-test cycle is followed by a test state cycle, and each test cycle is followed by a non-test state cycle.

Of course, GFI 10 is in a self-test mode during the test state interval. A self-test signal may be transmitted during the first negative half cycle of the test state interval, in selected negative half-cycles or in each negative half-cycle of the test interval. In the circuit example depicted in FIG. 30, control gate 1116 activates the simulated fault signal during a negative half cycle by turning on self-test relay 1118. The simulated test signal causes detector 16 to produce a signal at output 20 or alternate output 1120 during each negative half-cycle. Output 1120 provides the same information as output 20, but is configured to generate digital logic levels. As noted, control gate 1116 gates the detector 16 output signal received during the negative half cycle to SCR 24. The gate functions to block any extended signal for a predetermined amount of time after the negative half cycle. The predetermined time interval is chosen such that any remaining extended signal is substantially less than the expected true fault signal. The predetermined interval is typically set at 30 to 50 milliseconds. As a result, any self-test signal that extends beyond the negative half cycle does not cause false activation of SCR 24. However, the portion of the test acceptance signal propagating during the negative half cycles will cause the timer in ring detector 400 to reset.

In any event, by-pass circuit 1126 is provided to cause device 10 to respond in accordance with UL trip time requirements if a true fault condition occurs during the to 50 millisecond dead period described above.

The various embodiments of the device 10 may be equipped with a manually accessible test button 1132. Test button 1132 closes switch contacts 1134 to initiate a simulated ground fault signal (i.e., current through resistor 1136). In an alternate embodiment, a simulated grounded neutral fault signal may be provided (not shown.) If GFI 10 is operational, closure of switch contacts 1134 initiates a tripping action. The purpose of the test button feature is to allow the user to control GFCI 10 as a switch for applying or removing power from a load (as represented by resistor 1106) connected to device 10, in which case test button 1132 and reset button 75 may be labeled "OFF" and "ON" respectively. Usage of test button 1132 does not affect the performance of device 10, or the ability to detect and respond to end-of-life conditions.

Referring once again to by-pass circuit 1126, by-pass circuit 1126 is configured to circumvent control gate 1116 under certain circumstances. In the event of a ground fault, the operation of control gate 1116 may be delayed by capacitive charging time constants in power supply 18 and by delays in control gate 1116, including software-related delays. These delays might prevent trip mechanism 73 from interrupting high amplitude ground fault currents greater than about 100 mA within known safe maximum time limits.

This "safe maximum" trip time requirement is provided in UL 943. UL 943 includes an inverse time-current curve: $t=(20/I)^{1.43}$ where "I" is the fault current in milliamps (mA) and "t" is the trip time in seconds. Typical values for the fault current range between 6 mA and 264 mA. The 6 mA current is the "let-go threshold." In other words, UL does not consider currents less than 6 mA to be a hazard. The 264 mA limit corresponds to 132 VAC (the maximum source voltage) divided by 500 Ohms (the least body resistance for a human being). Applying the trip time curve, a 6 mA fault current is allowed a maximum trip time of 5 seconds. A 264 mA fault current is allowed a maximum trip time of 0.025 seconds. By-pass circuit 1126 is configured to actuate SCR 24 when the fault current exceeds 100 mA. According to the trip time curve, if the fault current equals 100 mA, the calculated trip time is 0.1 seconds (100 milliseconds.) Thus, the 30 to 50 millisecond dead period does not violate the UL trip time curve for true ground faults below 100 mA. For true fault currents above 100 mA, bypass circuit 1126 overrides the dead period lock-out. Accordingly, the present invention is in accordance with UL trip time requirements. Those of ordinary skill in the art will recognize that bypass circuit 1126 and detector 16 may be combined in a single monolithic integrated circuit.

Another feature of the present invention relates to noise immunity. The sources of transient noise include switching noise from the AC power source, electrical noise associated with loads having commutating motors with brushes, or the noise associated with various kinds of lamps or appliances. Noise immunity is a consideration because transient noise may interfere with the self-test signal. Under certain circumstances, noise may interfere with, or cancel, the self-test signal. Accordingly, the timer in circuit 400 may not be reset despite the fact that there is no internal fault condition in GFCI 10. Accordingly, in one embodiment the timer in circuit 400 is programmed to measure a time interval that spans four simulated test cycles, or a predetermined amount of time, such as four minutes, for example. Thus, circuit 400 need only detect one in four test acceptance signals during the time interval for timer reset. It is unlikely that a transient noise event would disturb either four consecutive negative half cycles or last for a period of 4 minutes. As such, programming the timer in this manner desensitizes GFCI 10 to the effects of transient electrical noise.

Figure 31:
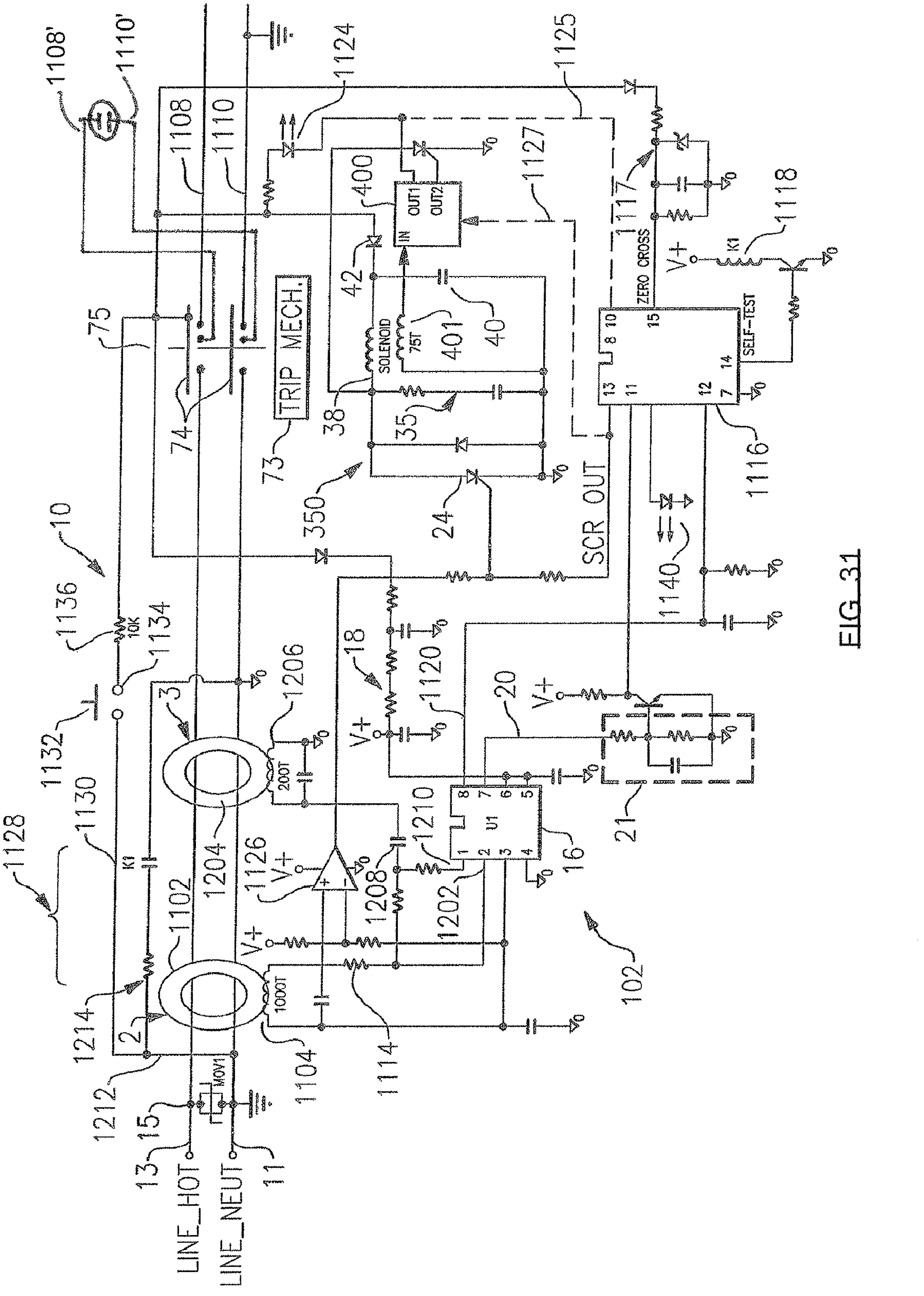
FIG. 31 is a schematic of the electrical wiring devices in accordance with another embodiment of the present invention.

As embodied herein and depicted in FIG. 31, a schematic of a circuit protection device in accordance with a second embodiment of the present invention is disclosed. FIG. 31 is a schematic diagram of an alternate embodiment in which the fault simulation circuit generates a simulated negative half cycle grounded neutral signal. Reference is made to U.S. patent application Ser. No. 10/768,530, which is incorporated herein by reference as though fully set forth in its entirety, for a more detailed explanation of the fault simulation signal. Note that test circuit 1128 does not include diode 4.

The GFI circuit 102 in FIG. 31 includes a transformer 2 that is configured to sense a load-side ground fault when there is a difference in current between the hot and neutral conductors. Transformer 2 transmits a sensed signal to detector circuit 16. GFI circuit 102 also includes a grounded neutral transmitter 3 that is configured to detect grounded neutral conditions. Those skilled in the art understand that the conductor connected to neutral line terminal 11 is deliberately grounded in the electrical circuit. On the other hand, a grounded neutral condition occurs when a conductor connected to load neutral terminal 1110 is accidentally grounded.

The grounded neutral condition creates a parallel conductive path with the return path disposed between load terminal 1110 and line terminal 11. When a grounded neutral condition is not present, grounded neutral transmitter 3 is configured to couple equal signals into the hot and neutral conductors. As noted above, transformer 2 senses a current differential. Thus, when no fault condition exists, the current flowing in the hot conductor cancels the current flowing in the neutral conductor. However, when a grounded neutral condition is present, the signal coupled onto the neutral conductor circulates as a current around the parallel conductive path and the return path, forming a conductive loop which is simulated by conductive loop 1212. Since the circulating current propagates through the neutral conductor but not the hot conductor, a differential current is generated. Transformer 2 detects the differential current between the hot and neutral conductors. As such, detector 16 produces a signal on output 20 in response to the grounded neutral condition.

In one embodiment, ground fault detector 16 is implemented using an RV 4141 integrated circuit manufactured by Fairchild Semiconductor. Those of ordinary skill in the art will understand that any suitable device may be employed herein. Transformer 2 may be implemented using a toroidally shaped magnetic core 1102 about which a winding 1104 is wound. Winding 1104 is coupled to an input terminal 1202 of ground fault detector 16. Winding 1104 typically has 1,000 turns. Grounded neutral transmitter 3 may be implemented using a second toroidally shaped magnetic core 1204 about which a winding 1206 is wound. Winding 1206 is coupled in series with a capacitor 1208 to the gain output terminal 1210 of ground fault detector 16. Winding 1206 typically has 200 turns. Hot and neutral conductors 13 and 11 pass through the apertures of cores 1102 and 1204.

During a grounded neutral condition, low level electrical noise indigenous to the electrical circuit or to ground fault detector 16 creates a magnetic flux in either core 1102 or 1204, or both. The flux in core 1204 is induced by winding 1206. Core 1204 induces a circulating current in electrical loop 1212, which induces a flux in core 1102. The resulting signal from winding 1104 is amplified by the gain of ground fault detector 16 to produce an even greater flux in core 1204 via winding 1206. Because of this regenerative feedback action, ground fault detector 16 breaks into oscillation. The frequency typically is in a range between 5 kHz and 10 kHz. This oscillation produces a signal on output 20. Control gate 1116 ultimately signals SCR 24 to trip the device 10.

Electrical loop 1212 is part of the fault simulation circuit 1128. Loop 1212 has a resistance associated with it; the resistance is shown in FIG. 31 as lumped resistance 1214. Resistance 1214 is typically less than 2 Ohms Electrical loop 1212 couples the grounded neutral transmitter 3 and ground fault detector 2 when contacts 1130 are closed during at least first negative half cycle of each test state interval. Accordingly, a simulated grounded neutral condition is generated only during the negative half cycle. The simulated grounded neutral condition causes detector 16 to generate a fault detect output signal on line 20 to retrigger the timer in ring detector 400 during test state intervals. Absence of the timer reset signal indicates that the device has reached its end of life. As previously discussed, the end of life condition causes activation of an end of life indicator, tripping of interrupting contacts, or both.

Again, the various embodiments of the device may be equipped with a manually accessible test button 1132 configured to close switch contacts 1134. Upon closure of contacts 1134, current flows through resistor 1136 and a simulated grounded hot fault signal is initiated. In another embodiment, a simulated grounded neutral fault signal (not shown) is initiated by actuating test button 1132. If GFI 10 is operational, closure of switch contacts 1134 initiates a tripping action. The purpose of the test button feature may be to allow the user to control GFCI 10 as a switch for applying or removing power from load 1106. As such, test button 1132 and reset button 75 may be labeled "off" and "on," respectively. Usage of test button 1132 does not affect the ability to detect and respond to an end-of-life condition, or vice-versa.

The GFI output circuit 350, circuit 400, and control gate 1116 are similar, if not identical, to those depicted in FIG. 30.

Figure 32:
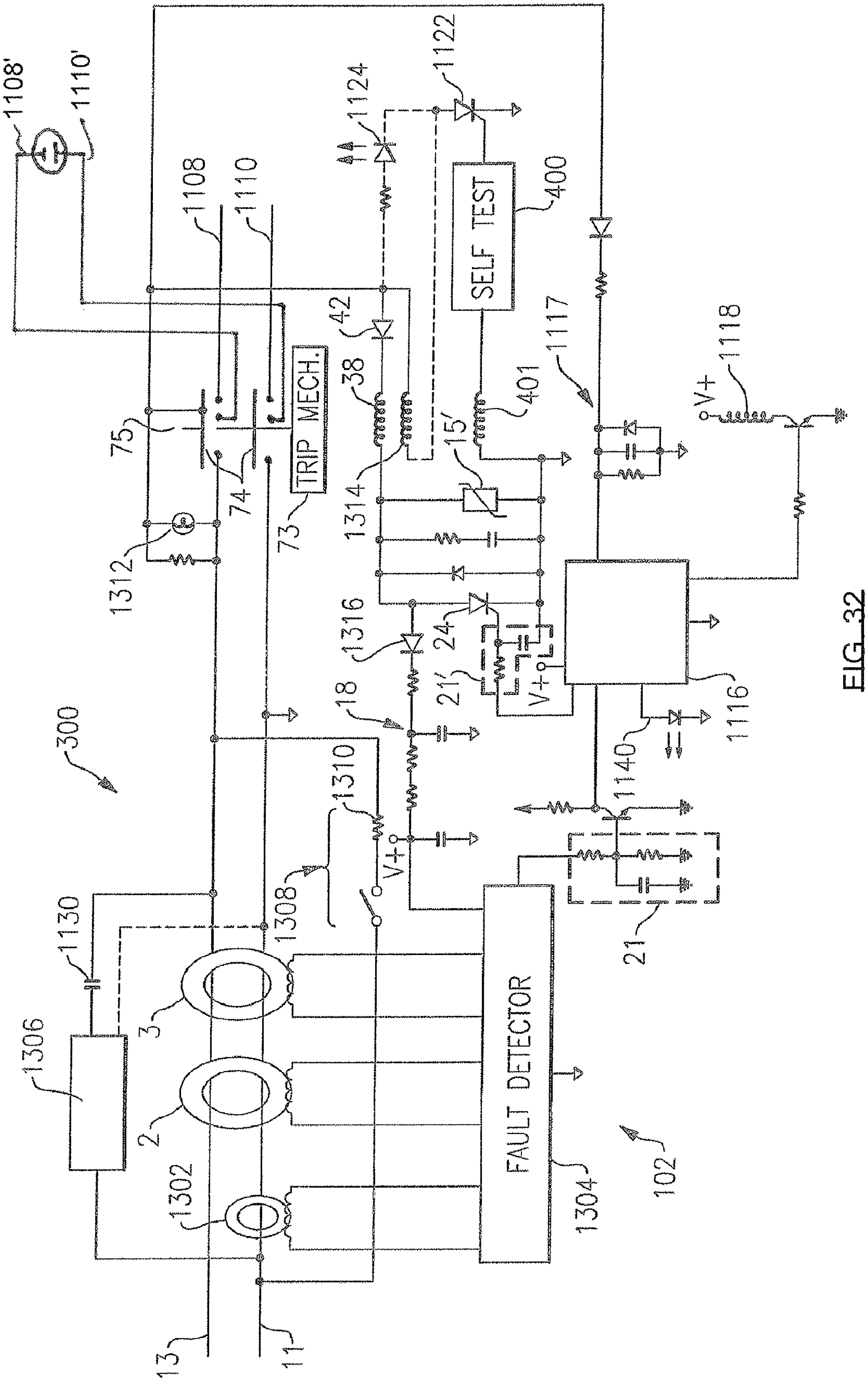
FIG. 32 is a schematic of the electrical wiring devices in accordance with another embodiment of the present invention.

As embodied herein and depicted in FIG. 32, a schematic of a circuit protection device in accordance with a third embodiment of the present invention is disclosed. FIG. 32 is a schematic diagram that illustrates how the present invention may be applied to a general protective device 300. Further, FIG. 32 incorporates a redundant solenoid.

If sensor 1302 is included, the protective device is an AFCI. If transformers 2 and 3 are included, the protective device is a GFCI. If sensor 1302 and transformers 2 and 3 are included, the protective device is a combination AFCI-GFCI. Stated generally, the protective device may include one or more, or a combination of sensors configured to sense one or more type of hazardous conditions in the load, or in the AC electrical circuit supplying power to the load. Sensor 1302 senses an arc fault signature in load current. Detector 1304 is similar to ground fault detector 16, but is configured to detect signals from any of the variety of sensors employed in the design. Detector may also provide a signal to a transmitter, such as transformer 3.

Fault simulation circuit 1306 is similar to fault simulation circuit 1128 but configured to produce one or more simulation signal to confirm that the protective device is operational. Contacts 1130 are closed by operation of relay 1118 during a test state interval. Fault simulation signals are generated during negative half cycles of AC power. The embodiment of FIG. 32 is similar to the previous embodiments discussed herein, in that any extended test fault signals from fault detector 1304 to SCR 24 are blocked by control gate 1116. In this manner, simulation signals that extend into positive half cycles of the AC power line do not result SCR 24 being turned ON. Accordingly, false actuations of the circuit interrupter are prevented.

Other features and benefits can be added to the various embodiments of the invention. GFCI 10 may be equipped with a miswiring detection feature such as miswire network 1308. Reference is made to U.S. Pat. No. 6,522,510, which is incorporated herein by reference as though fully set forth in its entirety, for a more detailed explanation of miswire network 1308.

Briefly stated, miswire network 1308 is configured to produce a simulated ground fault condition. During the installation of protective device 300 if the power source voltage is coupled to the line terminals 11 and 13 as intended, the current through network 1308 causes the protective device to trip. However, the current through network 1308 continues to flow until a fusible component in network 1308 open circuits due to $I^2R$ heating. The fusible component may be implemented by resistor 1310, which is configured to fuse in typically 1 to 10 seconds. The protective device 300 may be reset after the fusible component opens. Subsequently, the protective device 300 and checking circuit 400 operate in the previously described manner. However, when the device is miswired by connecting the power source to the load terminals 1108 and 1110 during installation, GFI 102 trips the interrupting contacts 74 before the fusible component opens. The current flow through network 1308 is terminated in less than 0.1 seconds. This time period is too brief an interval to cause the fusible component to fail. Thus, when protective device 300 is miswired, the fusible element in network 1308 remains intact. Accordingly, reset button 75 cannot effect a resetting action. Protective device 300 cannot be reset regardless of signals to or from checking circuit 400.

As discussed above and shown in earlier embodiments, an across-the-line metal oxide varistor (MOV), also commonly referred to as a movistor, may be included in the protective device to prevent damage of the protective device from high voltage surges from the AC power source. The movistor is typically 12 mm in size. Alternatively, a much smaller MOV may be employed in the circuit when it is coupled with an inductance.

In this embodiment, MOV 15' is coupled with solenoid 38. The value of the inductive reactance of solenoid 38 is typically greater than 50 Ohms at the frequency of the surge voltage. The inductive reactance serves to reduce the surge current absorbed by the movistor, permitting MOV 15' to have a lower energy rating. Accordingly, the size of the movistor may be reduced to a 5 mm diameter device. Further, the MOV may be replaced altogether by a surge-absorbing capacitor, air gap, or any of other surge protection methods familiar to those who are skilled in the art.

Protective device 300 may also include a trip indicator 1312. Indicator 1312 is configured to illuminate a trip indication, and/or audibly annunciate a trip indication, when protective device 300 is tripped. Trip indicator 1312 also functions to direct the user to the location of the tripped device.

Another feature of the embodiment shown in FIG. 32 relates to the redundant solenoid design. Upon reaching end-of-life, solenoid 38 typically fails by developing an open circuit condition. Solenoid 1314 may be added to provide redundancy. If solenoid 38 open circuits, secondary 401 does not receive self-test signal. However, circuit 400 is able to trip out the protective device by actuating redundant solenoid 1314. Solenoid 1314 may be magnetically coupled to solenoid 38. Other redundancies may be included in device 300. Redundant components permit the protective device and/or permit circuit 400 to function. For example, diode 1316 included in power supply 18 can comprise two diodes in parallel, such that if one diode open circuits, that second diode continues to maintain supply voltage.

Figure 33:
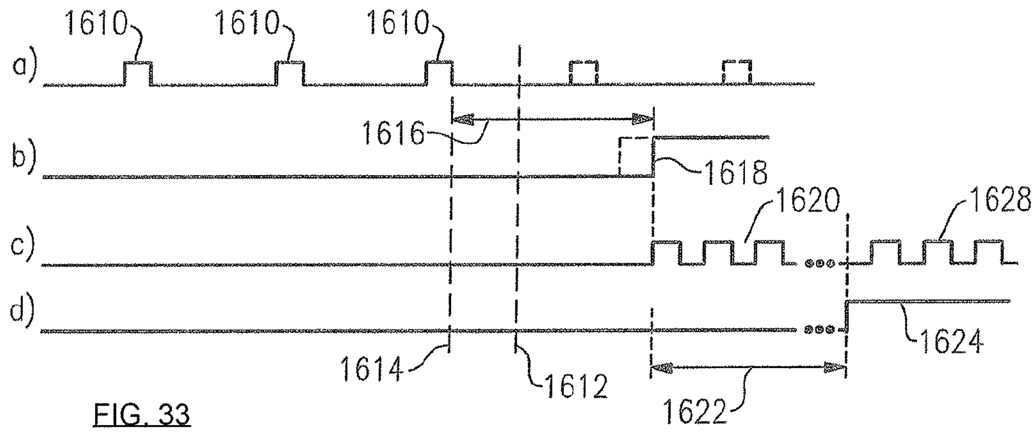
FIGS. 33-35 are timing diagrams illustrating different methods for indicating the end-of-life condition before power is permanently denied to the load terminals of the device.
Figure 34:
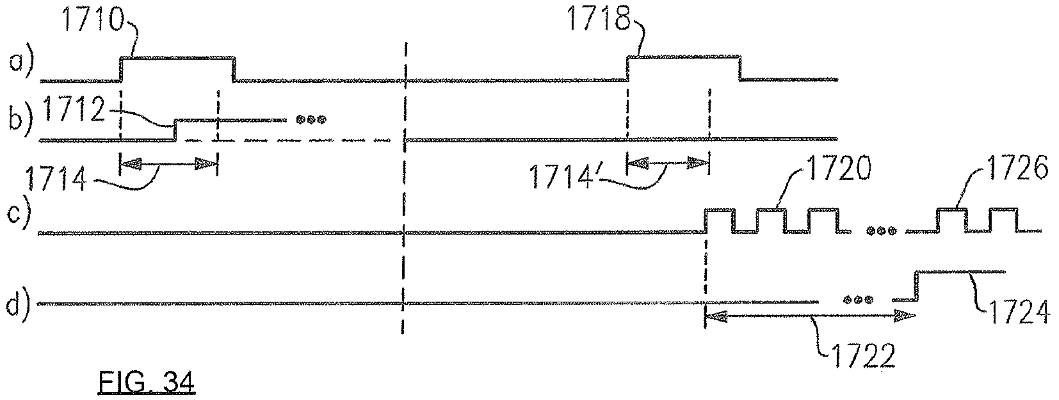
Figure 35:
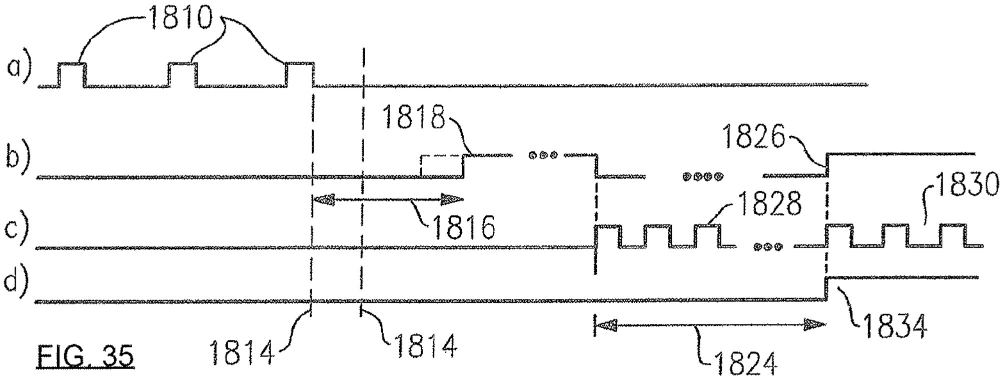

Referring to FIGS. 33-35 are directed to timing diagrams that illustrate different methods for indicating the end-of-life condition before power is permanently denied to the load terminals of the device. The timing diagrams illustrate a method for providing a user with an end-of-life indication before power is permanently denied to the load by interrupting the device contacts in a non-resettable way.

FIG. 33 shows the timing sequence for end-of-life indication and lock-out. As described above, self-testing occurs periodically on the negative half-cycle of AC power. As such, signal “a” represents the recurring test acceptance signals from the GFI portion of device 10, i.e., the input to end-of-life monitor circuit 400. The second signal (b) represents the first timer in circuit 400. At time 1612 one of the components listed above fails, representing an end-of-life condition. Accordingly, the last input pulse 1610 is received by circuit 400 at time 1614. An end-of-life condition occurs at time 1618 when the first timer time-out occurs. In other words, if a test acceptance signal is not detected within time interval 1616, an end-of life signal 1618 is generated by the first timer. Signal (c) represents end-of-life indicator 1124. Pulses 1620 indicate that LED 1124 (or an audible indicator) may be pulsed to provide a blinking light or a periodic beeping sound. Alternatively, LED 1124 may be illuminated continuously. In another embodiment, an end-of-life indicator 1140 may be connected to receive signal from control gate 1116. Control gate 1116 is configured to generate an intermittent signal to indicator 1140 when an end-of-life condition has been detected. Signal (d) represents a lock-out signal such as signal OUT 2 from circuit 400 or SCR OUT from gate 1116. Lock-out signal (d) is generated following the predetermined amount of time 1622 established by a second timer. As shown, signal (d) generates a lock-out pulse 1624 that permanently disconnects the load terminals from the line terminals of device 10 (300.) Those skilled in the art will recognize that signal (d) may be configured as an active LOW signal, as shown in FIG. 30 and/or FIG. 31.

In one embodiment of the present invention lock-out pulse 1624 is operative to trip the trip mechanism 73. In another embodiment, a separate set of redundant end-of-life contacts are provided. In this case, lock-out pulse 1624 is operative to separate the redundant contact structure. The redundant structure may not rely on the state (i.e., reset or tripped) of trip mechanism 73. In yet another embodiment, an end-of-life indication signal 1628 may be included for continuing to energize the end-of-life indicator 1124 (1140) after lock-out has occurred. The continued blinking light, or beeping noise, helps the user locate the failed device causing loss of power.

Referring to FIG. 34, timing diagrams illustrating the manual test features of the present invention are provided. Signal (a) represents the manual test circuit. Pulse 1710 is generated by manual actuation of the test button 1132. Signal (b) represents test acceptance signal 1712. Note that test acceptance signal 1712, in this case, is generated by detector 16 and output circuit 350 within a test acceptance interval 1714, indicating that protective device 10 is operational. Pulse 1718 represents another manual actuation of the test button 1132. However, in this case there is an end-of-life condition as evidenced by a lack of any test acceptance signal 1712 within test acceptance interval 1714'. Accordingly, end-of-life signal 1618 is again generated. Signal (c) represents the operation of the end-of-life indicator 1124 (1140.) Signals 1720 and 1726 are similar to signals 1620, 1628 that have been previously described. Signal (d) represents the lock-out signal 1724 that is generated after predetermined amount of time 1722 elapses. Lock-out signal 1724 permanently disconnects the line terminals of device 10 (300) from the line terminals.

FIG. 35 is directed to an embodiment of the invention that includes a reset capability. Signal (a) represents the test acceptance signals 1810. Again, test acceptance signals indicate that protective device 10 (300) is operative to sense, detect, and protect device 10 for at least one of the intended predetermined conditions. At time 1812 one of the above listed components fails and in response, the last test acceptance signal is transmitted at time 1814. Signal (b) refers to SCR OUT or an output of circuit 400. If a test acceptance signal is not detected within time interval 1816, pulse 1818 is generated, directing trip mechanism 73 to trip. The falling edge of pulse 1818 corresponds to a user manually depressing the reset button 75 (FIG. 30). Signal (c) represents the output of visual indicator 1124 (or an audible indicator). Once the user resets device 10 (300), indicator 1124 begins to blink indicating that an end-of-life condition has occurred. A predetermined time interval 1824 is initiated when the trip mechanism 73 is reset. After time interval 1824 elapses, lock-out pulse 1826 is generated by either control gate 1116 or circuit 400 in the manner previously described. As a result, trip mechanism 73 permanently trips at the rising edge of pulse 1826, when the predetermined time interval 1824 has expired. In reference to indicator signal (c), an ongoing indicator signal 1830 may be provided to continually energize end-of life indicator 1124 (1140) after the predetermined time interval 1824 for the reasons previously provided.

Should a test acceptance signal be generated during time interval 1622 (1722, 1824), control gate 1116 and/or circuit 400 may be configured to ignore the test acceptance signal. Accordingly, device 10 (300) trips when the predetermined time delay has elapsed in the manner previously described. In an alternate embodiment, control gate 1116 and/or circuit 400 may be configured or programmed to recognize the test acceptance signal.

If the test acceptance signal is recognized, the end-of-life signal and the lock-out signal are both cancelled. This is another noise immunity feature of the present invention. If noise on the electrical distribution system momentarily defeats the recurring test signal, device 10 may recover, preventing an erroneous end-of-life lock-out to occur. Alternatively, a "wait delay" may be included between the expiration of interval 1616 (1714, 1816) and the onset of interval 1622 (1722, 1824). In this manner, circuit 400 generates an end-of-life signal as before, but the end of life indicator 1124, (1140) is not energized until the wait delay elapses. Power denial may be delayed by 24 to 48 hours after an end-of-life condition is detected (the predetermined amount of time.) Activation of the indicator may be delayed by 5 seconds to 5 hours after an end-of-life condition is detected (the wait delay interval.)

The user is made aware of the end-of-life condition by the end-of-life indicator, after which the user is given a predetermined amount of time before power is denied to the load terminals. In yet another alternative, device 10 (300) includes a counter responsive to the reset button. After an end-of-life condition has occurred, the counter allots the user a predetermined number of reset cycles before power is permanently denied to the load terminals. During each reset cycle, the reset button enables the line terminals to be connected to the load terminals but only for a predetermined period of time. As such, each reset cycle serves to remind the user of the end-of-life condition. The reset cycles may be of decreasing duration as further incentive to replace the device before power to the load terminals becomes permanently denied.

Those of ordinary skill in the art will recognize that the timing intervals depicted in the timing diagrams may be altered and modified within the scope of the present invention. Visual indicators may be of various colors or flashing patterns so as to be distinguishable from other types of indicators included in device 10 (300), such as a trip indicator 1312, or a pilot light configured to illuminate when power is applied to the load terminals (not shown). Two or more types of indicators may be configured to emit light from the same location in the housing of device 10 (300.) Visual or audible indicators may progress through various patterns, sounds, or colors that serve to increasingly draw attention of the user to the impending lock-out condition.

Figure 36:
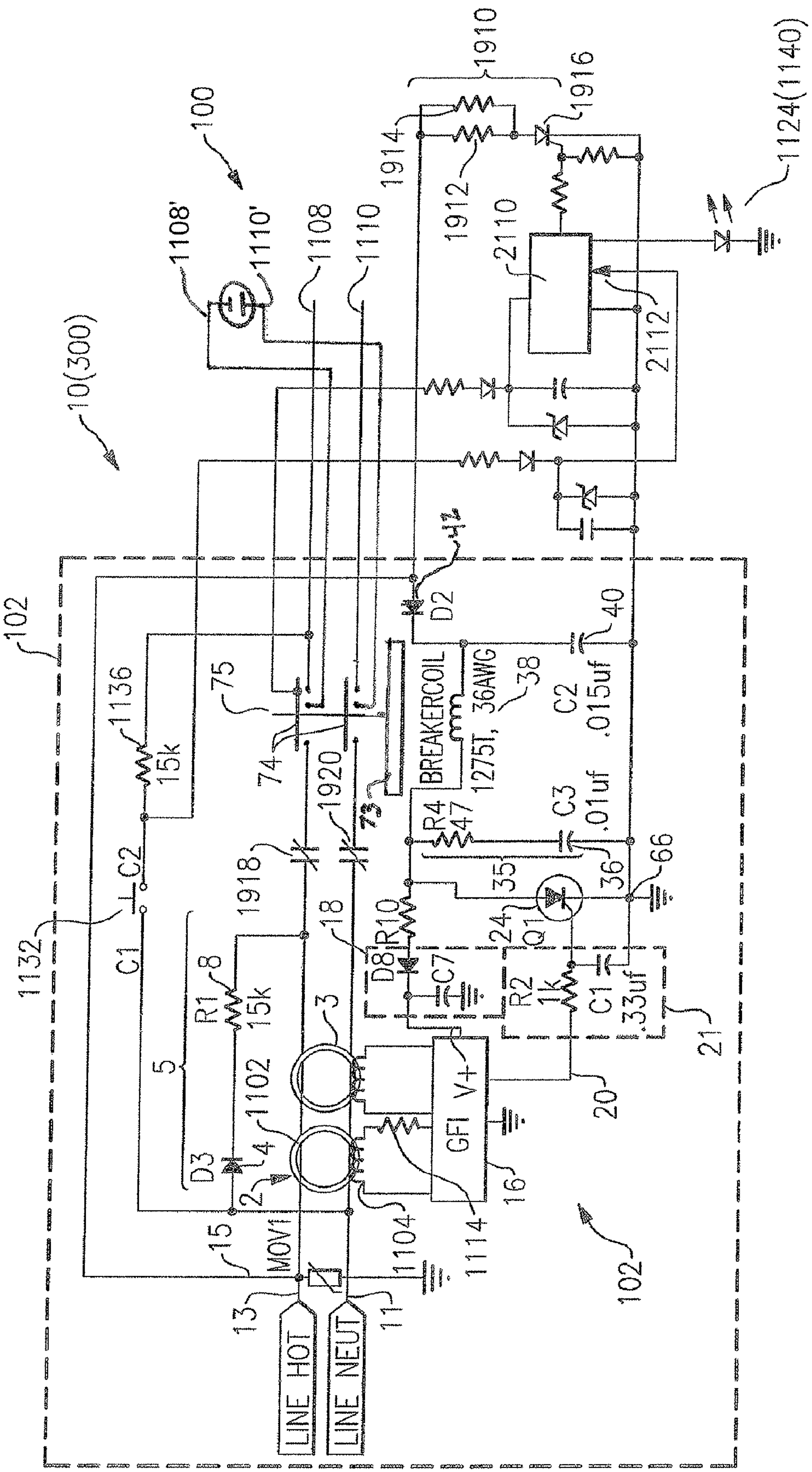
FIG. 36 is a schematic of the electrical wiring devices in accordance with another embodiment of the present invention.

As embodied herein and depicted in FIG. 36, a schematic of a circuit protection device in accordance with yet another alternate embodiment of the present invention is disclosed. GFCI 10 includes a GFI circuit 102 and a self test checking circuit 2110. GFI circuit 102 includes a standard GFCI device in which a load-side ground fault is sensed by a differential transformer 2. A transformer 3, which is a grounded neutral transmitter, is used to sense grounded neutral faults. The transformer 2 output is processed by a GFI detector circuit 16 which produces a signal on output 20 that, after filtering in a circuit 21, activates a trip SCR 24. When SCR 24 turns ON, it activates a solenoid 38 which in turn operates a mouse trap device 73, releasing a plurality of contacts 74 and interrupting the load.

An across-the-line metal oxide varistor (MOV1), also commonly referred to as a movistor, may be included in the protective device such as MOV 15 to prevent damage of the protective device from high voltage surges from the AC power source. The movistor is typically 12 mm in size.

A power supply 18 provides power for GFI detector circuit 16 for full cycle operation. A negative cycle bypass circuit 5, which preferably includes a diode 4 in series with a resistor 8, introduces a bypass current, simulating a ground fault, between neutral and hot lines 11, 13 during the negative half cycle of the AC power. The same bypass current could also be produced by placing bypass circuit 5 between lines 11 and 13 with the diode 4 anode at neutral line 11.

The GFI 102 output circuit is formed by placing capacitor 40 in series with solenoid 38 to thereby form a resonating tank circuit. The tank circuit is placed in parallel with SCR 24 and a snubber circuit 35. Capacitor 40 charges on the positive half cycle of the AC power, but is prevented from discharging on the negative half cycle of the AC power by a blocking diode 42.

In this embodiment, both the end-of-life checking circuit and the control gate are embodied in a single component, control gate 2110. Control gate 2110 is coupled to a power denial mechanism 1910, which is configured to operate as follows.

The user pushes the TEST button 1132 when the device is in the reset state to simulate a fault. The fault is introduced through resistor 1136. Although the simulated fault is shown as a ground fault, an arc fault simulation could have been chosen. The present invention is equally applicable to GFCI, AFCI, or GFCI/AFCI devices. Control gate 2110 is similar to control gate 1116. However, gate 2110 includes an input 2112 coupled to the test button 1132. When test button 1132 is depressed, control gate 2110 energizes indicator 1124 (1140). If the components in GFI 102 are operative, i.e., sensor 1102, detector 16, SCR 24, and trip mechanism 73, the device operates normally, and trip mechanism 73 is tripped. In response, power is removed from control gate 2110 and the indicator 1124 (1140) is de-energized.

However, if one of the components in GFI 102 is inoperative, i.e., has reached an end-of-life condition, indicator 1124 (1140) emits a visual or audible signal for at least the predetermined amount of time in the manner previously described. After the predetermined amount of time has elapsed, control gate 2110 actuates the power denial mechanism 1910, again, in the manner previously described.

In another embodiment, power denial mechanism 1910 is omitted, and SCR 1916 operates breaker coil 38 or independent solenoid 1314 (See FIG. 32) to permanently disconnect the line terminals from the load terminals.

Figure 37:
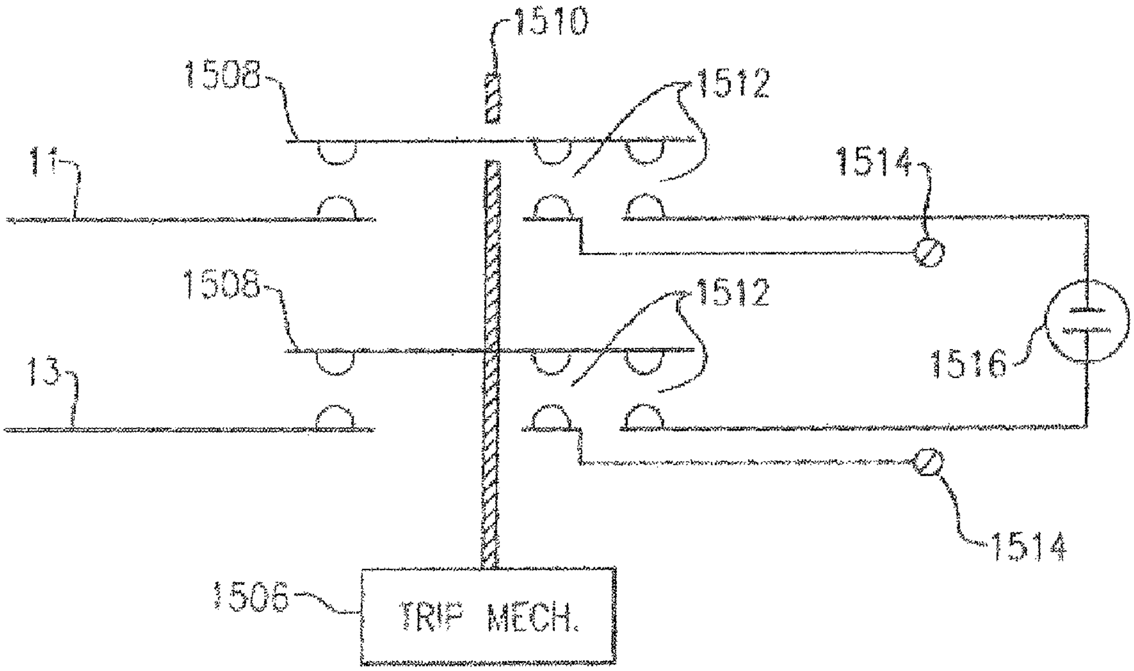
FIG. 37 is a detail view of a circuit interrupter mechanism in accordance with an alternate embodiment of the present invention.

Referring to FIG. 37, an alternate circuit interrupter is described. The circuit interrupter includes trip mechanism 1506, interrupting contacts 1508 and reset button 1510 that are similar to previously described element designated as reference elements 73, 74 and 75. The circuit interrupter is coupled to line conductors 11 and 13 and is configured to decouple one or more loads from the utility source when a true fault condition or a simulated fault condition has been detected, or when an automated self-test signal has failed. Like previous circuit interrupter embodiments, when decoupling occurs there is a plurality of air gaps 1512 that serve to electrically isolate a plurality of load structures from one another. The load may include, for example, feed-through terminals 1514 that are disposed in the protective device. The feed through terminals are configured to connect wires to a subsequent portion of the branch electrical circuit. The portion of the branch circuit, in turn, is protected by the protective device. The load structures can also include at least one user accessible plug receptacle 1516 disposed in the protective device. The plug receptacle is configured to mate with an attachment plug of a user attachable load. Accordingly, the user load is likewise protected by the protective device.

As has been previously described, if the device 10 is inadvertently miswired during installation into the branch electrical circuit, i.e., source voltage is connected to the feed-through terminals 1514, the protective device can be configured so as to only momentarily reset each time resetting is attempted, e.g. each time the reset button 1510 is depressed. Alternatively, the protective device can be configured so that during a miswired condition, the ability to reset the device 10 (1300) is blocked. In either case, air gap(s) 1512 prevent power from the utility source at feed-through terminals 1514 from powering plug receptacle(s) 1516. At least one air gap 1512 can be provided for each utility source hot conductor. The user is protected from a fault condition in the user attachable load. Alternatively, at least one air gap 1512 can be provided but in a single utility source conductor. Power to receptacle 1516 would be denied. Therefore the user would be motivated to remedy the miswired condition before a fault condition is likely to arise. In yet another alternative, utility source conductors may selectively include air gaps 1512 for electrically decoupling the load structures.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical wiring device comprising:

a plurality of line terminals and a plurality of load terminals;

at least one sensor coupled to the plurality of line terminals or the plurality of load terminals, the at least one sensor providing a sensor output signal corresponding to electrical perturbations propagating on the plurality of line terminals or the plurality of load terminals;

a fault detection circuit coupled to the at least one sensor, the fault detection circuit being configured to generate a fault detection signal if the sensor output signal substantially corresponds to at least one predetermined fault criterion;

an actuator assembly responsive to the fault detection signal, the actuator assembly including a breaker coil configured to generate an actuation force in response to being energized;

a circuit interrupter coupled to the actuator assembly, the circuit interrupter including four sets of movable contacts configured to be driven into a reset state in response to a reset stimulus, the four sets of movable contacts being configured to be driven into a tripped state in response to the actuation force;

a self-test circuit coupled to the plurality of line terminals or the at least one sensor, the self-test circuit being configured to automatically generate a test signal from time to time during a predetermined portion of an AC power line cycle, the self-test circuit being configured such that the test signal is sensed by the at least one sensor when the at least one sensor is operational, the sensor output signal being a function of the test signal; and a monitor circuit configured to monitor the fault detection circuit or the actuator assembly, the mechanical actuation force being substantially inhibited when the fault detection circuit or at least a portion of the actuator assembly properly respond to the test signal, the monitor circuit generating an end-of-life response if the fault detection circuit or the actuator assembly do not respond to the test signal within a predetermined period of time.

2. The device of claim 1, wherein the test signal is generated during a negative half cycle of the AC line cycle.

3. The device of claim 1, further comprising at least one circuit coupled to the plurality of line terminals and configured to conduct a predetermined current flow if a proper wiring condition has been effected, a proper wiring condition being effected when the plurality of line terminals are connected to a source of AC power.

4. The device of claim 3, wherein the at least one circuit is configured to detect a miswiring condition, the miswiring condition being effected when the plurality of load terminals are connected to a source of AC power.

5. The device of claim 3, wherein at least a portion of the at least one circuit is disabled after the predetermined current conducts for a predetermined period of time.

6. The device of claim 3, wherein the four sets of movable contacts are inhibited from entering the reset state absent the predetermined current flow.

7. The device of claim 1, further comprising at least one circuit including at least one switch element, the at least one switch element opening independently of an opening of the four sets of interrupting contacts and closing independently of a closing of the four sets of interrupting contacts, the circuit interrupter assembly being substantially prevented from effecting the reset state until the at least one circuit conducts a predetermined signal derived from the source of AC power.

8. The device of claim 1, further comprising a control circuit coupled to the self-test circuit and the monitor circuit, the control circuit being configured to operate in a self test mode and in a non-self test mode in accordance with a predetermined schedule, the control circuit being configured to direct the self-test circuit to generate the test signal during a predetermined half-cycle of selected AC line cycles while in the self test mode in accordance with the predetermined schedule.

9. The device of claim 8, wherein the test signal is generated during a negative half cycle of the AC line cycle.

10. The device of claim 1, wherein the end-of-life response includes tripping the four sets of movable contacts.

11. The device of claim 1, wherein the end-of-life response includes introducing a discontinuity between the plurality of line terminals and the plurality of load terminals.

12. The device of claim 1, wherein the plurality of load terminals includes a plurality of feed-through load terminals and a plurality of receptacle load terminals, the four sets of movable contacts being arranged such that the plurality of feed-through load terminals and the plurality of receptacle load terminals are discontinuous in the tripped state.

13. The device of claim 12, wherein the four sets of interrupting contacts are at least partially disposed on four cantilevered members.

14. The device of claim 13, wherein the four cantilevered members include a first set of two cantilevered members and a second set of two cantilevered members, the first set of cantilevered members being configured to rotate around a first axis in a first direction and the second set of cantilevered members being configured to rotate around a second axis in a second direction opposite to the first direction, the four sets of interrupting contacts being configured to provide electrical continuity between the plurality of line terminals, the plurality of load terminals, and the plurality of receptacle load terminals in a reset state, the four sets of interrupting contacts being decoupled in a tripped state to interrupt the electrical continuity between the plurality of line terminals, the plurality of load terminals and the plurality of receptacle load terminals.

15. The device of claim 1, wherein the four sets of movable contacts are disposed in a bus bar arrangement.

16. The device of claim 1, wherein the actuator assembly includes at least a first solenoid and a second solenoid.

17. The device of claim 16, wherein the first solenoid and the second solenoid include a trip solenoid and a reset solenoid.

18. An electrical wiring device comprising:

a housing assembly including a plurality of line terminals, a plurality of load terminals, and a plurality of receptacle load terminals;

a circuit assembly including at least one signal detection circuit, the at least one signal detection circuit being configured to detect at least one signal having predetermined signal characteristics propagating on at least one of the plurality of line terminals or at least one of the plurality of load terminals, the circuit assembly being configured to generate a detection stimulus in response to the at least one signal detection circuit detecting the at least one signal;

an interrupting contact assembly coupled to the circuit assembly, the plurality of line terminals, the plurality of load terminals and the plurality of receptacle load terminals, the interrupting contact assembly including four sets of interrupting contacts being at least partially disposed on four cantilevered members, the four cantilevered members including a first set of two cantilevered members and a second set of two cantilevered members, the first set of two cantilevered members being configured to rotate around a first axis in a first direction and the second set of two cantilevered members being configured to rotate around a second axis in a second direction opposite to the first direction, the four sets of interrupting contacts being configured to provide electrical continuity between the plurality of line terminals, the plurality of load terminals, and the plurality of receptacle load terminals in a reset state, the four sets of interrupting contacts being decoupled in a tripped state in response to the detection stimulus to interrupt the electrical continuity between the plurality of line terminals, the plurality of load terminals and the plurality of receptacle load terminals; and an automated test assembly coupled to the plurality of line terminals and the circuit assembly, the automated test assembly being configured to generate an automated test signal during a predetermined half-cycle of AC power and monitor a circuit assembly response to the automated test signal, the detection stimulus being substantially inhibited if the circuit assembly properly responds to the automated test signal, the automated test assembly generating an end-of-life response if the circuit assembly fails to respond to the automated test signal within a predetermined period of time.

19. The device of claim 18, wherein the predetermined half-cycle of AC power is a negative half cycle of the AC power.

20. The device of claim 18, further comprising at least one circuit coupled to the plurality of line terminals and configured to conduct a predetermined current flow if a proper wiring condition has been effected, a proper wiring condition being effected when the plurality of line terminals are connected to a source of AC power.

21. The device of claim 20, wherein the at least one circuit is configured to detect a miswiring condition, the miswiring condition being effected when the plurality of load terminals are connected to a source of AC power.

22. The device of claim 20, wherein at least a portion of the at least one circuit is disabled after the predetermined current flow conducts for a predetermined period of time.

23. The device of claim 18, at least one circuit includes at least one switch element, the at least one switch element opening independently of an opening of the four sets of interrupting contacts and closing independently of a closing of the four sets of interrupting contacts, the circuit interrupter assembly being substantially prevented from effecting the reset state until the at least one circuit conducts a predetermined signal derived from the source of AC power.

24. The device of claim 18, wherein the end-of-life response includes tripping the four sets of movable contacts.

25. The device of claim 18, wherein the end-of-life response includes introducing a discontinuity between the plurality of line terminals and the plurality of load terminals.

26. The device of claim 18, wherein the automated test assembly further includes:

a control circuit configured to operate in a self test mode and in a non-self test mode in accordance with a predetermined schedule, the control circuit being configured to cause the automated test signal to be generated during a predetermined half-cycle of selected AC line cycles while in the self test mode in accordance with the predetermined schedule, an automated self test circuit responsive to the control circuit, the automated self test circuit being configured to generate the automated test signal, and a monitor circuit configured to monitor a circuit assembly response to the automated test signal during the selected AC line cycles and make an end-of-life determination.

27. The device of claim 26, wherein the monitor circuit generates an end-of-life detection signal when the end-of-life determination indicates that the circuit assembly has failed to respond to the automated test signal.

28. The device of claim 27, wherein the end-of-life detection signal trips the four sets of movable contacts or introduces a discontinuity between the plurality of line terminals and the plurality of load terminals.

29. The device of claim 26, wherein the monitor circuit monitors the circuit assembly response in accordance with predetermined noise immunized decision criteria, the monitor circuit being further configured to generate the end-of-life detection signal based on the predetermined noise immunized decision criteria.

30. An electrical wiring device configured to be installed in an electrical distribution system having an AC power source, the AC power source providing an AC power line signal characterized by a first half cycle having a first AC polarity and a second half cycle having a second AC polarity, the device comprising:

a plurality of line terminals and a plurality of load terminals;

at least one circuit coupled to the plurality of line terminals and configured to conduct a predetermined current flow if a proper wiring condition has been effected, a proper wiring condition being effected when the plurality of line terminals are connected to the AC power source;

at least one sensor coupled to the plurality of line terminals or the plurality of load terminals, the at least one sensor providing a sensor output signal corresponding to electrical perturbations propagating on the plurality of line terminals or the plurality of load terminals;

a fault detection circuit coupled to the at least one sensor, the fault detection circuit being configured to generate a fault detection signal if the sensor output signal substantially corresponds to at least one predetermined fault criterion;

an actuator assembly responsive to the fault detection circuit, the actuator assembly including a switch element and a solenoid, the switch element being turned ON in response to the fault detection signal to thereby conduct an energization signal through the solenoid, the solenoid exerting an actuation stimulus in response to the energization signal;

a circuit interrupter coupled to the actuator assembly, the circuit interrupter including a latching mechanism, the circuit interrupter being in a reset state when the latching mechanism is latched, the circuit interrupter being in a tripped state when the latching mechanism is unlatched, the latching mechanism being unlatched by the actuation stimulus, the circuit interrupter being inhibited from entering the reset state absent the predetermined current flow; and an end of life detection circuit being configured to provide a test signal to the at least one sensor during the second half cycle, the end of life detection circuit being further configured to monitor the fault detection circuit or the actuator assembly, the fault detection circuit or the actuator assembly generating a test response to the test signal when operational and not generating the test response otherwise, the actuation stimulus being substantially inhibited when the fault detection circuit or the actuator assembly generate the test response.

31. The device of claim 30, wherein the circuit interrupter includes four sets of movable contacts.

32. The device of claim 31, wherein the plurality of load terminals includes a plurality of feed-through load terminals and a plurality of receptacle load terminals, the four sets of movable contacts being arranged such that the plurality of feed-through load terminals and the plurality of receptacle load terminals are discontinuous in the tripped state.

33. The device of claim 32, wherein the four sets of interrupting contacts are at least partially disposed on four cantilevered members.

34. The device of claim 33, wherein the four cantilevered members include a first set of two cantilevered members and a second set of two cantilevered members, the first set of two cantilevered members being configured to rotate around a first axis in a first direction and the second set of two cantilevered members being configured to rotate around a second axis in a second direction opposite to the first direction, the four sets of interrupting contacts being configured to provide electrical continuity between the plurality of line terminals, the plurality of load terminals, and the plurality of receptacle load terminals in a reset state, the four sets of interrupting contacts being decoupled in a tripped state to interrupt the electrical continuity between the plurality of line terminals, the plurality of load terminals and the plurality of receptacle load terminals.

35. The device of claim 31, wherein the four sets of movable contacts are disposed in a bus bar arrangement.

36. The device of claim 31, wherein the at least one circuit includes at least one switch element, the at least one switch element opening independently of an opening of the four sets of interrupting contacts and closing independently of a closing of the four sets of interrupting contacts, the circuit interrupter assembly being substantially prevented from effecting the reset state until the at least one circuit conducts a predetermined signal derived from the source of AC power.

37. The device of claim 30, wherein the actuator assembly includes at least a first solenoid and a second solenoid.

38. The device of claim 37, wherein the first solenoid and the second solenoid include a trip solenoid and a reset solenoid.

39. The device of claim 30, wherein the second half cycle is a negative half cycle of the AC line cycle.

* * * * *